United States Patent
Kurokawa et al.

(10) Patent No.: US 9,841,843 B2
(45) Date of Patent: Dec. 12, 2017

(54) SEMICONDUCTOR DEVICE AND DRIVING METHOD THEREOF

(75) Inventors: Yoshiyuki Kurokawa, Kanagawa (JP);
Takayuki Ikeda, Kanagawa (JP);
Takeshi Aoki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/325,497

(22) Filed: Dec. 14, 2011

(65) Prior Publication Data
US 2012/0154337 A1    Jun. 21, 2012

(30) Foreign Application Priority Data

Dec. 15, 2010   (JP) .................................. 2010-278905
May 13, 2011   (JP) .................................. 2011-108276

(51) Int. Cl.
*G06F 3/042*     (2006.01)
*G06F 3/041*     (2006.01)
(Continued)

(52) U.S. Cl.
CPC ............ *G06F 3/042* (2013.01); *G06F 3/0412* (2013.01); *H01L 27/14609* (2013.01);
(Continued)

(58) Field of Classification Search
CPC . G06F 3/041; G06F 3/042; G09F 9/00; G09F 3/20; G09F 9/30; H01L 27/14609;
(Continued)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| | (Continued) | |

FOREIGN PATENT DOCUMENTS

| | | |
|---|---|---|
| CN | 001734541 A | 2/2006 |
| EP | 1 335 430 A1 | 8/2003 |
| | (Continued) | |

OTHER PUBLICATIONS

Taiwanese Office Action re Application No. TW 100146580, dated Nov. 13, 2015.
(Continued)

*Primary Examiner* — Kent Chang
*Assistant Examiner* — Sujit Shah
(74) *Attorney, Agent, or Firm* — Husch Blackwell LLP

(57) ABSTRACT

A semiconductor device with high definition, which includes a plurality of sets each including a photosensor and a display element including a light-emitting element arranged in a matrix is provided, wherein a power supply line electrically connected to the display element also serves as a power supply line electrically connected to the photosensor. Thus, the semiconductor device with high definition can be provided without decreasing the width of each power supply line. Thus, the definition of the semiconductor device can be improved while securing the stability of the potential of the power supply line. The stability of the potential of the power supply line leads to the stability of the driving voltage of the display element and the stability of the driving voltage of the photosensor. Accordingly, the semiconductor device with high definition, high display quality, and high accuracy of imaging or detection of an object can be provided.

17 Claims, 32 Drawing Sheets

(51) Int. Cl.
  *H01L 27/146* (2006.01)
  *H01L 29/786* (2006.01)
  *H01L 27/32* (2006.01)
(52) U.S. Cl.
  CPC ...... *H01L 27/14643* (2013.01); *H01L 27/323* (2013.01); *H01L 27/3234* (2013.01); *H01L 29/7869* (2013.01)
(58) Field of Classification Search
  CPC ............ H01L 27/14643; H01L 29/7869; H01L 27/323; H01L 27/3234
  USPC .......... 345/156–173, 30–55; 250/208.1, 214; 315/169.3; 349/116
  See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,720,942 B2 | 4/2004 | Lee et al. |
| 6,727,522 B1 | 4/2004 | Kawasaki et al. |
| 6,867,409 B2* | 3/2005 | Kusuda et al. ............ 250/208.1 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,663,165 B2* | 2/2010 | Mouli ............ H01L 27/14609 257/215 |
| 7,674,650 B2 | 3/2010 | Akimoto et al. |
| 7,732,819 B2 | 6/2010 | Akimoto et al. |
| 8,492,758 B2 | 7/2013 | Yamazaki et al. |
| 9,214,563 B2 | 12/2015 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0151569 A1* | 8/2003 | Lee et al. .................... 345/84 |
| 2003/0189401 A1 | 10/2003 | Kido et al. |
| 2003/0214595 A1* | 11/2003 | Mabuchi ........... H01L 27/14618 348/294 |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0173646 A1* | 8/2005 | Tashiro et al. ............ 250/370.11 |
| 2005/0199959 A1 | 9/2005 | Chiang et al. |
| 2006/0003558 A1* | 1/2006 | Bang ................ H01L 21/26513 438/510 |
| 2006/0012311 A1* | 1/2006 | Ogawa ........................ 315/169.3 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0244695 A1* | 11/2006 | Komiya ................ G09G 3/006 345/76 |
| 2006/0284171 A1 | 12/2006 | Levy et al. |
| 2006/0284172 A1 | 12/2006 | Ishii |
| 2006/0292777 A1 | 12/2006 | Dunbar |
| 2007/0001937 A1* | 1/2007 | Park et al. ...................... 345/76 |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0309806 A1* | 12/2008 | Arishima ............ H04N 5/3532 348/294 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0020006 A1* | 1/2010 | Otani ........................ G01J 1/32 345/102 |
| 2010/0065844 A1 | 3/2010 | Tokunaga |
| 2010/0085331 A1 | 4/2010 | Kurokawa et al. |
| 2010/0092800 A1 | 4/2010 | Itagaki et al. |
| 2010/0109002 A1 | 5/2010 | Itagaki et al. |
| 2010/0134735 A1* | 6/2010 | Nakamura et al. ............ 349/116 |
| 2010/0149079 A1* | 6/2010 | Yamashita .......... G09G 3/3233 345/87 |
| 2010/0194948 A1* | 8/2010 | Murakami et al. ........... 348/302 |
| 2010/0201861 A1* | 8/2010 | Kameda ............ H01L 27/14806 348/311 |
| 2010/0253710 A1* | 10/2010 | Rankov et al. ................ 345/690 |
| 2010/0258802 A1* | 10/2010 | Godo .................. H01L 29/7869 257/57 |
| 2011/0096009 A1 | 4/2011 | Kurokawa et al. |
| 2011/0109532 A1* | 5/2011 | Choi ............................... 345/76 |
| 2011/0109592 A1 | 5/2011 | Kurokawa et al. |
| 2011/0109593 A1 | 5/2011 | Kurokawa et al. |
| 2011/0122098 A1 | 5/2011 | Kurokawa |
| 2011/0198483 A1* | 8/2011 | Kurokawa ................ 250/214 R |
| 2011/0221723 A1 | 9/2011 | Kurokawa et al. |

(56) References Cited

U.S. PATENT DOCUMENTS

| | | |
|---|---|---|
| 2011/0255046 A1 | 10/2011 | Kurokawa et al. |
| 2015/0104901 A1 | 4/2015 | Yamazaki et al. |

FOREIGN PATENT DOCUMENTS

| | | |
|---|---|---|
| EP | 1 617 399 A2 | 1/2006 |
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-237923 | 8/2002 |
| JP | 2002-289859 A | 10/2002 |
| JP | 2003-086000 A | 3/2003 |
| JP | 2003-086808 A | 3/2003 |
| JP | 2003-271098 A | 9/2003 |
| JP | 2004-103957 A | 4/2004 |
| JP | 2004-273614 A | 9/2004 |
| JP | 2004-273732 A | 9/2004 |
| JP | 2005-332880 A | 12/2005 |
| JP | 2006-030317 A | 2/2006 |
| JP | 2006-091462 A | 4/2006 |
| JP | 2009-535819 | 10/2009 |
| JP | 2010-153834 | 7/2010 |
| JP | 2011-091375 A | 5/2011 |
| TW | 200824108 | 6/2008 |
| WO | WO 2004/114391 A1 | 12/2004 |
| WO | WO 2008/027392 A2 | 3/2008 |
| WO | WO 2011/036999 A1 | 3/2011 |

OTHER PUBLICATIONS

Kamiya, Y. et al. "Carrier Transport Properties and Electronic Structures of Amorphous Oxide Semiconductors: The Present Status"Solid State Physics, vol. 44, No. 9, pp. 621-633.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D-H. et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Clark, S.J. et al., "First Principles Methods Using CASTEP," Zeitschrift fur Kristallographie, 2005, vol. 220, pp. 567-570.

Coates, D. et al., "Optical Studies of the Amorphous Liquid-Cholesteric Liquid Crystal Transistion: The "Blue Phase"," Physics Letters, Sep. 10, 1973, vol. 45A, No. 2, pp. 115-116.

Costello, M.J. et al., "Electron Microscopy of a Cholesteric Liquid Crystal and Its Blue Phase," Physical Review. A, May 1, 1984, vol. 29, No. 5, pp. 2957-2959.

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E.M.C. et al., "Wide-Bandgap High-Mobility ZnO Thin-Film Transistors Produced at Room Temperature," Applied Physics Letters, Sep. 27, 2004, vol. 85, No. 13, pp. 2541-2543.

Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong, J-K. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D-U. et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H. et al., "White Stacked Electrophosphorecent Organic Light-Emitting Devices Employing MoO3 as a Charge-Generation Layer," Advanced Materials, 2006, vol. 18, No. 3, pp. 339-342.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H. et al., "Polymer-Stabilized Liquid Crystal Blue Phases," Nature Materials, Sep. 2, 2002, vol. 1, pp. 64-68.

Kim, S. et al., "High-Performance Oxide Thin Film Transistors Passivated by Various Gas Plasmas," 214th ECS Meeting, 2008, No. 2317, ECS.

Kimizuka, N. et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H-S. et al., "Observation of Blue Phases in Chiral Networks", Liquid Crystals, 1993, vol. 14, No. 3, pp. 911-916.

Kurokawa, Y. et al., "UHF RFCPUS on Flexible and Glass Substrates for Secure RFID Systems," Journal of Solid-State Circuits, 2008, vol. 43, No. 1, pp. 292-299.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Lee, H.N. et al., "Current Status of, Challenges to, and Perspective View of AM-OLED," IDW '06: Proceedings of the 13th International Display Workshops, Dec. 7, 2006, pp. 663-666.

Lee, J-H. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Lee, M-H. et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S. et al., "Transparent Thin Film Transistors Using ZnO as an Active Channel Layer and their Electrical Properties," Journal of Applied Physics, Feb. 1, 2003, vol. 93, No. 3, pp. 1624-1630.

Meiboom, S. et al., "Theory of the Blue Phase of Cholesteric Liquid Crystals," Physical Review Letters, May 4, 1981, vol. 46, No. 18, pp. 1216-1219.

Miyasaka, M., "Suftla Flexible Microelectronics on Their Way to Business," SID Digest '07: SID International Symposium Digest of Technical Papers, 2007, vol. 38, pp. 1673-1676.

(56) References Cited

OTHER PUBLICATIONS

Mo, Y-G. et al., "Amorphous Oxide TFT Backplanes for Large Size AMOLED Displays," IDW '08: Proceedings of the 6th International Display Workshops, Dec. 3, 2008, pp. 581-584.

Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.

Nakamura, M., "Synthesis of Homologous Compound with New Long-Period Structure," NIRIM Newsletter, Mar. 1, 1995, vol. 150, pp. 1-4.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Nomura, K. et al., "Thin-Film Transistor Fabricated in Single-Crystalline Transparent Oxide Semiconductor," Science, May 23, 2003, vol. 300, No. 5623, pp. 1269-1272.

Nowatari, H. et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Oba, F. et al., "Defect Energetics in ZnO: A Hybrid Hartree-Fock Density Functional Study," Physical Review. B, 2008, vol. 77, pp. 245202-1-245202-6.

Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ohara, H. et al., "21.3:4.0 IN. QVGA AMOLED Display Using In—Ga—Zn-Oxide TFTs With a Novel Passivation Layer," SID Digest '09: SID International Symposium Digest of Technical Papers, May 31, 2009, pp. 284-287.

Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous Transparent Conductive Oxide InGaO3(ZnO)m (m<4): a Zn4s Conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

Osada, T. et al., "15.2: Development of Driver-Integrated Panel using Amorphous In—Ga—Zn-Oxide TFT," SID Digest '09: SID International Symposium Digest of Technical Papers, May 31, 2009, vol. 40, pp. 184-187.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Park, J-S. et al., "Amorphous Indium-Gallium-Zinc Oxide TFTs and Their Application for Large Size AMOLED," AM-FPD '08 Digest of Technical Papers, Jul. 2, 2008, pp. 275-278.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S. et al., "Challenge to Future Displays: Transparent AM-OLED Driven by PEALD Grown ZnO TFT," IMID '07 Digest, 2007, pp. 1249-1252.

Park, Sang-Hee et al., "42.3: Transparent ZnO Thin Film Transistor for the Application of High Aperature Ratio Bottom Emission AM-OLED Display," SID Digest '08: SID International Symposium Digest of Technical Papers, May 20, 2008, vol. 39, pp. 629-632.

Prins, M.W.J. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-IN. AMOLED Display With Driver Circuit Using Amorphous In—Ga—Zn-Oxide TFTs," IDW '09: Proceedings of the 16th International Display Workshops, 2009, pp. 689-692.

Son, K-S. et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Van de Walle, C.G., "Hydrogen as a Cause of Doping in Zinc Oxide," Physical Review Letters, Jul. 31, 2000, vol. 85, No. 5, pp. 1012-1015.

Godo, H. et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Godo, H. et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R. et al., "42,1: Invited Paper: Improved Amorphous In—Ga—Zn—O TFTs," SID Digest '08: SID International Symposium Digest of Technical Papers, May 20, 2008, vol. 39, pp. 621-624.

Hirao, T. et al., "Novel Top-Gate Zinc Oxide Thin-Film Transistors (ZnO TFTs) for AMLCDs," Journal of the Society for Information Display, 2007, vol. 15, No. 1, pp. 17-22.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.

Hsieh, H-H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Janotti, A. et al., "Native Point Defects in ZnO," Physical Review. B, Oct. 4, 2007, vol. 76, No. 16, pp. 165202-1-165202-22.

Janotti, A. et al., "Oxygen Vacancies In ZnO," Applied Physics Letters, 2005, vol. 87, pp. 122102-1-122102-3.

* cited by examiner

FIG. 13A

| (p,q) | | TL / TR +TI | | | | | | TS | | |
|---|---|---|---|---|---|---|---|---|---|---|
| (p,q+1) | | TL | | | TR +TI | | | TS | | |
| (p,q+2) | | TL / TR +TI | | | | | | TS | | |
| (p,q+3) | | TL | | | | TR +TI | | TS | | |
| (p+1,q) | | TL / TR +TI | | | | | | | TS | |
| (p+2,q) | | TL / TR +TI | | | | | | | | TS |
| (p+3,q) | | TL / TR +TI | | | | | | | | TS |

FIG. 13B

| (p,q) | TL / TR +TI | | | | | | TS | | |
|---|---|---|---|---|---|---|---|---|---|
| (p,q+1) | TL | | | | TR +TI | | TS | | |
| (p,q+2) | TL / TR +TI | | | | | | TS | | |
| (p,q+3) | TL | | | | | TR +TI | TS | | |
| (p+1,q) | TL / TR +TI | | | | | | | TS | |
| (p+2,q) | TL / TR +TI | | | | | | | | TS |
| (p+3,q) | TL / TR +TI | | | | | | | | TS | c-axis direction electric charge 0 electric charge +1 electric charge 0 a-b plane electric charge −1 electric charge 0

● In

● Ga

○ Zn

● O

SEMICONDUCTOR DEVICE AND DRIVING METHOD THEREOF

BACKGROUND OF THE INVENTION

1. Field of the Invention

One embodiment of the present invention relates to a semiconductor device including a photosensor. One embodiment of the present invention also relates to a semiconductor device including a photosensor and a display element. In particular, one embodiment of the present invention relates to a semiconductor device including a light-emitting element as a display element. Further, one embodiment of the present invention relates to a driving method of a semiconductor device. Still further, one embodiment of the present invention relates to an electronic device equipped with a semiconductor device.

2. Description of the Related Art

An example of a semiconductor device including a plurality of sensors that detect light (each also referred to as a "photosensor") arranged in a matrix is a solid-state imaging device (also referred to as an image sensor) used in electronic devices such as digital still cameras or mobile phones.

In particular, a semiconductor device including a plurality of sets each including a photosensor and a display element arranged in a matrix, which has an image displaying function in addition to the imaging function, is also referred to as a touch panel, a touch screen, or the like (hereinafter simply referred to as a "touch panel"). In the touch panel, a region where the sets each including a photosensor and a display element are arranged in a matrix is an image display, data input region.

A touch panel having an image display, data input region where sets each including a photosensor and a display element including an organic light-emitting element are arranged in a matrix has been proposed (see FIGS. 8 and 9 in Patent Document 1).

In the touch panel using such a display element including a light-emitting element, first, the light-emitting elements arranged in a matrix are made to emit light. When an object to be detected exists, the light is blocked by the object and partly reflected. The photosensors arranged in a matrix detect light reflected by the object. In this manner, the touch panel captures an image of the object and detects the position of the object.

REFERENCE

[Patent Document 1] Japanese Published Patent Application No. 2010-153834

SUMMARY OF THE INVENTION

According to the structure described in Patent Document 1, at least a wiring to which a signal for controlling the display element including an organic light-emitting element is input and a power supply line thereof, and a wiring to which a signal for controlling the photosensor is input and a power supply line thereof are provided. Thus, the number of wirings provided in the image display, data input region is increased, leading to a drawback in the improvement of the definition of a semiconductor device.

It is an object of one embodiment of the present invention to provide a semiconductor device with high definition, which includes a plurality of sets each including a photosensor and a display element including a light-emitting element arranged in a matrix.

One embodiment of the present invention is a semiconductor device in which a photosensor and a display element including a light-emitting element are provided, and a power supply line which is electrically connected to the display element including the light-emitting element also serves as a power supply line which is electrically connected to the photosensor.

One embodiment of the present invention is a semiconductor device in which a plurality of sets each including a photosensor and a display element including a light-emitting element are arranged in a matrix, and a power supply line which is electrically connected to the display element including the light-emitting element also serves as a power supply line which is electrically connected to the photosensor per set.

One embodiment of the present invention is a semiconductor device in which a plurality of sets each including a photosensor and a display element including a light-emitting element are arranged in a matrix of m (m is a natural number greater than or equal to 2) rows by n (n is a natural number greater than or equal to 2) columns. The photosensor includes a photoelectric converter and an amplifier which is electrically connected to the photoelectric converter. The display element including the light-emitting element includes a controller which is electrically connected to the light-emitting element. The amplifier and the controller are electrically connected to the same power supply line per set.

One embodiment of the present invention is a semiconductor device in which a plurality of sets each including a photosensor and a display element including a light-emitting element are arranged in a matrix of m (m is a natural number greater than or equal to 2) rows by n (n is a natural number greater than or equal to 2) columns, and a first wiring, a second wiring, a third wiring, a fourth wiring, a fifth wiring, a sixth wiring, a seventh wiring, and a eighth wiring are provided. The photosensor includes a photoelectric converter and an amplifier which is electrically connected to the photoelectric converter. The display element including the light-emitting element includes a controller which is electrically connected to the light-emitting element. The amplifier includes a first transistor, a second transistor, and a third transistor. The second transistor and the third transistor are electrically connected in series between the first wiring and the second wiring. A gate of the second transistor is electrically connected to one of a source and a drain of the first transistor. The other of the source and the drain of the first transistor is electrically connected to one of a pair of electrodes of the photoelectric converter. The other electrode of the pair of electrodes of the photoelectric converter is electrically connected to the fourth wiring. A gate of the first transistor is electrically connected to the third wiring, and a gate of the third transistor is electrically connected to the fifth wiring. The controller includes a fourth transistor and a fifth transistor. A gate of the fourth transistor is electrically connected to the sixth wiring, one of a source and a drain of the fourth transistor is electrically connected to the eighth wiring, and the other of the source and the drain of the fourth transistor is electrically connected to a gate of the fifth transistor. One of a source and a drain of the fifth transistor is electrically connected to the first wiring, and the other of the source and the drain of the fifth transistor is electrically connected to one of a pair of electrodes of the light-emitting element. The other of the pair of electrodes of the light-emitting element is electrically connected to the seventh wiring. The first wiring is a power supply line.

In the above structure, the controller may further include a sixth transistor, one of a source and a drain of the sixth transistor may be electrically connected to one of the pair of electrodes of the light-emitting element, and the other of the source and the drain of the sixth transistor may be electrically connected to the first wiring. A gate of the sixth transistor may be electrically connected to a ninth wiring.

In the above structure, the controller may further include a capacitor, one of a pair of electrodes of the capacitor may be electrically connected to the gate of the fifth transistor, and the other of the pair of electrodes of the capacitor may be electrically connected to one of the source and the drain of the fifth transistor. The other of the pair of electrodes of the capacitor may be electrically connected to the first wiring. The other of the pair of electrodes of the capacitor may be electrically connected not to one of the source and the drain of the fifth transistor but to a tenth wiring.

In any of the first to sixth transistors, a channel can be formed in an oxide semiconductor layer. A channel can be formed in an oxide semiconductor layer in one or more of the first to sixth transistors, and a channel can be formed in a silicon layer in the other transistor(s).

Each set may include one display element and one photosensor; two or more display elements and one photosensor; two or more photosensors and one display element; or two or more display elements and two or more photosensors. That is, the numbers of display elements and photosensors included in one set are not limited.

The light-emitting element is an element whose luminance is controlled by current or voltage; a light-emitting diode, an organic light-emitting diode (OLED), or the like can be used.

A photodiode or a phototransistor can be used as the photoelectric converter.

One embodiment of the present invention is the following driving method 1 or driving method 2 of a semiconductor device in which a plurality of sets each including a photosensor and a display element including a light-emitting element are arranged in a matrix of m (m is a natural number greater than or equal to 2) rows by n (n is a natural number greater than or equal to 2) columns, the photosensor includes a photoelectric converter and an amplifier which is electrically connected to the photoelectric converter, the display element including the light-emitting element includes a controller which is electrically connected to the light-emitting element, and the amplifier and the controller are electrically connected to the same power supply line per set.

(Driving Method 1)

The amplifier performs a reset operation of discharging electric charge stored in the amplifier, a storage operation of storing electric charge corresponding to the amount of photocurrent flowing through the photoelectric converter, and a selection operation of reading an output signal including the amount of the electric charge as data. All the light-emitting elements are made to emit light to irradiate an object with light, and then, the photosensors in the p-th (p is a natural number less than or equal to m) row detect the amount of light reflected by the object. During the period in which the light-emitting elements emit light, the reset operation and the storage operation are performed in the photosensors in the p-th row, and then, all the light-emitting elements are made not to emit light, and during the period in which the light-emitting elements do not emit light, the reset operation and the storage operation are performed in the photosensors in the (p+1)-th row. The selection operation described above is performed sequentially by the photosensors in all the rows, then, a difference between output signals obtained from the photosensors in adjacent rows is obtained. With the difference, a captured image of the object is generated and a position of the object is detected.

According to the above-described driving method 1, all the light-emitting elements are made to emit light to irradiate an object with light, and during the period in which the light-emitting elements emit light, the reset operation and the storage operation are performed in the photosensors in the p-th row in order to detect the amount of light reflected by the object. And then, all the light-emitting elements are made not to emit light, and during the period in which the light-emitting elements do not emit light, the reset operation and the storage operation are performed in the photosensors in the (p+1)-th row. Alternatively, the following driving method 2 may be employed: all the light-emitting elements are made to emit light to irradiate an object to be detected, and during the period in which the light-emitting elements emit light, the reset operation and the storage operation are performed in the photosensors in the q-th column (q is a natural number less than or equal to n), and then, all the light-emitting elements are made not to emit light, and during the period in, which the light-emitting elements do not emit light, the reset operation and the storage operation are performed in the photosensors in the (q+1)-th column.

(Driving Method 2)

The amplifier performs a reset operation of discharging electric charge stored in the amplifier, a storage operation of storing electric charge corresponding to the amount of photocurrent flowing through the photoelectric converter, and a selection operation of reading an output signal including the amount of the electric charge as data. All the light-emitting elements are made to emit light to irradiate an object with light, and then, the photosensors in the q-th (q is a natural number less than or equal to n) column detect the amount of light reflected by the object. During the period in which the light-emitting elements emit light, the reset operation and the storage operation are performed in the photosensors in the q-th column, and then, all the light-emitting elements are made not to emit light, and during the period in which the light-emitting elements do not emit light, the reset operation and the storage operation are performed in the photosensors in the (q+1)-th column. The selection operation described above is performed sequentially by the photosensors in all the rows, then, a difference between output signals obtained from the photosensors in adjacent columns is obtained. With the difference, a captured image of the object is generated and a position of the object is detected.

(Variations on Light-Emission Timing of Light-Emitting Element)

In the driving method 1, in order to perform the reset operation and the storage operation with the photosensors in the p-th row, the light-emitting elements may emit light simultaneously or sequentially row-by-row.

Similarly, in the driving method 2, in order to perform the reset operation and the storage operation with the photosensors in the q-th column, the light-emitting elements may emit light simultaneously or sequentially row-by-row.

Alternatively, for the reset operation and the storage operation with the photosensors in the p-th row in the driving method 1, only the light-emitting elements in the p-th row and the light-emitting elements in the row(s) near the p-th row among all of the light-emitting elements may emit light. Similarly, for the reset operation and the storage operation with the photosensors in the (p+1)-th row in the driving method 1, only the light-emitting elements in the (p+1)-th row and the light-emitting elements in the row(s) near the (p+1)-th row among all of the light-emitting elements may emit no light.

(Variations on Timing of Reset Operation and Storage Operation of Photosensor)

The driving methods 1 and 2 employ a driving method in which the timing of the reset operation and the storage operation differs in adjacent rows or columns, which is a rolling shutter system. On the other hand, a driving method in which the timing of the reset operation and the storage operation is the same in all the rows or columns is a global shutter system.

In the driving method 1, the reset operation and the storage operation may be performed either sequentially row-by-row or at the same time in plural rows. For example, with light emission of the light-emitting elements, the reset operation and the storage operation can be performed sequentially on the photosensors in the odd-numbered rows row-by-row, and with no light emission of the light-emitting elements, the reset operation and the storage operation can be performed sequentially on the photosensors in the even-numbered rows row-by-row. In that case, the photosensors either only in the odd-numbered rows or only in the even-numbered rows are driven by a rolling shutter system. Alternatively, with light emission of the light-emitting elements, the reset operation and the storage operation can be performed at the same time on the photosensors in the odd-numbered rows, and with no light emission of the light-emitting elements, the reset operation and the storage operation can be performed at the same time on the photosensors in the even-numbered rows. In that case, the photosensors in the odd-numbered rows or the photosensors in the even-numbered rows are driven by a global shutter system.

In the driving method 2, the reset operation and the storage operation may be performed either sequentially column-by-column or at the same time in plural columns. For example, with light emission of the light-emitting elements, the reset operation and the storage operation can be performed sequentially on the photosensors in the odd-numbered columns column-by-column, and with no light emission of the light-emitting elements, the reset operation and the storage operation can be performed sequentially on the photosensors in the even-numbered columns column-by-column. In that case, the photosensors either only in the odd-numbered columns or only in the even-numbered columns are driven by a rolling shutter system. Alternatively, with light emission of the light-emitting elements, the reset operation and the storage operation can be performed at the same time on the photosensors in the odd-numbered columns, and with no light emission of the light-emitting elements, the reset operation and the storage operation can be performed at the same time on the photosensors in the even-numbered columns. In that case, the photosensors in the odd-numbered columns or the photosensors in the even-numbered columns are driven by a global shutter system.

In each of the driving methods 1 and 2, the order of the timing of making the light-emitting elements to emit light and the timing of making the light-emitting elements not to emit light may be reversed.

The power supply line which is electrically connected to the photosensor also serves as the power supply line which is electrically connected to the display element including the light-emitting element, whereby the number of power supply lines included in a semiconductor device can be reduced. In this manner, the width of each power supply line can be increased and a semiconductor device with high definition can be provided. Thus, the definition of the semiconductor device can be improved while securing the stability of the potential of the power supply line. The stability of the potential of the power supply line leads to the stability of the driving voltage of the display element including the light-emitting element and the stability of the driving voltage of the photosensor. That is, even in a high-definition semiconductor device, the driving voltage of the display element including the light-emitting element and the driving voltage of the photosensor can be stabilized. Accordingly, a semiconductor device with high definition, high display quality, and high accuracy of imaging or detection of an object can be provided.

BRIEF DESCRIPTION OF THE DRAWINGS

In the accompanying drawings:

FIGS. 13A and 13B are timing charts each for describing an operation of a set including a photosensor and a display element including a light-emitting element;

DETAILED DESCRIPTION OF THE INVENTION

Figure 1A:
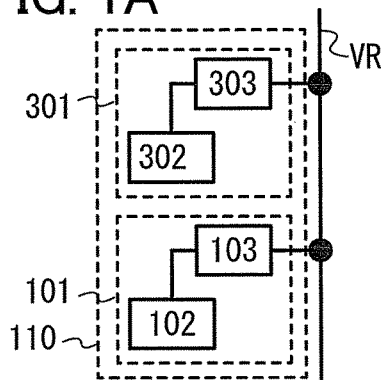
FIGS. 1A and 1B are circuit diagrams illustrating structures of a set including a photosensor and a display element including a light-emitting element.

Hereinafter, embodiments of the present invention are described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

The terms of a "source electrode" and a "drain electrode" of the transistor interchange with each other depending on the polarity of the transistor and the levels of potentials applied to the electrodes. In general, in an n-channel transistor, an electrode to which a lower potential is applied is called a source electrode, whereas an electrode to which a higher potential is applied is called a drain electrode. Further, in a p-channel transistor, an electrode to which a lower potential is applied is called a drain electrode, whereas an electrode to which a higher potential is applied is called a source electrode. In the description below, one of a source electrode and a drain electrode is referred to as a first terminal and the other thereof is referred to as a second terminal.

Further, being "electrically connected" in this specification refers to the state where a current, a voltage, or a potential can be supplied or transmitted. Therefore, the state of being "electrically connected" means not only a state of direct connection but also a state of indirect connection through a circuit element such as a wiring, a resistor, a diode, or a transistor, where a current, a voltage, or a potential can be supplied or transmitted.

Further, independent components, which are connected to each other in a circuit diagram, may include a shared conductive film with each other, having functions of a plurality of components; for example, part of a wiring may function as an electrode.

In this specification, a state in which transistors are electrically connected in series with each other means, for example, a state in which only one of a first terminal and a second terminal of one transistor is electrically connected to only one of a first terminal and a second terminal of the other transistor. Further, a state in which transistors are electrically connected in parallel with each other means a state in which a first terminal of one transistor is electrically connected to a first terminal of the other transistor and a second terminal of the one transistor is electrically connected to a second terminal of the other transistor.

In this specification, unless otherwise specified, an off-state current of an n-channel transistor is a current which flows between a source electrode and a drain electrode of the transistor where the potential of the drain electrode is higher than those of the source electrode and a gate electrode of the transistor at a potential of the gate electrode of less than or equal to 0 V relative to the potential of the source electrode. In addition, an off-state current of a p-channel transistor is a current which flows between a source electrode and a drain electrode of the transistor where the potential of the drain electrode is lower than those of the source electrode and a gate electrode of the transistor at a potential of the gate electrode of greater than or equal to 0 V relative to the potential of the source electrode

Embodiment 1

In this embodiment, a structure of a semiconductor device according to one embodiment of the present invention is described.

(One Embodiment of Structure of Semiconductor Device)

FIG. 1A is a circuit diagram showing a structure of a set 110 of a photosensor 301 and a display element 101 including a light-emitting element 102 of a semiconductor device. The photosensor 301 includes a photoelectric converter 302 and an amplifier 303 electrically connected to the photoelectric converter 302. The display element 101 including the light-emitting element 102 includes a controller 103 electrically connected to the light-emitting element 102. The amplifier 303 and the controller 103 are electrically connected to the same power supply line VR. The power supply line VR is shared between the photosensor 301 and the display element 101, whereby the definition of the semiconductor device can be improved.

Figure 1B:
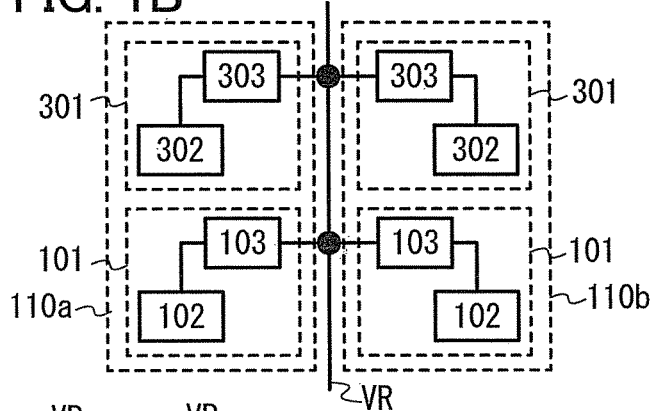

Further, as shown in FIG. 1B, the same power supply line VR can also be shared between two adjacent sets (a set 110a and a set 110b). By sharing the power supply line VR between a plurality of sets 110, the definition of the semiconductor device can be further improved. The structures of the sets 110a and 110b each are the same as the structure of the set 110, and each of the sets 110a and 110b is also called the set 110.

Figure 1C:
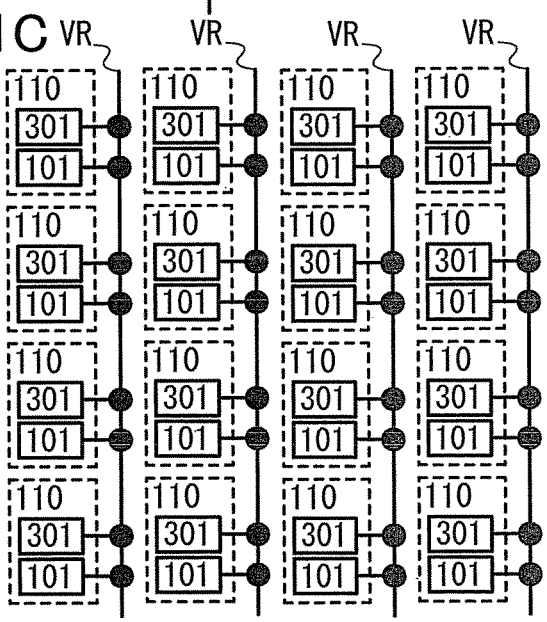
FIGS. 1C and 1D are circuit diagrams illustrating structures of a plurality of sets arranged in a matrix.

FIG. 1C is a circuit diagram showing a structure of a semiconductor device in which the plurality of sets 110 whose structure is shown in FIG. 1A are arranged in a matrix of m (m is a natural number greater than or equal to 2) rows by n (n is a natural number greater than or equal to 2) columns. In FIG. 1C, m is 4 and n is 4 as an example. The power supply line VR is shared between sets per column in the longitudinal direction in the drawing.

Figure 1D:
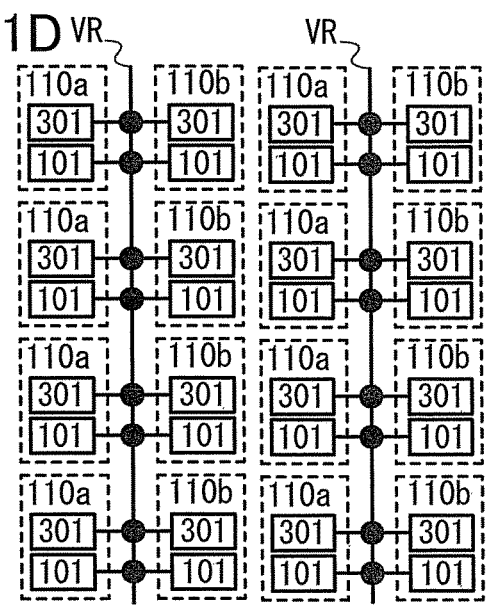

FIG. 1D is a circuit diagram showing a structure of a semiconductor device in which the plurality of sets 110 whose structure is shown in FIG. 1B are arranged in a matrix of m (m is a natural number greater than or equal to 2) rows by n (n is a natural number greater than or equal to 2) columns. In FIG. 1D, m is 4 and n is 4 as an example. In the drawing, the power supply line VR is shared between sets per column in the longitudinal direction and is shared between adjacent columns.

Although the plurality of sets 110 each include one display element 101 and one photosensor 301 in FIGS. 1A to 1D, one embodiment of the present invention is not limited thereto. The set 110 may include two or more display elements 101 and one photosensor 301; two or more photosensors 301 and one display element 101; or two or more display elements 101 and two or more photosensors 301. That is, the numbers of display elements 101 and photosensors 301 included in one set 110 are not limited.

The light-emitting element 102 is an element whose luminance is controlled by current or voltage; a light-emitting diode, an organic light-emitting diode (OLED), or the like can be used.

A photodiode or a phototransistor can be used as the photoelectric converter 302.

(One Embodiment of Specific Configurations of Amplifier and Controller)

Figure 2A:
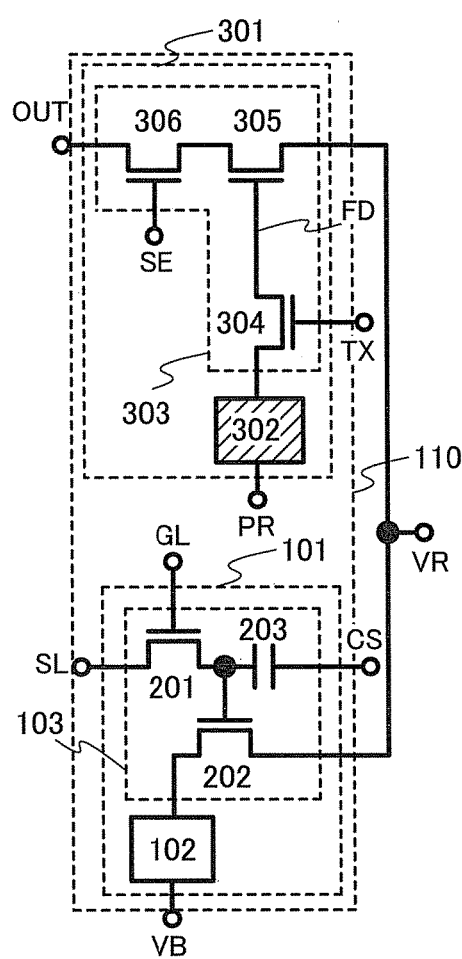
FIGS. 2A and 2B are circuit diagrams illustrating configurations of a set including a photosensor and a display element including a light-emitting element.

FIG. 2A is a diagram showing an example of specific configurations of the amplifier 303 and the controller 103 in the structure shown in FIG. 1A.

The amplifier 303 includes a transistor 304, a transistor 305, and a transistor 306. The transistor 305 and the transistor 306 are electrically connected in series between a wiring OUT and the wiring VR. A gate of the transistor 305 is electrically connected to one of a source and a drain of the transistor 304. The other of the source and the drain of the transistor 304 is electrically connected to one of a pair of electrodes of the photoelectric converter 302. The other electrode of the pair of electrodes of the photoelectric converter 302 is electrically connected to a wiring PR. A gate of the transistor 304 is electrically connected to a wiring TX. A gate of the transistor 306 is electrically connected to a wiring SE. The node where one of the source and the drain of the transistor 304 is electrically connected to the gate of the transistor 305 is denoted by a node FD. The potential of an output signal of the amplifier 303 (a signal output from the wiring OUT) is decided by the amount of electric charge stored in the node FD. In order to retain electric charge in the node FD more surely, a capacitor may be electrically connected to the node FD.

The controller 103 includes a transistor 201 and a transistor 202. A gate of the transistor 201 is electrically connected to a wiring GL. One of a source and a drain of the transistor 201 is electrically connected to a wiring SL. The other of the source and the drain of the transistor 201 is electrically connected to a gate of the transistor 202. One of a source and a drain of the transistor 202 is electrically connected to the wiring VR. The other of the source and the drain of the transistor 202 is electrically connected to one of a pair of electrodes of the light-emitting element 102. The other of the pair of electrodes of the light-emitting element 102 is electrically connected to a wiring VB. The wiring VR is a power supply line.

Figure 4A:
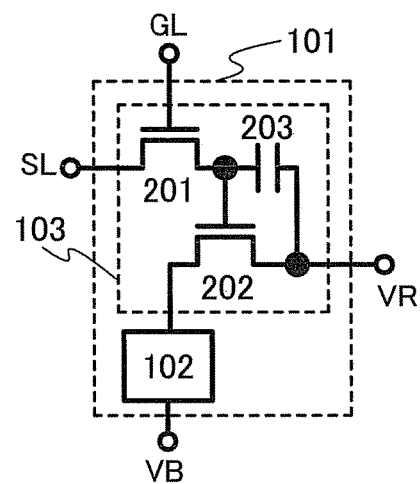
FIGS. 4A to 4D are circuit diagrams illustrating configurations of a display element including a light-emitting element.

Further, a capacitor 203 is included in the controller 103, one of a pair of electrodes of the capacitor 203 is electrically connected to the gate of the transistor 202 and the other of the source and the drain of the transistor 201, and the other of the pair of electrodes of the capacitor 203 is electrically connected to a wiring CS in FIG. 2A; however, one embodiment of the present invention is not limited thereto. For example, the wiring CS is not necessarily provided and the other of the pair of electrodes of the capacitor 203 may be electrically connected to one of the source and the drain of the transistor 202 (or the wiring VR) as shown in FIG. 4A. Configurations of only the display element 101 are illustrated in FIGS. 4A to 4D; in practice, like FIG. 2A, the photosensor 301 and the display element 101 are electrically connected to the same wiring VR.

Figure 4B:
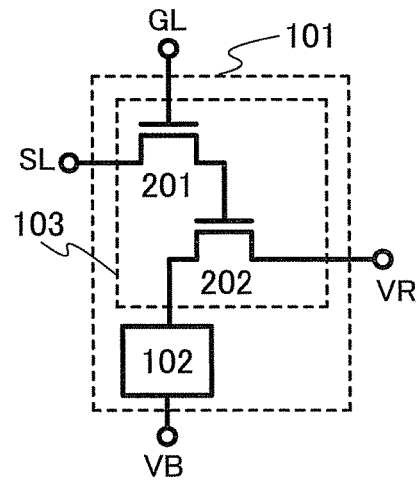

Further, as shown in FIG. 4B, the capacitor 203 can be omitted. For example, a transistor whose off-state current is extremely small may be used as the transistor 201, by which the potential of the gate of the transistor 202 can be retained for a long period of time, whereby the capacitor 203 functioning as a retention capacitor can be omitted. A transistor in which a channel is formed in an oxide semiconductor layer can be used as the transistor whose off-state current is extremely small. Further, instead of provision of the capacitor 203, parasitic capacitance of the transistor 202 and the like can be effectively used.

Further, the configuration of the controller 103 is not limited to the configurations shown in FIGS. 2A, 4A, and 4B. For example, a configuration shown in FIG. 4C can be employed. The configuration of the controller 103 shown in FIG. 4C includes a transistor 204 in addition to the configuration shown in FIG. 2A. One of a source and a drain of the transistor 204 is electrically connected to one of the pair of electrodes of the light-emitting element 102, and the other of the source and the drain of the transistor 204 is electrically connected to the wiring VR. A gate of the transistor 204 is electrically connected to a wiring SA. It can be said that the transistor 204 is provided in parallel with the transistor 202.

Figure 4C:
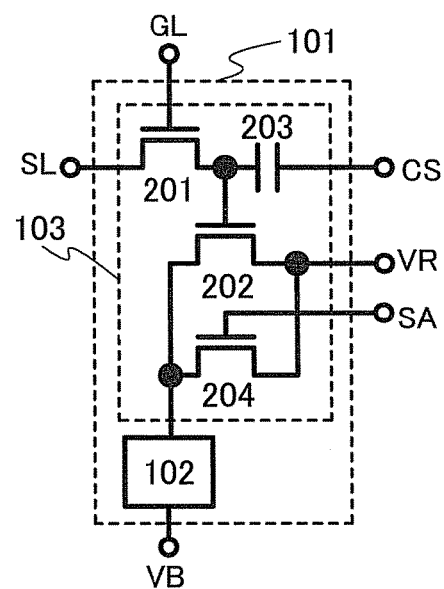
Figure 4D:
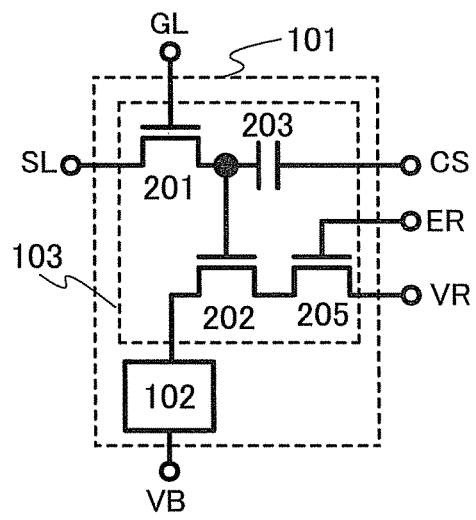

Further alternatively, a configuration shown in FIG. 4D can be employed as the configuration of the controller 103. The configuration of the controller 103 shown in FIG. 4D includes a transistor 205 in-addition to the configuration shown in FIG. 2A. One of a source and a drain of the transistor 205 is electrically connected to the wiring VR, and the other of the source and the drain of the transistor 205 is electrically connected to one of the source and the drain of the transistor 202. A gate of the transistor 205 is electrically connected to a wiring ER. It can be said that the transistor 205 is provided in series with the transistor 202.

In each of the configurations shown in FIGS. 4C and 4D, the capacitor 203 can be either provided as shown in FIG. 4A or omitted as shown in FIG. 4B.

Further, the configuration of the amplifier 303 is not limited to the configuration shown in FIG. 2A. For example, a configuration shown in FIG. 5A can be employed. The transistors 306 and 305 are electrically connected in series in this order between the wiring OUT and the wiring VR in FIG. 2A; the transistors 305 and 306 are electrically connected in series in this order between the wiring OUT and the wiring VR in FIG. 5A.

Figure 5A:
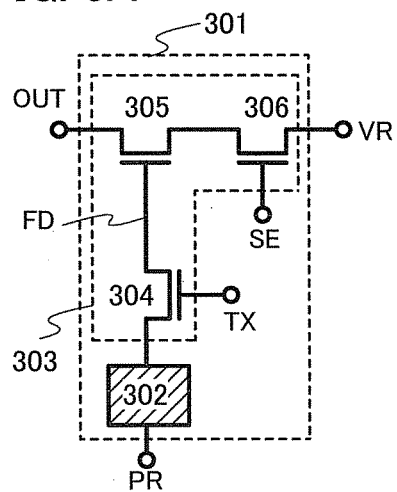
FIGS. 5A to 5C are circuit diagrams illustrating configurations of a photosensor.
Figure 5B:
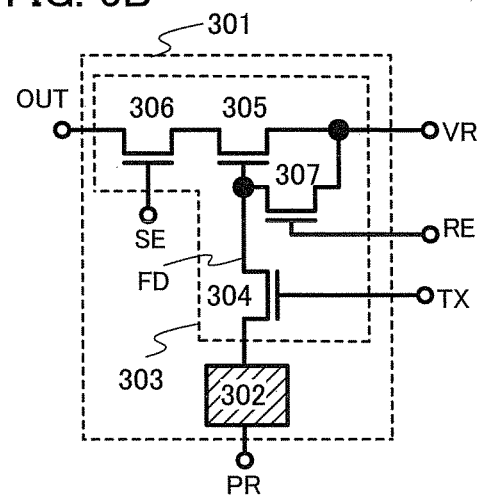
Figure 5C:
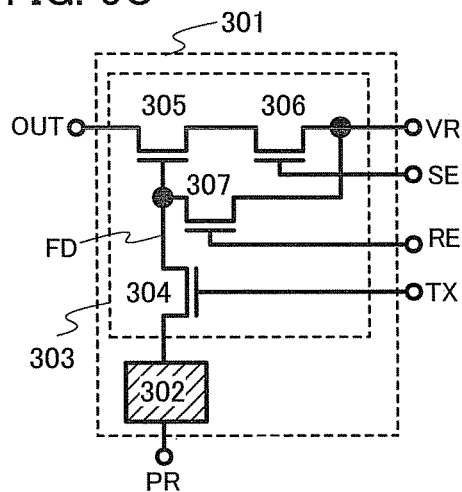

Further alternatively, any of configurations shown in FIGS. 5B and 5C can be employed as the configuration of the amplifier 303. The configurations of the amplifier 303 shown in FIGS. 5B and 5C include a transistor 307 in addition to the configuration shown in any of FIG. 2A and FIG. 5A. FIG. 5B is an example in which the transistor 307 is added to the configuration shown in FIG. 2A, whereas FIG. 5C is an example in which the transistor 307 is added to the configuration shown in FIG. 5A. In each of the FIGS. 5B and 5C, one of a source and a drain of the transistor 307 is electrically connected to the wiring VR, and the other of the source and the drain of the transistor 307 is electrically connected to the gate of the transistor 305. A gate of the transistor 307 is electrically connected to a wiring RE.

In any of the transistors 201, 202, 204, 205, 304, 305, 306, and 307, a channel can be formed in an oxide semiconductor layer. A channel can be formed in an oxide semiconductor layer in one or more of the transistors 201, 202, 204, 205, 304, 305, 306, and 307, and a channel can be formed in a silicon layer in the other transistor(s).

(Variations on Wiring Arrangement)

Figure 2B:
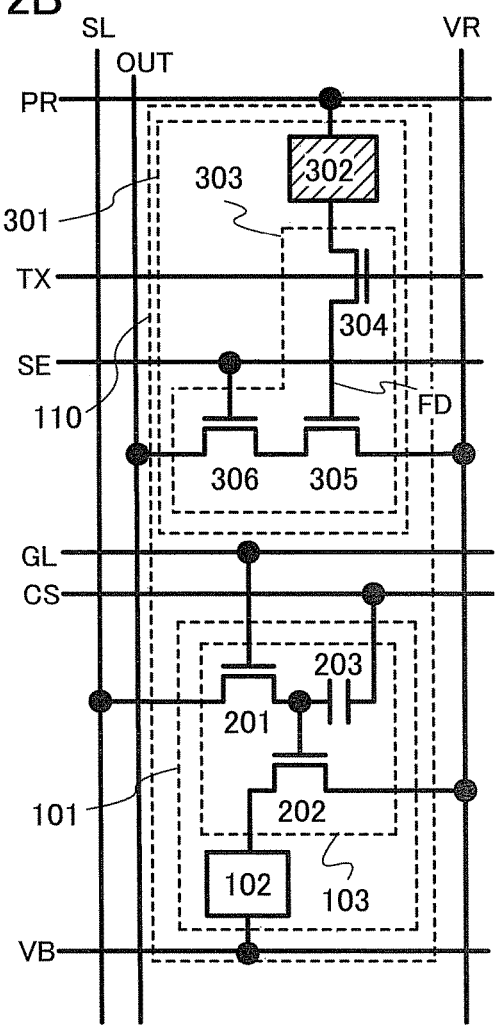

FIG. 2B is a diagram of the configuration shown in FIG. 2A, where the wirings VR, SE, OUT, TX, PR, SL, GL, VB, and CS are extended. In FIG. 2B, the wirings PR, TX, SE, GL, CS, and VB are arranged in parallel with each other, and the wirings SL, OUT, and VR are arranged in parallel with each other so as to intersect with the wirings PR, TX, SE, GL, CS, and VB.

Figure 3:
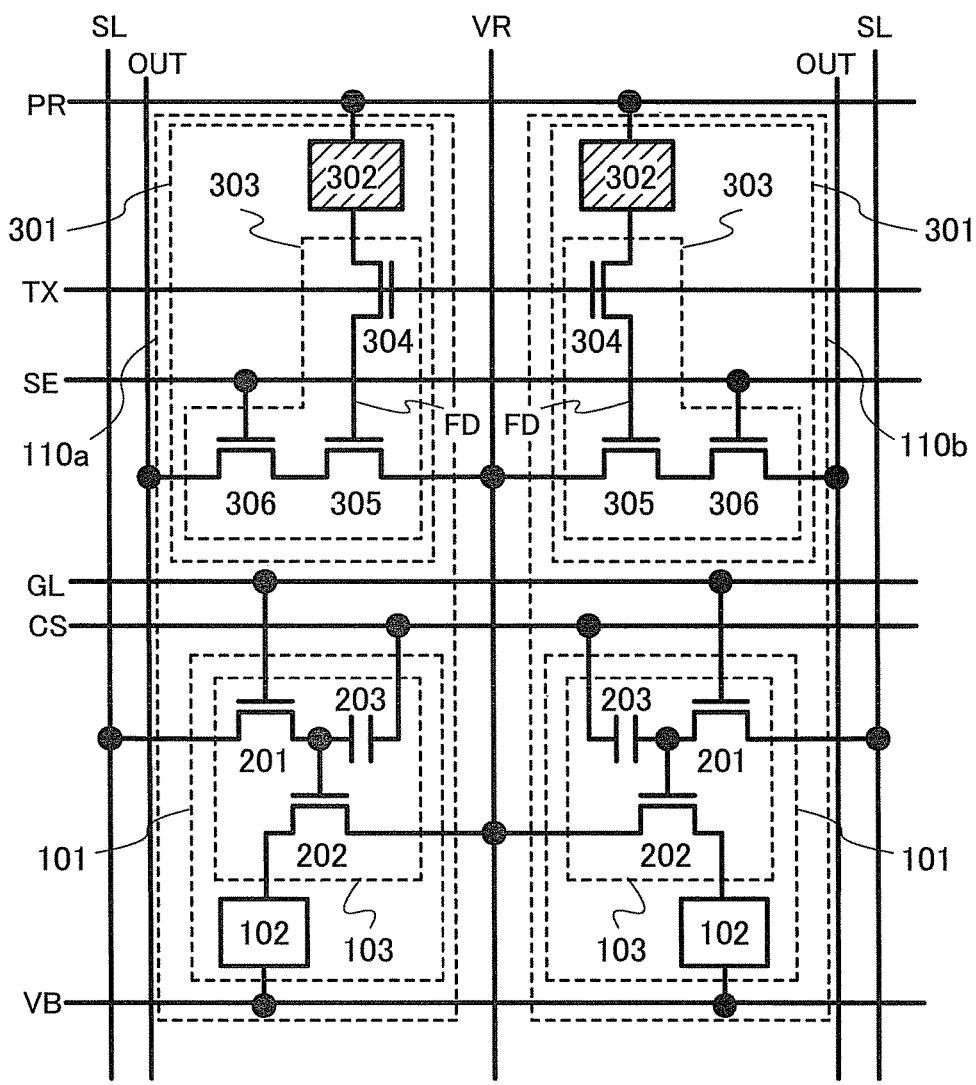
FIG. 3 is a circuit diagram illustrating a configuration of adjacent two sets among a plurality of sets arranged in a matrix.

An example in which the configuration shown in FIG. 2B is applied to the configuration shown in FIG. 1B where the power supply line VR is shared between two adjacent sets is shown in FIG. 3. The arrangement of the wirings is the same as FIG. 2B.

There are variations on the direction in which the wiring extends and on the arrangement of the wirings (e.g., parallel arrangement or arrangement where the wirings intersect with each other); any configuration other than the configuration shown in FIG. 2B or FIG. 3 may alternatively be employed.

Further, also in the case where any configuration shown in FIGS. 4A to 4D and/or any configuration shown in FIGS. 5A to 5C described above is/are employed instead of the controller 103 and/or the amplifier 303 in FIG. 2A, each wiring can be extended in an appropriate direction like FIGS. 2B and 3.

As shown in FIGS. 1C and 1D, in the case where the plurality of sets each including the display element 101 and the photosensor 301 are arranged in a matrix, a wiring can be shared between the sets 110 per row or column in the direction in which the wiring extends.

Further, wirings in which the same potential or the same signal is input can be used in common in plural sets. For example, the wiring VB can be shared between all the sets. In that case, the wiring VB can be referred to as an "electrode" instead of the "wiring". Further, for example, the wiring PR can be shared in plural sets. As one example thereof, the wiring PR can be shared between plural sets in which the reset operation and the storage operation in the photosensor 301 are performed simultaneously.

The power supply line which is electrically connected to the photosensor also serves as the power supply line which is electrically connected to the display element including the light-emitting element as described above, whereby the number of power supply lines included in a semiconductor device can be reduced. In this manner, the width of each power supply line can be increased and a semiconductor device with high definition can be provided. Thus, the definition of the semiconductor device can be improved while securing the stability of the potential of the power supply line. The stability of the potential of the power supply line leads to the stability of the driving voltage of the display element including the light-emitting element and the stability of the driving voltage of the photosensor. That is, even in a high-definition semiconductor device, the driving voltage of the display element including the light-emitting element and the driving voltage of the photosensor can be stabilized. Accordingly, a semiconductor device with high definition, high display quality, and high accuracy of imaging or detection of an object can be provided.

This embodiment can be combined as appropriate with any other embodiment.

Embodiment 2

In this embodiment, a more specific structure of the semiconductor device according to one embodiment of the present invention is described using top views and cross-sectional views.

Figure 6:
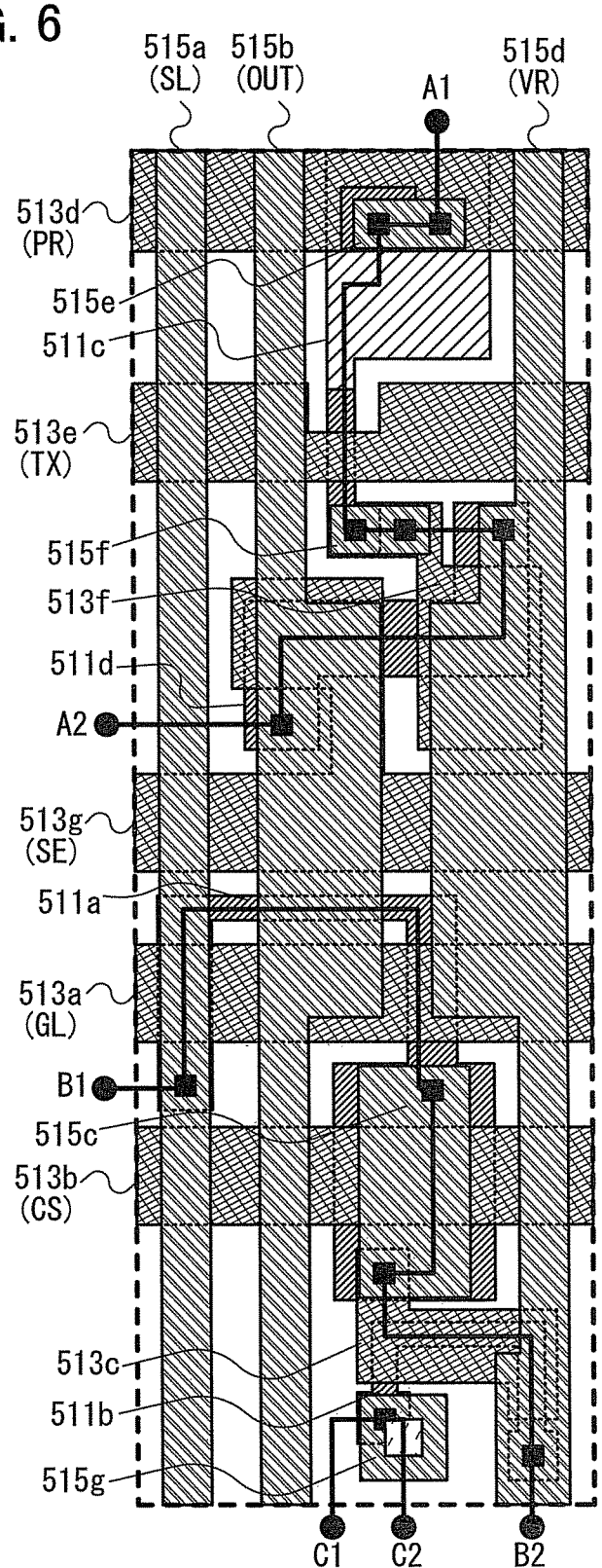
FIG. 6 is a top view illustrating a structure of a set including a photosensor and a display element including a light-emitting element.
Figure 7:
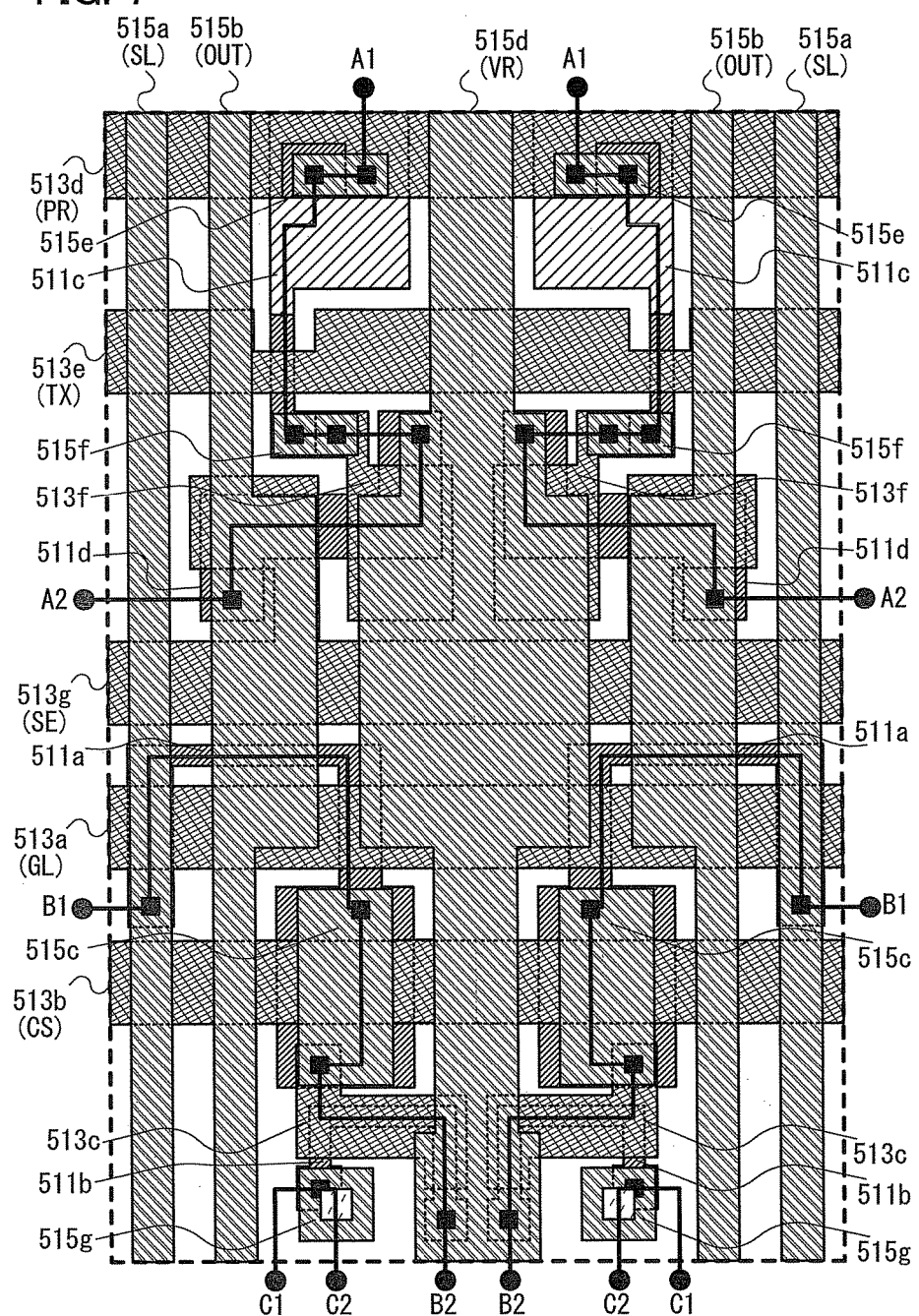
FIG. 7 is a top view illustrating a structure of adjacent two sets among a plurality of sets arranged in a matrix.

FIG. 6 is an example of a top view of a semiconductor device with the configuration shown in FIG. 2B. In FIG. 6, the same portions as those in FIG. 2B are denoted by the same reference symbols as those in FIG. 2B, and description thereof is omitted. FIG. 7 is an example of a top view of a semiconductor device with the configuration shown in FIG. 3. In FIG. 7, the same portions as those in FIG. 3 are denoted by the same reference symbols as those in FIG. 3, and description thereof is omitted. Further, cross-sectional views along line A1-A2, along line B1-B2, and line C1-C2 in FIGS. 6 and 7 are FIGS. 8A, 8B, and 8C, respectively. In FIG. 6, FIG. 7, and FIGS. 8A to 8C, there is a component illustrated with a size different from the actual size. In FIGS. 6 and 7, the light-emitting element 102, a substrate, an insulating layer functioning as an interlayer film, and the like are not illustrated for easy understanding of the views.

A more specific structure of the semiconductor device is described using FIG. 6, FIG. 7, and FIGS. 8A to 8C.

An insulating layer 501 is provided over a substrate 500, and over the insulating layer 501, semiconductor layers 511a to 511d are provided.

The semiconductor layer 511a includes an impurity region containing an impurity element imparting a p-type conductivity or an n-type conductivity. The semiconductor layer 511a functions as a layer in which a channel is formed (a channel formation layer) in the transistor 201 in the controller 103 and one of a pair of electrodes of the capacitor 203.

The semiconductor layer 511b includes an impurity region containing an impurity element imparting a p-type conductivity or an n-type conductivity. The semiconductor layer 511b functions as a channel formation layer in the transistor 202 in the controller 103.

The semiconductor layer 511c includes an impurity region 503a containing an impurity element imparting one of a p-type conductivity and an n-type conductivity, an impurity region 503b containing an impurity element imparting the other of the p-type conductivity and the n-type conductivity, an impurity region 503c containing an impurity element imparting the other of the p-type conductivity and the n-type conductivity, a first semiconductor region provided between the impurity regions 503a and 503b, and a second semiconductor region provided between the impurity regions 503b and 503c. In the semiconductor layer 511c, the first semiconductor region may contain an impurity element imparting a p-type conductivity or an n-type conductivity at a concentration lower than that of the impurity element in the impurity region 503a or the impurity region 503b. The photoelectric converter 302 is formed using the impurity regions 503a and 503b and the first semiconductor region provided therebetween. That is, the semiconductor layer 511c functions as the photoelectric converter 302. A direction in which light enters the photoelectric converter 302 is indicated by a hollowed arrow in FIG. 8A. The semiconductor layer 511c also functions as a channel formation layer in the transistor 304 in the amplifier 303. The photoelectric converter 302 can be formed not only by using such a semiconductor layer including the p-type impurity region and the n-type impurity region, but also by using a stacked layer including a p-type semiconductor layer and an n-type semiconductor layer.

The semiconductor layer 511d includes an impurity region containing an impurity element imparting a p-type conductivity or an n-type conductivity. The semiconductor layer 511d functions as channel formation layers in the transistors 305 and 306 in the amplifier 303.

One embodiment of the present invention is not limited to the above-described example in which the plurality of semiconductor layers is formed over the substrate 500. A plurality of semiconductor regions which are electrically isolated from each other may be formed in a semiconductor substrate, so that the plurality of semiconductor regions can be provided as an alternative to the semiconductor layers 511a to 511d. In that case, for example, a single crystal semiconductor substrate can be used as the semiconductor substrate; a single crystal silicon substrate can be used, for example.

An insulating layer 512 is provided over the semiconductor layers 511a to 511d. The insulating layer 512 functions as gate insulating layers of the transistors 201, 202, 304, 305, and 306 and a dielectric layer of the capacitor 203.

A conductive layer 513a overlaps with part of the semiconductor layer 511a with the insulating layer 512 provided therebetween. The part in the semiconductor layer 511a which overlaps with the conductive layer 513a is the channel formation region of the transistor 201. The conductive layer 513a functions as the gate of the transistor 201. The conductive layer 513a also functions as the wiring GL. Although the conductive layer 513a overlaps with a plurality of parts of the semiconductor layer 511a in FIGS. 8A to 8C, the conductive layer 513a does not necessarily overlap with a plurality of parts of the semiconductor layer 511a. However, the switching characteristics of the transistor 201 can be improved by overlapping the conductive layer 513a with a plurality of parts of the semiconductor layer 511a. The part of the semiconductor layer 511a which overlaps with the conductive layer 513a may contain an impurity element imparting a p-type conductivity or an n-type conductivity at a concentration lower than that of the impurity element in the impurity region (region which overlaps with none of the conductive layer 513a and conductive layers 513b and 513c) of the semiconductor layer 511a.

The conductive layer 513b overlaps with part of the semiconductor layer 511a with the insulating layer 512 provided therebetween. The conductive layer 513b functions as the other of the pair of electrodes of the capacitor 203. The part of the semiconductor layer 511a which overlaps with the conductive layer 513b may contain an impurity element imparting a p-type conductivity or an n-type conductivity at a concentration lower than that of the impurity element in the impurity region (region which overlaps with none of the conductive layers 513a, 513b, and 513c) of the semiconductor layer 511a. The conductive layer 513b also functions as the wiring CS.

The conductive layer 513c overlaps with part of the semiconductor layer 511a and part of the semiconductor layer 511b with the insulating layer 512 provided therebetween. The part in the semiconductor layer 511b which overlaps with the conductive layer 513c is the channel formation region of the transistor 202. The conductive layer 513c functions as the gate of the transistor 202. The part of the semiconductor layer 511a and/or the part of the semiconductor layer 511b which overlaps with the conductive layer 513c may contain an impurity element imparting a p-type conductivity or an n-type conductivity at a concentration lower than that/those of the impurity element(s) in the impurity region(s) (region(s) which overlap(s) with none of the conductive layers 513a, 513b, and 513c) of the semiconductor layer 511a and/or the semiconductor layer 511b.

A conductive layer 513d overlaps with part of the semiconductor layer 511c with the insulating layer 512 provided therebetween. The conductive layer 513d functions as the wiring PR. The part of the semiconductor layer 511c which overlaps with the conductive layer 513d may contain an impurity element imparting a p-type conductivity or an n-type conductivity at a concentration lower than that of the impurity element in the impurity region (the impurity region 503a, 503b, 503c) of the semiconductor layer 511c.

A conductive layer 513e overlaps with part of the semiconductor layer 511c with the insulating layer 512 provided therebetween. The part in the semiconductor layer 511c which overlaps with the conductive layer 513e is the channel formation region of the transistor 304. The conductive layer 513e functions as the gate of the transistor 304. The conductive layer 513e also functions as the wiring TX. The part of the semiconductor layer 511c which overlaps with the conductive layer 513e may contain an impurity element imparting a p-type conductivity or an n-type conductivity at a concentration lower than that of the impurity element in the impurity region (the impurity region 503a, 503b, 503c) of the semiconductor layer 511c.

A conductive layer 513f overlaps with part of the semiconductor layer 511d with the insulating layer 512 provided therebetween. The part in the semiconductor layer 511d which overlaps with the conductive layer 513f is the channel formation region of the transistor 305. The conductive layer 513f functions as the gate of the transistor 305. The part of the semiconductor layer 511d which overlaps with the conductive layer 513f may contain an impurity element imparting a p-type conductivity or an n-type conductivity at a concentration lower than that of the impurity element in the impurity region (region which overlaps with none of the conductive layer 513f and a conductive layer 513g) of the semiconductor layer 511d.

The conductive layer 513g overlaps with part of the semiconductor layer 511d with the insulating layer 512 provided therebetween. The part in the semiconductor layer 511d which overlaps with the conductive layer 513g is the channel formation region of the transistor 306. The conductive layer 513g functions as the gate of the transistor 306. The conductive layer 513g also functions as the wiring SE. The part of the semiconductor layer 511d which overlaps with the conductive layer 513g may contain an impurity element imparting a p-type conductivity or an n-type conductivity at a concentration lower than that of the impurity element in the impurity region (region which overlaps with none of the conductive layers 513f and 513g) of the semiconductor layer 511d.

An insulating layer 514 is provided over the insulating layer 512 with the conductive layers 513a to 513g provided therebetween.

A conductive layer 515a is electrically connected to one of the plurality of impurity regions in the semiconductor layer 511a through an opening passing through the insulating layers 512 and 514. The conductive layer 515a functions as the wiring SL.

A conductive layer 515b is electrically connected to one of the plurality of impurity regions in the semiconductor layer 511*d* through an opening passing through the insulating layers 512 and 514. The conductive layer 515*b* functions as the wiring OUT.

A conductive layer 515*c* is electrically connected to the conductive layer 513*c* through an opening passing through the insulating layer 514, and is electrically connected to one of the plurality of impurity regions in the semiconductor layer 511*a* through an opening passing through the insulating layers 512 and 514.

A conductive layer 515*d* is electrically connected to one of the plurality of impurity regions in the semiconductor layer 511*b* through an opening passing through the insulating layers 512 and 514, and is electrically connected to one of the plurality of impurity regions in the semiconductor layer 511*d* through an opening passing through the insulating layers 512 and 514. The conductive layer 515*d* functions as the wiring VR.

A conductive layer 515*e* is electrically connected to the impurity region 503*a* in the semiconductor layer 511*c* through an opening passing through the insulating layers 512 and 514, and is electrically connected to the conductive layer 513*d* which functions as the wiring PR through an opening passing through the insulating layer 514.

A conductive layer 515*f* is electrically connected to the impurity region 503*c* in the semiconductor layer 511*c* through an opening passing through the insulating layers 512 and 514, and is electrically connected to the conductive layer 513*f* through an opening passing through the insulating layer 514.

A conductive layer 515*g* is electrically connected to one of the plurality of impurity regions in the semiconductor layer 511*b* through an opening passing through the insulating layers 512 and 514.

An insulating layer 516 is provided over the insulating layer 514 with the conductive layers 515*a* to 515*g* provided therebetween.

A conductive layer 517 is provided over the insulating layer 516, and is electrically connected to the conductive layer 515*g* through an opening passing through the insulating layer 516. The conductive layer 517 functions as one of a pair of electrodes of the light-emitting element 102.

An insulating layer 518 is provided over the conductive layer 517.

An electroluminescent layer 519 is provided over the insulating layer 518. The electroluminescent layer 519 is electrically connected to the conductive layer 517 in a region where the conductive layer 517 is provided and the insulating layer 518 is not provided. The electroluminescent layer 519 functions as an electroluminescent layer of the light-emitting element 102.

A conductive layer 520 is provided over the electroluminescent layer 519 and is electrically connected to the electroluminescent layer 519. The conductive layer 520 functions as the other electrode of the pair of electrodes of the light-emitting element 102. The conductive layer 520 also functions as the wiring VB. The wiring VB may be processed into a shape over the substrate 500 or may be formed entirely over the substrate 500 without being processed into a shape.

The light-emitting element 102 is formed using the conductive layer 517, the electroluminescent layer 519, and the conductive layer 520. The light-emitting elements 102 in two adjacent sets 110 are separated from each other by the insulating layer 518. In this embodiment, the light-emitting element 102 has a top-emission structure; the light emission direction is indicated by a hollowed arrow in FIG. 8B.

Although the light-emitting element 102 has the structure in which light is emitted upwardly (in the direction opposite to the direction toward the substrate 500) in this embodiment, one embodiment of the present invention is not limited thereto; for example, a structure in which light is emitted upwardly and downwardly (in the direction toward the substrate 500) can be employed.

A coloring layer 522 is provided for one plane of a substrate 521 so as to transmit light from the electroluminescent layer 519. The coloring layer 522 is provided in order to transmit only a certain wavelength of light emitted from the electroluminescent layer 519 to provide a certain color. The coloring layer 522 functions as a color filter. The coloring layer 522 is not necessarily provided in the case where a material or the like of the electroluminescent layer 519 is selected as appropriate such that the light-emitting element 102 emits light of an appropriate color. No provision of the coloring layer 522 leads to a reduction in loss of light and a reduction of power consumption of a semiconductor device.

An insulating layer 523 is provided for the plane of the substrate 521 with the coloring layer 522 provided therebetween. The insulating layer 523 functions as a passivation film for preventing an impurity in the coloring layer 522 or the like from entering the light-emitting element 102 or the like. The insulating layer 523 also functions as a planarization film for relaxing a step between a region where the coloring layer 522 is provided and a region where the coloring layer 522 is not provided for the substrate 521.

An insulating layer 524 is provided between the insulating layer 523 and the conductive layer 520. The insulating layer 524 functions as a seal member of the light-emitting element 102, and also functions as a sealant between the substrates 500 and 521. The space between the insulating layer 523 and the conductive layer 520 may be filled with a gas, instead of provision of the insulating layer 524.

As each of the substrates 500 and 521, a glass substrate or a plastic substrate can be used, for example. Further, both the substrates 500 and 521 are not necessarily provided.

A gallium oxide layer, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used as the insulating layer 501, for example. For example, a silicon oxide layer, a silicon oxynitride layer, or the like can be used as the insulating layer 501. In addition, halogen may be included in the insulating layer 501. Further, a stack of layers of materials applicable to the insulating layer 501 can be used as the insulating layer 501. The insulating layer 501 is not necessarily provided.

As the semiconductor layers 511*a* to 511*d*, a layer containing an amorphous semiconductor, a microcrystalline semiconductor, a polycrystalline semiconductor, or a single crystal semiconductor can be used, for example. Further, a semiconductor layer including a semiconductor belonging to Group 14 of the periodic table (e.g., silicon) can be used as the semiconductor layers 511*a* to 511*d*.

An oxide semiconductor layer can be used as the semiconductor layers 511*a* to 511*d*.

In the case of using an oxide semiconductor layer, an oxide semiconductor containing at least indium (In) or zinc (Zn) is preferably used. In particular, In and Zn are preferably contained. In addition, gallium (Ga) is preferably contained as a stabilizer for reducing variation in electric characteristics of a transistor using the oxide semiconductor. Tin (Sn) is preferably contained as the stabilizer. Hafnium (Hf) is preferably contained as the stabilizer. Aluminum (Al) is preferably contained as the stabilizer.

As the stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

In this specification, for example, the "In—Ga—Zn-based oxide" refers to an oxide containing In, Ga, and Zn as its main components and there is no particular limitation on the ratio of In:Ga:Zn. The In—Ga—Zn-based oxide may contain a metal element other than In, Ga, and Zn.

Further, a material represented by $InMO_3(ZnO)_m$ (m>0 and m is not an integer) may be used as the oxide semiconductor, where M represents one or more metal elements selected from Ga, Fe, Mn, and Co. Further, as the oxide semiconductor, a material represented by $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is close to any of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is close to any of the above compositions may be used.

However, without limitation to the materials given above, a material with an appropriate composition may be used considering semiconductor characteristics (e.g., mobility, threshold voltage, and variation). Further, considering semiconductor characteristics, it is preferable that the carrier density, the impurity concentration, the defect density, the atomic ratio between a metal element and oxygen, the interatomic distance, the density, and the like be adjusted as appropriate.

For example, a high mobility can be exhibited relatively easily with an In—Sn—Zn-based oxide. However, even with an In—Ga—Zn-based oxide, the mobility can be increased by reducing the defect density in the bulk of the In—Ga—Zn-based oxide.

Note that for example, the expression the "composition of an oxide with an atomic ratio of In:Ga:Zn=a:b:c (a+b+c=1) is close to the composition of an oxide with an atomic ratio of In:Ga:Zn=A:B:C (A+B+C=1)" means that a, b, and c satisfy the following relation: $(a-A)^2+(b-B)^2+(c-C)^2 \le r^2$ where r is, for example, 0.05. The same applies to other oxides.

The oxide semiconductor may be either a single crystal or a non-single-crystal. In the latter case, the oxide semiconductor may be either amorphous or polycrystal. Further, the oxide semiconductor may either have a structure including a crystal portion in an amorphous state or may be non-amorphous.

An amorphous oxide semiconductor can be provided with a flat surface with relative ease, which enables interface scattering in a transistor to be reduced, so that a relatively high mobility can be exhibited with relative ease.

In an oxide semiconductor having crystallinity, defects in the bulk can be further reduced, and a mobility higher than that of an amorphous oxide semiconductor layer can be exhibited by improving the flatness of its surface. In order to improve its surface flatness, the oxide semiconductor is preferably formed on a flat surface; specifically, the oxide semiconductor is preferably formed on a surface with an average surface roughness (Ra) of less than or equal to 1 nm, further preferably less than or equal to 0.3 nm, still further preferably less than or equal to 0.1 nm.

The average surface roughness (Ra) is a three-dimensional expanded version of center line average roughness that is defined by JIS B 0601 so as to be applied to a plane, and can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy \qquad \text{[Formula 1]}$$

In the above formula, $S_0$ denotes an area of a plane to be measured (a rectangular region which is defined by four points at coordinates $(x_1, y_1)$, $(x_1, y_2)$, $(x_2, y_1)$, $(x_2, y_2)$), and $Z_0$ denotes an average height of the plane. The average surface roughness Ra can be measured with an atomic force microscope (AFM).

The oxide semiconductor layer is preferably fainted by a sputtering method. For example, with the use of a target of any of the above oxides, the oxide semiconductor layer can be formed by a sputtering method.

A high purity of the target which is 99.99% or higher leads to suppression of entrance of alkali metal, hydrogen atoms, hydrogen molecules, water, a hydroxyl group, hydride, or the like into the oxide semiconductor layer. In addition, the use of the target leads to a reduction in the concentration of alkali metal such as lithium, sodium, or potassium in the oxide semiconductor layer.

An In—Sn—Zn-based oxide can be referred to as ITZO. In the case where ITZO is used as the oxide semiconductor layer, an oxide target whose composition has an atomic ratio of In:Sn:Zn of 1:2:2, 2:1:3, 1:1:1, or 20:45:35 can be used, for example.

In addition, by setting the pressure of a treatment chamber in a sputtering apparatus to 0.4 Pa or less in forming the oxide semiconductor layer, mixing of an impurity such as alkali metal or hydrogen to an object to be formed or a surface of the object can be suppressed. Hydrogen may be contained in the object not only in the form of a hydrogen atom but also in the form of a hydrogen molecule, water, a hydroxyl group, or hydride in some cases.

Further, with the use of an entrapment vacuum pump (e.g., a cryopump) as an evacuation system of the chamber of the sputtering apparatus, counter flow of impurities such as alkali metal, a hydrogen atom, a hydrogen molecule, water, a hydroxyl group, or hydride from the evacuation system can be suppressed. The evacuation unit may be a turbo pump provided with a cold trap.

After the oxide semiconductor layer is formed, if necessary, heat treatment may be performed in an atmosphere which contains hydrogen and moisture as less as possible (a nitrogen atmosphere, an oxygen atmosphere, a dry-air atmosphere (for example, as for moisture, the dew point is −40° C. or less, preferably −60° C. or less), or the like) at a temperature higher than or equal to 200° C. and lower than or equal to 450° C. This heat treatment can be called dehydration or dehydrogenation for detaching H, OH, or the like from the oxide semiconductor layer; in the case where the temperature is raised in an inert atmosphere and is switched to an atmosphere containing oxygen during the heat treatment, or in the case where an oxygen atmosphere is employed in the heat treatment, such heat treatment can also be called treatment for supplying oxygen.

As the oxide semiconductor layer, an oxide semiconductor layer that is purified by reduction of impurities such as moisture, hydrogen, and alkali metal elements (e.g., sodium or lithium), which serve as electron donors (donors), is used. The concentration of hydrogen in the oxide semiconductor layer according to secondary ion mass spectrometry (SIMS) is less than or equal to $5\times10^{19}/cm^3$, preferably less than or equal to $5\times10^{18}/cm^3$, further preferably less than or equal to $5\times10^{17}/cm^3$, still further preferably less than or equal to $1\times10^{16}/cm^3$. In addition, the carrier density of the oxide semiconductor layer according to Hall effect measurement is less than $1\times10^{14}/cm^3$, preferably less than $1\times10^{12}/cm^3$, further preferably less than $1\times10^{11}/cm^3$. Furthermore, the band gap of the oxide semiconductor is 2 eV or more, preferably 2.5 eV or more, further preferably 3 eV or more.

It has been pointed out that an oxide semiconductor is insensitive to impurities, there is no problem even when a considerable amount of metal impurities is contained in the film, and therefore, soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI (SOLID STATE PHYSICS)*, 2009, Vol. 44, pp. 621-633). But such consideration is not appropriate. Alkali metal is not a component of an oxide semiconductor, and thus is an impurity. Also, alkaline earth metal is an impurity in the case where the alkaline earth metal is not a component of the oxide semiconductor. Among alkali metals, in particular, sodium (Na) is diffused into an insulating film which is in contact with the oxide semiconductor layer when the insulating film is an oxide. Further, in the oxide semiconductor layer, Na cuts or enters a bond between metal and oxygen which are components of the oxide semiconductor. As a result, for example, deterioration of characteristics of the transistor, such as a normally-on state of the transistor due to shift of a threshold voltage in the negative direction, or reduction in mobility, occurs; in addition, variation in characteristics also occurs. Such deterioration of characteristics of the transistor and variation in characteristics due to the impurity remarkably appear when the hydrogen concentration in the oxide semiconductor layer is very low. Therefore, when the hydrogen concentration in the oxide semiconductor layer is less than or equal to $1\times10^{18}/cm^3$, preferably less than or equal to $1\times10^{17}/cm^3$, the concentration of the above impurity is preferably reduced as much as possible. Specifically, the Na concentration according to secondary ion mass spectrometry is reduced to preferably less than or equal to $5\times10^{16}/cm^3$, further preferably less than or equal to $1\times10^{16}/cm^3$, still further preferably less than or equal to $1\times10^{15}/cm^3$. In addition, the lithium (Li) concentration according to secondary ion mass spectrometry is reduce to preferably less than or equal to $5\times10^{15}/cm^3$, further preferably less than or equal to $1\times10^{15}/cm^3$. In addition, the potassium (K) concentration according to secondary ion mass spectrometry is reduced to preferably less than or equal to $5\times10^{15}/cm^3$, further preferably less than or equal to $1\times10^{15}/cm^3$.

It is known that with SIMS, it is difficult to accurately obtain data in the proximity of a surface of a sample or in the proximity of an interface between stacked layers formed using different materials in principle when the concentration of alkali metal elements or hydrogen in the layer is measured. Thus, in the case where distribution of the concentration of alkali metal elements or hydrogen in the layer in the thickness direction is analyzed by SIMS, an average value in a region of the layer where there is no great variation in the value and the value is almost constant is adopted as the concentration of alkali metal elements or hydrogen. Further, in the case where the thickness of the layer is small, such a region where the value is almost constant cannot be found in some cases because of the influence of the concentration of alkali metal elements or hydrogen of another layer adjacent to the layer. In that case, the maximum value or the minimum value of the concentration of alkali metal elements or hydrogen of a region where the layer exists is adopted as the concentration of alkali metal elements or hydrogen of the layer. Furthermore, in the case where a mountain-shaped peak having the maximum value or a valley-shaped peak having the minimum value does not exist in the region where the layer exists, the value at an inflection point is adopted as the concentration of alkali metal elements or hydrogen.

The off-state current density of a transistor whose channel is formed in an oxide semiconductor layer can be suppressed to less than or equal to 100 yA/μm, preferably less than or equal to 10 yA/μm, further preferably less than or equal to 1 yA/μm.

Further, the oxide semiconductor layer may be doped with an impurity which imparts p-type conductivity, such as Sn, so as to make the oxide semiconductor layer to have weak p-type conductivity, whereby the off-state current of the transistor whose channel is formed in the oxide semiconductor layer can be reduced.

As the oxide semiconductor, an oxide including a crystal with c-axis alignment (also referred to as C-Axis Aligned Crystal (CAAC)), which has a triangular or hexagonal atomic arrangement when seen from the direction of the a-b plane, a top surface, or an interface may be used. In the crystal, metal atoms are arranged in a layered manner along the c-axis, or metal atoms and oxygen atoms are arranged in a layered manner along the c-axis, and the direction of the a-axis or the b-axis is varied in the a-b plane (the crystal twists around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but does not consist of only an amorphous state. Further, although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate provided with the CAAC or a top surface of the CAAC). Alternatively, the normals to the a-b planes of the individual crystalline portions included in the CAAC may be aligned in one direction (e.g., a direction perpendicular to a surface of a substrate provided with the CAAC or a top surface of the CAAC).

The CAAC is a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a top surface of the film or a surface of a substrate provided with the CAAC, and in which metal atoms are arranged in a layered manner or metal atoms and oxygen atoms (or nitrogen atoms) are arranged in a layered manner when a cross section of the film is observed.

Examples of a crystal structure of the CAAC are described in detail using FIGS. 16A to 16E, FIGS. 17A to 17C, and FIGS. 18A to 18C. In FIGS. 16A to 16E, FIGS. 17A to 17C, and FIGS. 18A to 18C, the vertical direction corresponds to the c-axis direction and a plane perpendicular to the c-axis direction corresponds to the a-b plane, unless otherwise specified. A simply "upper half" and a simply "lower half" refer to an upper half above the a-b plane and a lower half below the a-b plane (an upper half and a lower half with respect to the a-b plane). Furthermore, in FIGS. 16A to 16E, O surrounded by a circle represents tetracoordinate O and O surrounded by a double circle represents tricoordinate O.

Figure 16A:
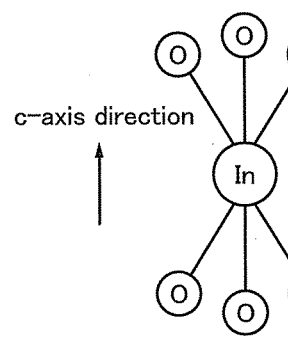
FIGS. 16A to 16E are views each illustrating a crystal structure of an oxide material.

FIG. 16A illustrates a structure including one hexacoordinate In atom and six tetracoordinate oxygen (hereinafter referred to as tetracoordinate O) atoms proximate to the In atom. In this specification, a structure showing only oxygen atoms proximate to one metal atom is referred to as a small group. The structure in FIG. 16A is actually an octahedral structure, but is illustrated as a planar structure for simplicity. Three tetracoordinate O atoms exist in each of the upper half and the lower half in FIG. 16A. The electric charge of the small group illustrated in FIG. 16A is 0.

Figure 16D:
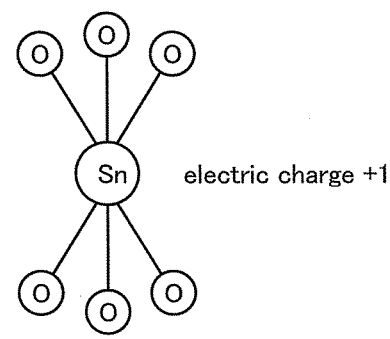
Figure 16B:
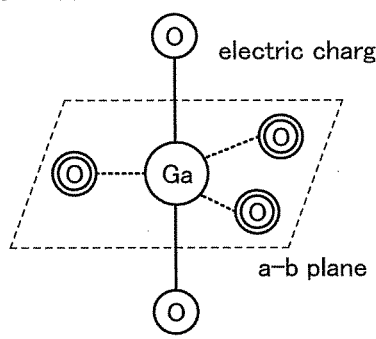

FIG. 16B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the three tricoordinate O atoms exist on the a-b plane. One tetracoordinate O atom exists in each of the upper half and the lower half in FIG. 16B. An In atom can also have the structure illustrated in FIG. 16B because the In atom can have five ligands. The electric charge of the small group illustrated in FIG. 16B is 0.

Figure 16E:
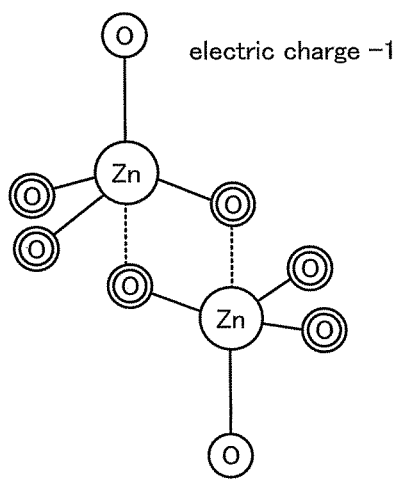
Figure 16C:
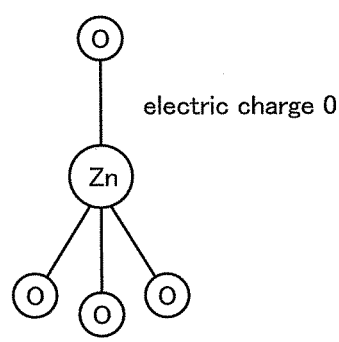

FIG. 16C illustrates a structure including one tetracoordinate Zn atom and four tetracoordinate O atoms proximate to the Zn atom. In FIG. 16C, one tetracoordinate O atom exists in the upper half and three tetracoordinate O atoms exist in the lower half. Alternatively, three tetracoordinate O atoms may exist in the upper half and one tetracoordinate O atom may exist in the lower half in FIG. 16C. The electric charge of the small group illustrated in FIG. 16C is 0.

FIG. 16D illustrates a structure including one hexacoordinate Sn atom and six tetracoordinate O atoms proximate to the Sn atom. In FIG. 16D, three tetracoordinate O atoms exist in each of the upper half and the lower half. The electric charge of the small group illustrated in FIG. 16D is +1.

FIG. 16E illustrates a small group including two Zn atoms. In FIG. 16E, one tetracoordinate O atom exists in each of the upper half and the lower half. The electric charge of the small group illustrated in FIG. 16E is −1.

In this specification, a group of a plurality of small groups is referred to as a medium group, and a group of a plurality of medium groups is referred to as a large group (also referred to as a unit cell).

Now, a rule of bonding the small groups to each other is described. The three O atoms in the upper half with respect to the hexacoordinate In atom in FIG. 16A has three proximate In atoms in the downward direction, and the three O atoms in the lower half has three proximate In atoms in the upward direction. The one O atom in the upper half with respect to the pentacoordinate Ga atom in FIG. 16B has one proximate Ga atom in the downward direction, and the one O atom in the lower half has one proximate Ga atom in the upward direction. The one O atom in the upper half with respect to the one tetracoordinate Zn atom in FIG. 16C has one proximate Zn atom in the downward direction, and the three O atoms in the lower half has three proximate Zn atoms in the upward direction. In this manner, the number of tetracoordinate O atoms above a metal atom is equal to the number of metal atoms proximate to and below the tetracoordinate O atoms; similarly, the number of tetracoordinate O atoms below a metal atom is equal to the number of metal atoms proximate to and above the tetracoordinate O atoms. Since the coordination number of the tetracoordinate O atom is 4, the sum of the number of metal atoms proximate to and below the O atom and the number of metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded to each other. For example, in the case where the hexacoordinate metal (In or Sn) atom is bonded through three tetracoordinate O atoms in the lower half, it is bonded to a pentacoordinate metal (Ga or In) atom or a tetracoordinate metal (Zn) atom.

A metal atom whose coordination number is 4, 5, or 6 is bonded to another metal atom through a tetracoordinate O atom in the c-axis direction. In addition, a medium group can also be formed in a different manner by combining a plurality of small groups so that the total electric charge of the layered structure is 0.

Figure 17A:
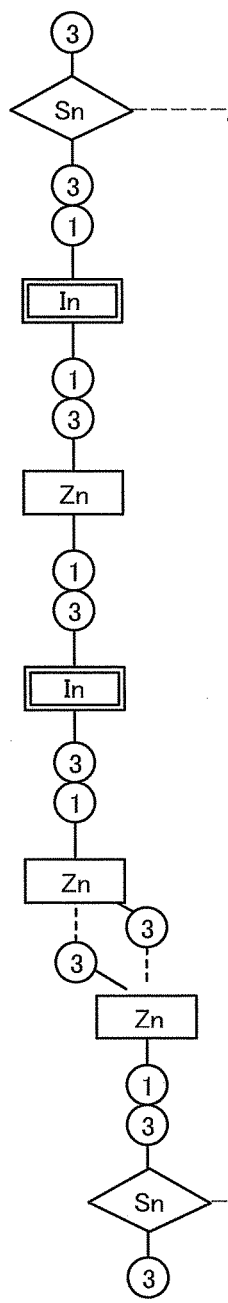
FIGS. 17A to 17C are diagrams illustrating a crystal structure of an oxide material.
Figure 17B:
Figure 17C:
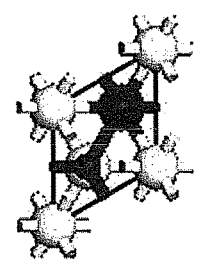

FIG. 17A illustrates a model of a medium group included in a layered structure of an In—Sn—Zn—O-based material. FIG. 17B illustrates a large group including three medium groups. FIG. 17C illustrates an atomic arrangement where the layered structure shown in FIG. 17B is observed from the c-axis direction.

In FIG. 17A, a tricoordinate O atom is omitted for simplicity, and a tetracoordinate O atom is illustrated by a circle; the number in the circle shows the number of tetracoordinate O atoms. For example, three tetracoordinate O atoms existing in each of the upper half and the lower half with respect to a Sn atom are denoted by circled 3. Similarly, in FIG. 17A, one tetracoordinate O atom existing in each of the upper half and the lower half with respect to an In atom is denoted by circled 1. FIG. 17A also illustrates a Zn atom proximate to one tetracoordinate O atom in the lower half and three tetracoordinate O atoms in the upper half, and a Zn atom proximate to one tetracoordinate O atom in the upper half and three tetracoordinate O atoms in the lower half.

In the medium group included in the layered structure of the In—Sn—Zn—O-based material in FIG. 17A, in the order starting from the top, a Sn atom proximate to three tetracoordinate O atoms in each of the upper half and the lower half is bonded to an In atom proximate to one tetracoordinate O atom in each of the upper half and the lower half, the In atom is bonded to a Zn atom proximate to three tetracoordinate O atoms in the upper half, the Zn atom is bonded to an In atom proximate to three tetracoordinate O atoms in each of the upper half and the lower half through one tetracoordinate O atom in the lower half with respect to the Zn atom, the In atom is bonded to a small group that includes two Zn atoms and is proximate to one tetracoordinate O atom in the upper half, and the small group is bonded to a Sn atom proximate to three tetracoordinate O atoms in each of the upper half and the lower half through one tetracoordinate O atom in the lower half with respect to the small group. A plurality of such medium groups is bonded to form a large group.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, by which the electric charge of +1 is canceled, is needed to form a layered structure including a Sn atom. As a structure having electric charge of −1, the small group including two Zn atoms as illustrated in FIG. 16E can be given. For example, with one small group including two Zn atoms, electric charge of one small group including a Sn atom can be cancelled, so that the total electric charge of the layered structure can result in 0.

Specifically, by repeating the large group illustrated in FIG. 17B, an In—Sn—Zn—O-based crystal ($In_2SnZn_3O_8$) can be formed. The layered structure of the In—Sn—Zn—O-based crystal can be expressed by a composition formula, $In_2SnZn_2O_7(ZnO)_m$ (m is 0 or a natural number).

The above-described rule is also applied to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 18A:
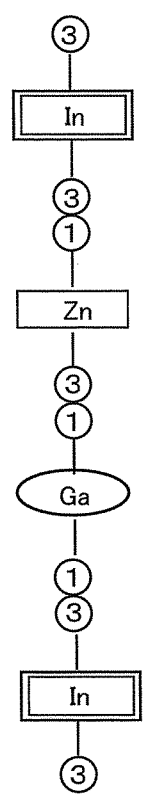
FIGS. 18A to 18C are diagrams illustrating a crystal structure of an oxide material.

For example, FIG. 18A illustrates a model of a medium group included in a layered structure of an In—Ga—Zn—O-based material.

In the medium group included in the layered structure of the In—Ga—Zn—O-based material in FIG. 18A, in the order starting from the top, an In atom proximate to three tetracoordinate O atoms in each of the upper half and the lower half is bonded to a Zn atom proximate to one tetracoordinate O atom in the upper half, the Zn atom is bonded to a Ga atom proximate to one tetracoordinate O atom in each of the upper half and the lower half through three tetracoordinate O atoms in the lower half with respect to the Zn atom, and the Ga atom is bonded to an In atom proximate to three tetracoordinate O atoms in each of the upper half and the lower half through one tetracoordinate O atom in the lower half with respect to the Ga atom. A plurality of such medium groups are bonded to form a large group.

Figure 18B:
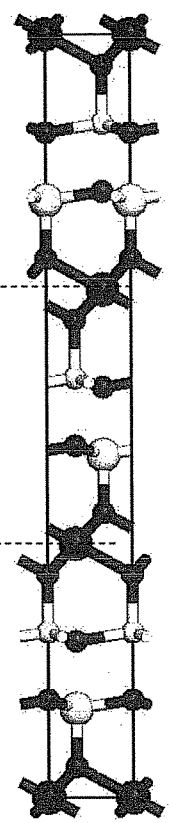
Figure 18C:
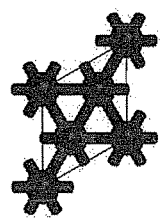

FIG. 18B illustrates a large group including three medium groups. FIG. 18C illustrates an atomic arrangement where the layered structure shown in FIG. 18B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of the In atom, the Zn atom, and the Ga atom is 0. As a result, the total electric charge of a medium group having a combination of these small groups always results in 0.

In order to form the layered structure of the In—Ga—Zn—O-based material, a large group can be formed using not only the medium group illustrated in FIG. 18A but also a medium group in which the arrangement of the In atom, the Ga atom, and the Zn atom is different from that in FIG. 18A.

As the insulating layer 512, for example, a layer of a material applicable to the insulating layer 501 can be used. A stack of layers of materials applicable to the insulating layer 512 can be used as the insulating layer 512.

A layer formed using a metal material such as molybdenum, titanium, chromium, tantalum, tungsten, aluminum, copper, neodymium, or scandium can be used as any of the conductive layers 513a to 513g. For example, a Cu—Mg—Al alloy can be used. Further, a layer containing a conductive metal oxide can be used as any of the conductive layers 513a to 513g as well. As the conductive metal oxide, a metal oxide such as indium oxide ($In_2O_3$), tin oxide ($SnO_2$), zinc oxide (ZnO), an alloy of indium oxide and tin oxide ($In_2O_3$—$SnO_2$, which is abbreviated to ITO in some cases), or an alloy of indium oxide and zinc oxide ($In_2O_3$—ZnO); or the metal oxide containing silicon, silicon oxide, or nitrogen can be used, for example. A stack of layers of materials applicable to each of the conductive layers 513a to 513g can be used as any of the conductive layers 513a to 513g. For example, a stacked-layer structure of a layer including a Cu—Mg—Al alloy and a layer including Cu can be employed. For example, a stack of a tantalum nitride layer and a tungsten layer can be used as each of the conductive layers 513a to 513g. The side surface of any of the conductive layers 513a to 513g may be tapered.

As the insulating layer 514, a layer of a material applicable to the insulating layer 501 can be used, for example. A stack of layers of materials applicable to the insulating layer 501 can be used as the insulating layer 514. For example, the insulating layer 514 can be formed using a stack of a silicon oxynitride layer and a silicon nitride oxide layer.

As any of the conductive layers 515a to 515g, a layer of a material applicable to each of the conductive layers 513a to 513g can be used. A stack of layers of materials applicable to each of the conductive layers 515a to 515g can be used as any of the conductive layers 515a to 515g. For example, a stack of a titanium layer, an aluminum layer, and a titanium layer can be used as each of the conductive layers 515a to 515g. The side surface of any of the conductive layers 515a to 515g may be tapered.

As the insulating layer 516, a layer of a material applicable to the insulating layer 512 can be used, for example. A stack of layers of materials applicable to the insulating layer 516 can be used as the insulating layer 516.

As the conductive layer 517, a layer of a material which reflects light and is applicable to each of the conductive layers 513a to 513g can be used. A stack of layers of materials applicable to the conductive layer 517 can be used as the conductive layer 517. One embodiment of the present invention is not thereto; in the case of a dual-emission structure, a layer of a material through which light passes and which is applicable to each of the conductive layers 513a to 513g can be used as the conductive layer 517. The side surface of the conductive layer 517 may be tapered.

As the insulating layer 518, for example, either an organic insulating layer or an inorganic insulating layer can be used.

The electroluminescent layer 519 is a layer which emits light of single color exhibiting one color. As the electroluminescent layer 519, for example, a light-emitting layer using a light-emitting material which emits light of one color can be used. The electroluminescent layer 519 can also be formed using a stack of light-emitting layers which emit light of different colors. As the light-emitting material, an electroluminescent material such as a fluorescent material or a phosphorescent material can be used. A material including a plurality of electroluminescent materials may be used as the light-emitting material. For example, a light-emitting layer which emits white light may be formed using a stack of a layer of a fluorescent material which emits blue light, a layer of a first phosphorescent material which emits orange light, and a layer of a second phosphorescent material which emits orange light. Further, as the electroluminescent material, either an organic electroluminescent material or an inorganic electroluminescent material can be used. Further, in addition to the light-emitting layer, the electroluminescent layer may include one or more of a hole injection layer, a hole transport layer, an electron injection layer, and an electron transport layer.

A layer of a material through which light passes and which is applicable to each of the conductive layers 513a to 513g can be used as the conductive layer 520. A stack of layers of materials applicable to the conductive layer 520 can be used as the conductive layer 520. The side surface of the conductive layer 520 may be tapered.

As the coloring layer 522, for example, a layer including a dye or a pigment, through which red light, green light, or blue light passes can be used. Further or alternatively, a layer including a dye or a pigment, through which cyan light, magenta light, or yellow light passes may be used as the coloring layer 522.

As the insulating layer 523, a layer of a material applicable to the insulating layer 501 can be used, for example. A stack of layers of materials applicable to the insulating layer 523 can be used as the insulating layer 523. The insulating layer 523 is not necessarily provided.

As the insulating layer 524, for example, a layer applicable to the insulating layer 501 or a layer of a resin material can be used. A stack of layers of materials applicable to the insulating layer 524 can be used as the insulating layer 524.

Further, a light-blocking layer may be provided for part of the substrate 500 and/or part of the substrate 521. Unnecessary light incidence into the transistor or the like can be suppressed with the light-blocking layer.

Figure 8A:
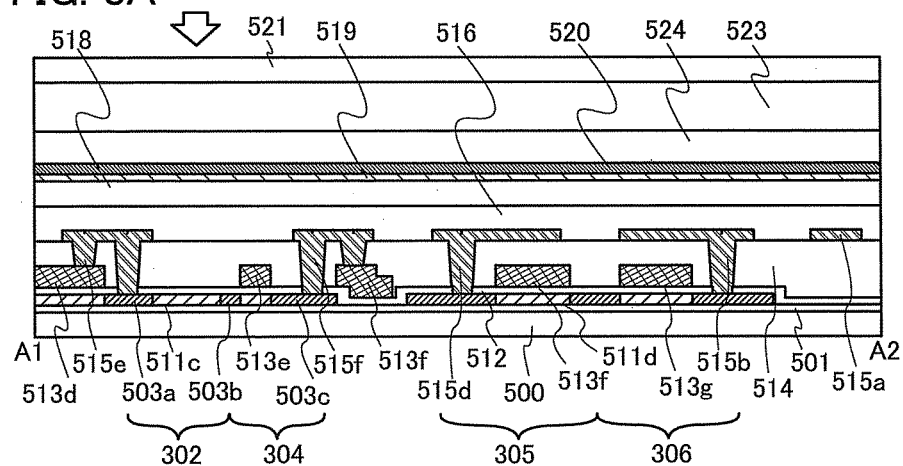
FIGS. 8A to 8C are cross-sectional views illustrating structures of a photosensor and a display element including a light-emitting element.
Figure 8B:
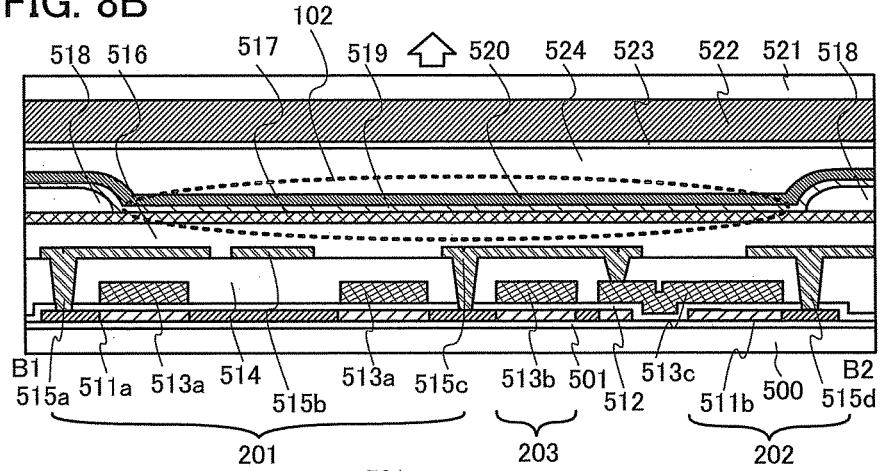
Figure 8C:
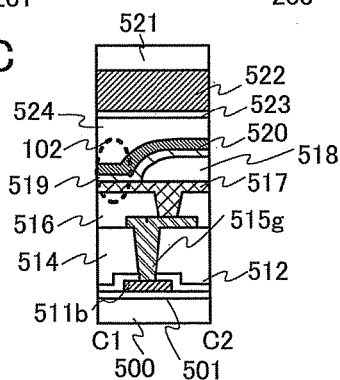

The gate is provided only over the semiconductor layer of the transistor (transistor 201, transistor 202, transistor 304, transistor 305, transistor 306) in FIGS. 8A to 8C. However, one embodiment of the present invention is not limited thereto. A gate may be provided only under the semiconductor layer of the transistor (transistor 201, transistor 202, transistor 304, transistor 305, transistor 306). Alternatively, two gates may be provided with the semiconductor layer provided therebetween in the transistor (transistor 201, transistor 202, transistor 304, transistor 305, transistor 306). In that case where the transistor includes the two gates with the semiconductor layer provided therebetween, one of the gates can be supplied with a signal for controlling switching of the transistor, and the other of the gates can be supplied with a potential. In that case, potentials with the same level may be supplied to the two gates, or a fixed potential such as a ground potential may be supplied only to the other of the gates. By controlling the level of the potential supplied to the other of the gates, the threshold voltage of the transistor can be controlled. The other of the gates may be in a floating state, which is an electrically insulated state, as long as the threshold voltage of the transistor is not adversely affected.

The above-described structure of any of the transistor 201, the transistor 202, the transistor 304, the transistor 305, and the transistor 306 can be applied to any of the transistors 204 and 205 in FIGS. 4A to 4D and the transistor 307 in FIGS. 5A to 5C.

The power supply line (corresponding to the conductive layer 515d) which is electrically connected to the photosensor also serves as the power supply line (corresponding to the conductive layer 515d) which is electrically connected to the display element including the light-emitting element, whereby the number of power supply lines included in a semiconductor device can be reduced. In this manner, the width of each power supply line can be increased and a semiconductor device with high definition can be provided. Thus, the definition of the semiconductor device can be improved while securing the stability of the potential of the power supply line. The stability of the potential of the power supply line leads to the stability of the driving voltage of the display element including the light-emitting element and the stability of the driving voltage of the photosensor. That is, even in a high-definition semiconductor device, the driving voltage of the display element including the light-emitting element and the driving voltage of the photosensor can be stabilized. Accordingly, a semiconductor device with high definition, high display quality, and high accuracy of imaging or detection of an object can be provided.

This embodiment can be combined as appropriate with any other embodiment.

Embodiment 3

Figure 9A:
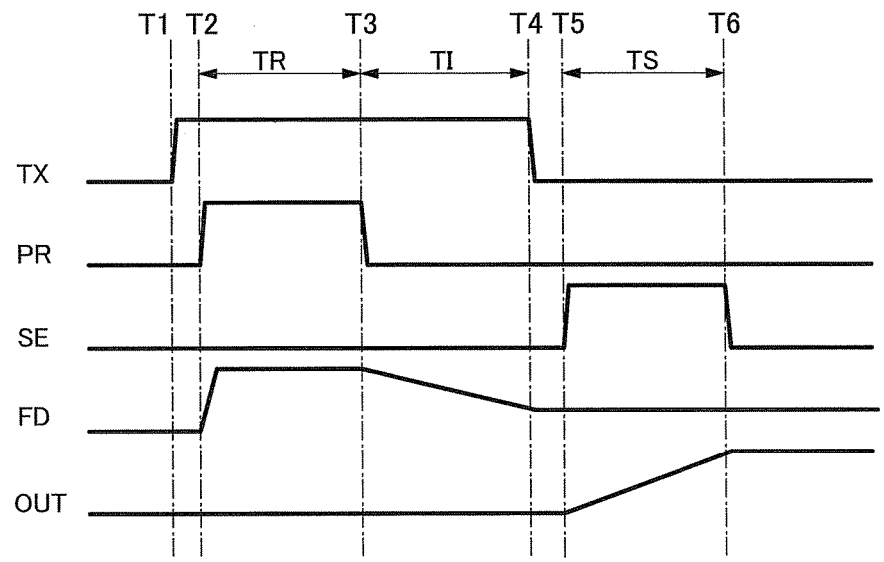
FIGS. 9A and 9B are timing charts each for describing an operation of a photosensor.

In this embodiment, an example of a driving method of a semiconductor device is described.
(Driving Method of Photosensor)
Examples of a driving method of a photosensor is described.
(Driving Method 1 of Photosensor)
A driving method of the photosensor 301 having the configuration shown in FIGS. 2A and 2B, FIG. 3, and FIG. 5A is described. FIG. 9A is an example of a timing chart illustrating changes in potentials of each wiring (the wiring TX, the wiring PR, the wiring SE, the wiring OUT) and the node FD illustrated in FIGS. 2A and 2B, FIG. 3, and FIG. 5A. A photodiode is used as the photoelectric converter 302, as an example, in this embodiment.

In the timing chart of FIG. 9A, for easy understanding of the operation of the photosensor 301, it is assumed that either a high-level potential or a low-level potential is supplied to the wiring TX, the wiring SE, and the wiring PR. Specifically, it is assumed that the wiring TX is supplied with a high-level potential HTX and a low-level potential LTX; the wiring SE is supplied with a high-level potential HSE and a low-level potential LSE; and the wiring PR is supplied with a high-level potential HPR and a low-level potential LPR. The wiring VR is supplied with a predetermined potential, for example, a high-level power supply potential VDD.

Although description is made assuming that the transistors 304, 305, and 306 are n-channel transistors, one embodiment of the present invention is not limited thereto; one or more of the transistors 304, 305, and 306 may be a p-channel transistor. Also in that case where one or more or each of the transistors 304, 305, and 306 is/are a p-channel transistor/p-channel transistors, the potential of each wiring is set so that ON/OFF of the transistors are the same as in the following description.

First, at time T1, the potential of the wiring TX is changed from the potential LTX to the potential HTX. Consequently, the transistor 304 is turned on. At the time T1, the wiring SE is supplied with the potential LSE, and the wiring PR is supplied with the potential LPR.

At time T2, the potential of the wiring PR is changed from the potential LPR to the potential HPR. At the time T2, the potential of the wiring TX is kept at the potential HTX, and the potential of the wiring SE is kept at the potential LSE. Consequently, a forward bias voltage is applied to the photoelectric converter 302. Accordingly, the potential HPR of the wiring PR is supplied to the node FD; thus, electric charge retained at the node FD is discharged.

Then, at time T3, the potential of the wiring PR is changed from the potential HPR to the potential LPR. Until just before the time T3, the potential of the node FD is kept at the potential HPR. Thus, when the potential of the wiring PR is changed to the potential LPR, a reverse bias voltage is applied to the photoelectric converter 302. Then, light (e.g., light reflected on an object to be detected) enters the photoelectric converter 302 being applied with the reverse bias voltage, whereby current (photocurrent) flows from the cathode to the anode of the photoelectric converter 302. The amount of photocurrent varies in accordance with the intensity of incident light. That is, as the intensity of light entering the photoelectric converter 302 gets higher, the amount of photocurrent increases and the greater electric charge is transferred between the node FD and the photoelectric converter 302; as the intensity of light entering the photoelectric converter 302 gets lower, the amount of photocurrent decreases and the less electric charge is transferred between the node FD and the photoelectric converter 302. Thus, the higher the intensity of light is, the greater the potential of the node FD changes; the lower the intensity of light is, the less the potential of the node FD changes.

At time T4, the potential of the wiring TX is changed from the potential HTX to the potential LTX, so that the transistor 304 is turned off. Consequently, electric charge is stopped transferring between the node FD and the photoelectric converter 302, so that the potential of the node FD is fixed.

At time T5, the potential of the wiring SE is changed from the potential LSE to the potential HSE, so that the transistor 306 is turned on. Consequently, electric charge is transferred between the wiring VR and the wiring OUT in accordance with the potential of the node FD.

An operation of setting the potential of the wiring OUT to a predetermined potential (precharge operation) is completed before the time T5. FIG. 9A illustrates the case where the potential of the wiring OUT is precharged to a low-level potential before the time T5 and increases from the time T5 to time T6 in accordance with the light intensity; however, one embodiment of the present invention is not limited to this case. The potential of the wiring OUT may be precharged to a high-level potential before the time T5 and decrease from the time T5 to the time T6 in accordance with the light intensity.

The precharge operation can be conducted in the following manner, for example: the wiring OUT and a wiring supplied with a predetermined potential are electrically connected to each other through a switching element such as a transistor and the transistor is turned on. After the precharge operation is completed, the transistor is turned off.

Then, at the time T6, the potential of the wiring SE is changed from the potential HSE to the potential LSE, so that electric charge is stopped transferring from the wiring VR to the wiring OUT, whereby the potential of the wiring OUT is fixed. This potential of the wiring OUT corresponds to the potential of the output signal of the photosensor 301. The potential of the output signal includes data on the object to be detected.

In this method, when the potential of the wiring TX is changed at the time T1 and the time T4, the potential of the node FD is changed by parasitic capacitance between the wiring TX and the node FD. If such a change of the potential is large, the output signal cannot be correctly output. In order to suppress the change of the potential of the node FD at the time of changing the potential of the wiring TX, it is effective to reduce the capacitance between the gate and source or between the gate and drain of the transistor 304. Further, it is effective to increase the gate capacitance of the transistor 305. Still further, it is effective to electrically connect a capacitor to the node FD. Such a change in the potential of the node FD at the time of changing the potential of the wiring TX is considered negligible in FIG. 9A, for example, by taking appropriate measures.

Described above is the driving method of the photosensor 301 having the configuration shown in FIGS. 2A and 2B, FIG. 3, and FIG. 5A.

(Driving Method 2 of Photosensor)

Figure 9B:
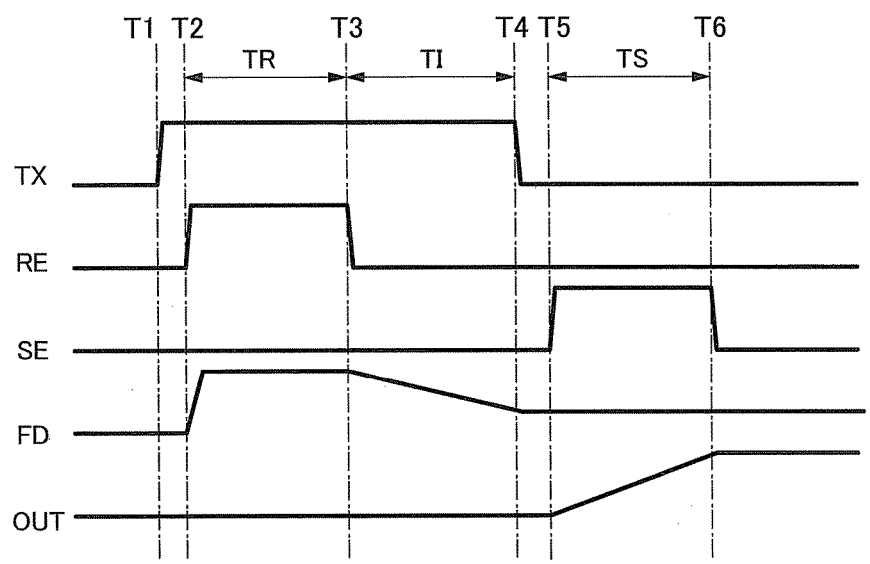

Next, a driving method of the photosensor 301 having any of the configurations shown in FIGS. 5B and 5C is described. FIG. 9B is an example of a timing chart illustrating changes in potentials of each wiring (the wiring TX, the wiring RE, the wiring SE, the wiring OUT) and the node FD illustrated in FIGS. 5B and 5C. A photodiode is used as the photoelectric converter 302, as an example, in this embodiment.

In the timing chart of FIG. 9B, for easy understanding of the operation of the photosensor 301, it is assumed that either a high-level potential or a low-level potential is supplied to the wiring TX, the wiring RE, and the wiring SE. Specifically, it is assumed that the wiring TX is supplied with a high-level potential HTX and a low-level potential LTX; the wiring SE is supplied with a high-level potential HSE and a low-level potential LSE; and the wiring RE is supplied with a high-level potential HRE and a low-level potential LRE. The wiring PR is supplied with a predetermined potential, for example, a low-level power supply potential VSS.

Although description is made assuming that the transistors 304, 305, 306, and 307 are n-channel transistors, one embodiment of the present invention is not limited thereto; one or more of the transistors 304, 305, 306, and 307 may be a p-channel transistor. Also in that case where one or more or each of the transistors 304, 305, 306, and 307 is/are a p-channel transistor/p-channel transistors, the potential of each wiring is set so that ON/OFF of the transistors are the same as in the following description.

First, at time T1, the potential of the wiring TX is changed from the potential LTX to the potential HTX. Consequently, the transistor 304 is turned on. At the time T1, the wiring SE is supplied with the potential LSE, and the wiring RE is supplied with the potential LRE.

Next, at time T2, the potential of the wiring RE is changed from the potential LRE to the potential HRE. Consequently, the transistor 307 is turned on. At the time T2, the potential of the wiring TX is kept at the potential HTX, and the potential of the wiring SE is kept at the potential LSE. Consequently, the power supply potential VDD is supplied to the node FD, whereby electric charge retained at the node FD is reset. In addition, a reverse bias voltage is applied to the photoelectric converter 302.

Then, at time T3, the potential of the wiring RE is changed from the potential HRE to the potential LRE. Until just before the time T3, the potential of the node FD is kept at the power supply potential VDD. Thus, even after the potential of the wiring RE is changed to the potential LRE, the reverse bias voltage is kept to be applied to the photoelectric converter 302. Then, light enters the photoelectric converter 302 being applied with the reverse bias voltage, whereby photocurrent flows from the cathode to the anode of the photoelectric converter 302. The amount of photocurrent varies in accordance with the intensity of incident light. That is, as the intensity of light entering the photoelectric converter 302 gets higher, the amount of photocurrent increases and the greater electric charge is transferred between the node FD and the photoelectric converter 302; as the intensity of light entering the photoelectric converter 302 gets lower, the amount of photocurrent decreases and the less electric charge is transferred between the node FD and the photoelectric converter 302. Thus, the higher the intensity of light is, the greater the potential of the node FD changes; the lower the intensity of light is, the less the potential of the node FD changes.

Next, at time T4, the potential of the wiring TX is changed from the potential HTX to the potential LTX, so that the transistor 304 is turned off. Consequently, electric charge is stopped transferring between the node FD and the photoelectric converter 302, so that the potential of the node FD is fixed.

Then, at time T5, the potential of the wiring SE is changed from the potential LSE to the potential HSE, so that the transistor 306 is turned on. Consequently, electric charge is transferred between the wiring VR and the wiring OUT in accordance with the potential of the node FD.

An operation of setting the potential of the wiring OUT to a predetermined potential (precharge operation) is completed before the time T5. FIG. 9B illustrates the case where the potential of the wiring OUT is precharged to a low-level potential before the time T5 and increases from the time T5 to time T6 in accordance with the light intensity; however, one embodiment of the present invention is not limited to this case. The potential of the wiring OUT may be precharged to a high-level potential before the time T5 and decrease from the time T5 to the time T6 in accordance with the light intensity.

The precharge operation can be conducted in the following manner, for example: the wiring OUT and a wiring supplied with a predetermined potential are electrically connected to each other through a switching element such as a transistor and the transistor is turned on. After the precharge operation is completed, the transistor is turned off.

Then, at the time T6, the potential of the wiring SE is changed from the potential HSE to the potential LSE, so that electric charge is stopped transferring from the wiring VR to the wiring OUT, whereby the potential of the wiring OUT is fixed. This potential of the wiring OUT corresponds to the potential of the output signal of the photosensor 301. The potential of the output signal includes data on an object to be detected.

In this method, when the potential of the wiring TX is changed at the time T1 and the time T4, the potential of the node FD is changed by parasitic capacitance between the wiring TX and the node FD. If such a change of the potential is large, the output signal cannot be correctly output. In order to suppress the change of the potential of the node FD at the time of changing the potential of the wiring TX, it is effective to reduce the capacitance between the gate and source or between the gate and drain of the transistor 304. Further, it is effective to increase the gate capacitance of the transistor 305. Still further, it is effective to electrically connect a capacitor to the node FD. Such a change in the potential of the node FD at the time of changing the potential of the wiring TX is considered negligible in FIG. 9B, for example, by taking appropriate measures.

Described above is the driving method of the photosensor 301 having any of the configurations shown in FIGS. 5B and 5C.

The series of operations of the photosensor 301 illustrated in any of the timing charts of FIGS. 9A and 9B is roughly classified into a reset operation, a storage operation, and a selection operation. In other words, the operation from the time T2 to the time T3 corresponds to the reset operation; the operation from the time T3 to the time T4 corresponds to the storage operation; and the operation from the time T5 to the time T6 corresponds to the selection operation. Further, a period after the storage operation before the selection operation, that is, a period from the time T4 to the time T5 corresponds to a charge retention period in which electric charge is retained at the node FD. In this specification, a period during which the reset operation is performed is denoted by TR, a period during which the storage operation is performed is denoted by TI, and a period during which the selection operation is performed is denoted by TS.

The above is the description of the driving method of the photosensor 301.

(Driving Method of Display Element Including Light-Emitting Element)

Examples of a driving method of a display element including a light-emitting element are described.

(Driving Method 1 of Display Element Including Light-Emitting Element)

Figure 14A:
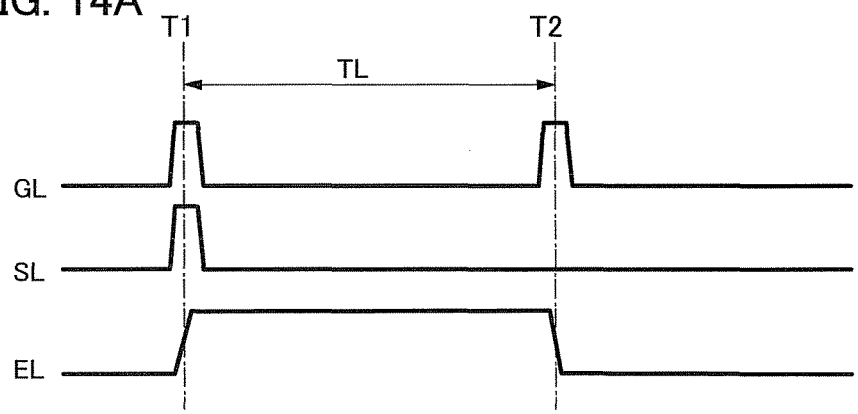
FIGS. 14A and 14B are timing charts each for describing an operation of a display element including a light-emitting element.

A driving method of the display element 101 of any of the configurations shown in FIGS. 2A and 2B, FIG. 3, and FIGS. 4A and 4B is described. FIG. 14A is an example of a timing chart of changing of the potential of each wiring (the wiring GL, the wiring SL) and the voltage (EL) applied between the pair of electrodes of the light-emitting element 102 shown in FIGS. 2A and 2B, FIG. 3, and FIGS. 4A and 4B.

In the timing chart of FIG. 14A, for easy understanding of the operation of the display element 101, it is assumed that either a high-level potential or a low-level potential is supplied to the wiring GL and the wiring SL. Respective predetermined potentials are supplied to the wiring VR and the wiring VB. The potential difference between the potential supplied to the wiring VR and the potential supplied to the wiring VB is set as large as the light-emitting element 102 emits light at a voltage of the potential difference applied between the electrodes of the light-emitting element 102. For example, a high-level power supply potential VDD and a low-level power supply potential VSS may be supplied to the wiring VR and, the wiring VB, respectively.

Although description is made assuming that the transistors 201 and 202 both are n-channel transistors, one embodiment of the present invention is not limited thereto; one or both of the transistors 201 and 202 may be a p-channel transistor. Also in that case where one or each of the transistors 201 and 202 is a p-channel transistor, the potential of each wiring is set so that ON/OFF of the transistors are the same as in the following description.

At time T1, the potential of the wiring GL is set to high, so that the transistor 201 is turned on. At that time, with the potential of the wiring SL set to high, the transistor 202 is also turned on. Consequently, the potential of the wiring VR is input to one of the electrodes of the light-emitting element 102 through the transistor 202. In this manner, a predetermined voltage is applied between the electrodes of the light-emitting element 102, so that the light-emitting element 102 emits light. Even after the time T1, the potential of the gate of the transistor 202 is kept by the capacitor 203, the parasitic capacitance, or the like, whereby the light-emitting element 102 keeps emitting light even after the potential of the wiring GL is set to low to turn off the transistor 201.

Then, at time T2, the potential of the wiring GL is set to high again, so that the transistor 201 is turned on. At that time, with the potential of the wiring SL set to low, the transistor 202 is turned off. Thus, the light-emitting element 102 can be made not to emit light.

The period during which the light-emitting element 102 emits light is denoted by TL.

(Driving Method 2 of Display Element Including Light-Emitting Element)

Figure 14B:
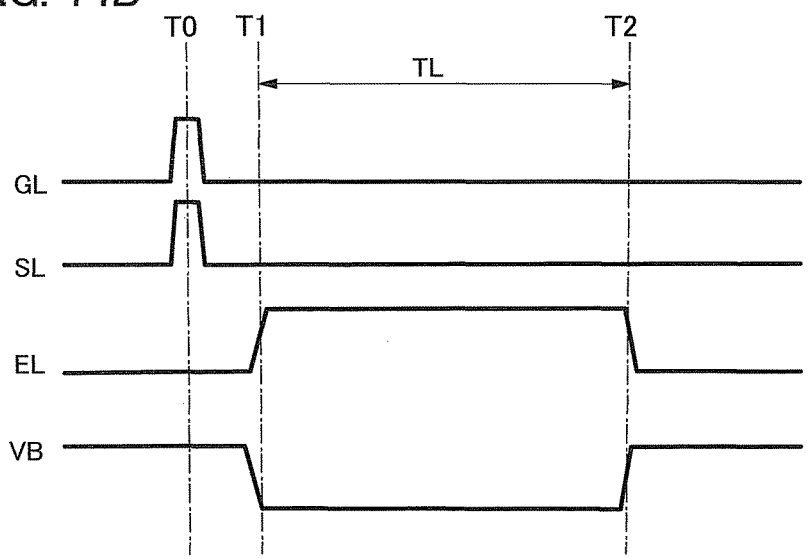

Next, another example of the driving method of the display element 101 of any of the configurations shown in FIGS. 2A and 2B, FIG. 3, and FIGS. 4A and 4B, which is different from the above-described driving method is described. FIG. 14B is an example of a timing chart of changing of the potential of each wiring (the wiring GL, the wiring SL, the wiring VB) and the voltage (EL) applied between the pair of electrodes of the light-emitting element 102 shown in FIGS. 2A and 2B, FIG. 3, and FIGS. 4A and 4B.

In the timing chart of FIG. 14B, for easy understanding of the operation of the display element 101, it is assumed that either a high-level potential or a low-level potential is supplied to the wiring GL, the wiring SL, and the wiring VB. A predetermined potential is supplied to the wiring VR. For example, a high-level power supply potential VDD may be supplied to the wiring VR.

Although description is made assuming that the transistors 201 and 202 both are n-channel transistors, one embodiment of the present invention is not limited thereto; one or both of the transistors 201 and 202 may be a p-channel transistor. Also in that case where one or each of the transistors 201 and 202 is a p-channel transistor, the potential of each wiring is set so that ON/OFF of the transistors are the same as in the following description.

At time T0, the potential of the wiring GL is set to high, so that the transistor 201 is turned on. At that time, with the potential of the wiring SL set to high, the transistor 202 is also turned on. Consequently, the potential of the wiring VR is input to one of the electrodes of the light-emitting element 102 through the transistor 202. However, since the potential of the wiring VB is substantially equal to the potential of the wiring VR, the light-emitting element 102 does not emit light.

At time T1, the potential of the wiring VB is changed (from a high-level to a low-level in the timing chart shown in FIG. 14B), so that a voltage as high as the light-emitting element 102 is made to emit light is applied between the electrodes of the light-emitting element 102. In this manner, the light-emitting element 102 emits light.

At time T2, the potential of the wiring VB is changed (from the low-level to the high-level in the timing chart shown in FIG. 14B), so that the potential of the wiring VB is substantially equal to the potential of the wiring VR. In this manner, the light-emitting element 102 can be made not to emit light.

The period during which the light-emitting element 102 emits light is denoted by TL.

(Driving Method 3 of Display Element Including Light-Emitting Element)

Figure 15A:
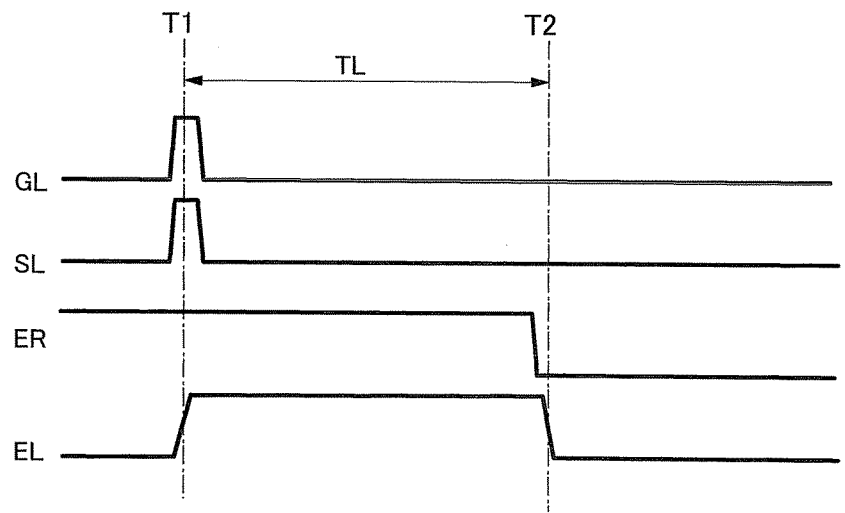
FIGS. 15A and 15B are timing charts each for describing an operation of a display element including a light-emitting element.

Next, an example of a driving method of the display element 101 of the configuration shown in FIG. 4D is described. FIG. 15A is an example of a timing chart of changing of the potential of each wiring (the wiring GL, the wiring SL, the wiring ER) and the voltage (EL) applied between the pair of electrodes of the light-emitting element 102 shown in FIG. 4D.

In the timing chart of FIG. 15A, for easy understanding of the operation of the display element 101, it is assumed that either a high-level potential or a low-level potential is supplied to the wiring GL, the wiring SL, and the wiring ER. Respective predetermined potentials are supplied to the wiring VR and the wiring VB. The potential difference between the potential supplied to the wiring VR and the potential supplied to the wiring VB is set as large as the light-emitting element 102 emits light at a voltage of the potential difference applied between the electrodes of the light-emitting element 102. For example, a high-level power supply potential VDD and a low-level power supply potential VSS may be supplied to the wiring VR and the wiring VB, respectively.

Although description is made assuming that the transistors 201, 202, and 205 are n-channel transistors, one embodiment of the present invention is not limited thereto; one or more of the transistors 201, 202, and 205 may be a p-channel transistor. Also in that case where one or more or each of the transistors 201, 202, and 205 is/are a p-channel transistor/p-channel transistors, the potential of each wiring is set so that ON/OFF of the transistors are the same as in the following description.

At time T1, the potential of the wiring GL is set to high, so that the transistor 201 is turned on. At that time, with the potential of the wiring SL set to high, the transistor 202 is also turned on. Further at that time, the potential of the wiring ER is set to high to turn on the transistor 205. Consequently, the potential of the wiring VR is input to one of the electrodes of the light-emitting element 102 through the transistors 202 and 205. In this manner, a predetermined voltage is applied between the electrodes of the light-emitting element 102, so that the light-emitting element 102 emits light. Even after the time T1, the potential of the gate of the transistor 202 is kept by the capacitor 203, the parasitic capacitance, or the like, whereby the light-emitting element 102 keeps emitting light even after the potential of the wiring GL is set to low to turn off the transistor 201.

Then, at time T2, the potential of the wiring ER is set to low, so that the transistor 205 is turned off. Thus, the light-emitting element 102 can be made not to emit light.

The period during which the light-emitting element 102 emits light is denoted by TL.

(Driving Method 4 of Display Element Including Light-Emitting Element)

Figure 15B:
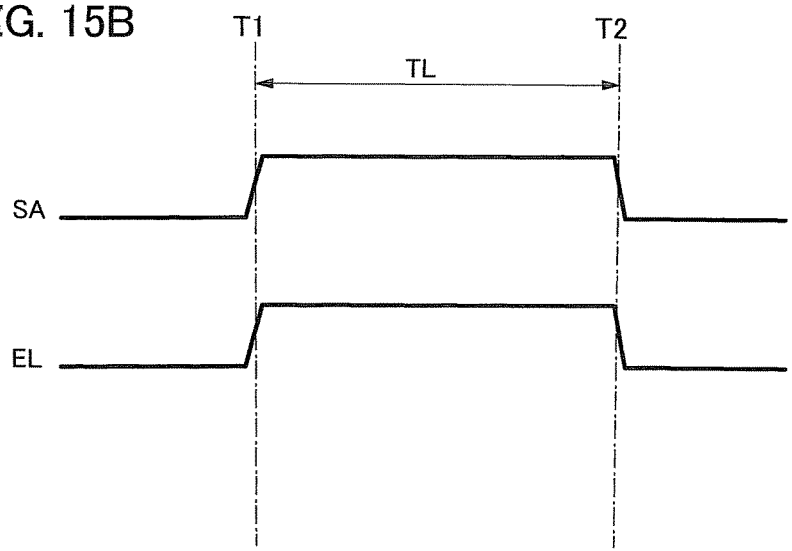

Next, an example of a driving method of the display element 101 of the configuration shown in FIG. 4C is described. FIG. 15B is an example of a timing chart of changing of the potential of the wiring (the wiring SA) and the voltage (EL) applied between the pair of electrodes of the light-emitting element 102 shown in FIG. 4C.

In the timing chart of FIG. 15B, for easy understanding of the operation of the display element 101, it is assumed that either a high-level potential or a low-level potential is supplied to the wiring SA. Respective predetermined potentials are supplied to the wiring VR and the wiring VB. The potential difference between the potential supplied to the wiring VR and the potential supplied to the wiring VB is set as large as the light-emitting element 102 emits light at a voltage of the potential difference applied between the electrodes of the light-emitting element 102. For example, a high-level power supply potential VDD and a low-level power supply potential VSS may be supplied to the wiring VR and the wiring VB, respectively.

Although description is made assuming that the transistors 201, 202, and 204 are n-channel transistors, one embodiment of the present invention is not limited thereto; one or more of the transistors 201, 202, and 204 may be a p-channel transistor. Also in that case where one or more or each of the transistors 201, 202, and 204 is/are a p-channel transistor/p-channel transistors, the potential of each wiring is set so that ON/OFF of the transistors are the same as in the following description.

The display element 101 of the configuration shown in FIG. 4C can be driven by Driving Method 1 of Display Element including Light-Emitting Element or Driving Method 2 of Display Element including Light-Emitting Element described above when the transistor 204 is OFF. In addition, the light-emitting element 102 can be made to emit light regardless of the states (ON/OFF) of the transistors 201 and 202 by setting the potential of the wiring SA to be high to turn on the transistor 204. The light-emitting element 102 keeps emitting light during which the transistor 204 is ON.

The period during which the light-emitting element 102 emits light is denoted by TL.

Described above is the driving method of the display element including the light-emitting element. Next, a driving method of the set including the photosensor and the display element including the light-emitting element is described.

(Driving Method of Sets Including Photosensors and Display Elements Including Light-Emitting Elements)

A reset operation and a storage operation are performed in the photosensor 301 during a period in which the light-emitting element 102 emits light with a predetermined luminance. That is, the period TR and the period TI are provided in the above-described period TL. In this manner, an object to be detected is irradiated with light emitted from the light-emitting element 102, and then light is reflected by the object and detected by the photosensor 301. During the period of the reset operation, the light-emitting element 102 may emit light with any luminance or does not necessarily emit light.

(Driving Method of Semiconductor Device Including Matrix of Sets Including Photosensors and Display Elements including Light-Emitting Elements)

The plurality of light-emitting elements 102 arranged in a matrix is made to emit light simultaneously or sequentially with the same luminance to irradiate an object to be detected. Further, the reset operation and the storage operation are performed simultaneously or sequentially in the plurality of photosensors 301 arranged in a matrix. In this driving method, the reset operation and the storage operation are performed in the photosensor during a period in which at least the light-emitting element 102 next to that photosensor emits light. For example, in one set including the light-emitting element 102 and the photosensor 301, the reset operation and the storage operation are performed in the photosensor 301 during a period in which the light-emitting element 102 in that set emits light. In this manner, a captured image of the object is generated and a position of the object is detected. The period of the storage operation can be made to equal to each other in the plurality of photosensors 301.

The following driving method can be applied thereto, according to which noise of external light is reduced.

The light-emitting elements 102 in one or more of the rows are made to emit light to irradiate an object to be detected with light, during which the reset operation and the storage operation are performed in the photosensors 301 in one row (or one column), and then, the light-emitting elements 102 are made not to emit light, during which the reset operation and the storage operation are performed in the photosensors 301 in another row (or another column). It is preferable that the distance between the two rows (or two columns) be as close as possible. For example, one row and another row may be adjacent to each other; or one column and another column may be adjacent to each other. According to this method, fast change between light emission and non light emission of the light-emitting elements means that the object less moves between the time of light emission and the time of non light emission. After that, the selection operation is sequentially performed in the photosensors 301 in all the rows. Thus, a difference of an output signal obtained by the photosensor 301 between one row (or column) and another row (or column) is obtained. This difference is a signal component whose S/N ratio is improved with noise of external light cancelled. A captured image of the object is generated with the difference. In this manner, a captured image can be generated with higher accuracy.

Hereinafter, specific examples of the driving method of a semiconductor device such that noise of external light is reduced are described. In the semiconductor device, the plurality of sets 110 each of the photosensor 301 and the display element 101 including the light-emitting element 102 are arranged in a matrix of m (m is a natural number greater than or equal to 2) rows by n (n is a natural number greater than or equal to 2) columns. The photosensor 301 includes the photoelectric converter 302 and the amplifier 303 which is electrically connected to the photoelectric converter 302. The display element 101 including the light-emitting element 102 includes the controller 103 which is electrically connected to the light-emitting element 102. The amplifier and the controller are electrically connected to the same power supply line per set. Timing charts of FIGS. 10A and 10B, 11A and 11B, 12A and 12B, and 13A and 13B are used for the description.

In FIGS. 10A and 10B, 11A and 11B, 12A and 12B, and 13A and 13B, (p, q) denotes the set 110 in the p-th (p is a natural number less than or equal to m) row in the q-th (q is a natural number less than or equal to n) column in the plurality of sets 110 arranged in the matrix of m rows by n columns. In FIGS. 10A and 10B, 11A and 11B, 12A and 12B, and 13A and 13B, seven adjacent sets ((p, q), (p+1, q), (p+2, q), (p+3, q), (p, q+1), (p, q+2), (p, q+3)) are shown as a representative. In addition, the horizontal axis indicates time. As described above using FIGS. 9A and 9B, 14A and 14B, and 15A and 15B, the period TL is a period during which the light-emitting element 102 emits light, the period TR is a period during which the photosensor 301 performs the reset operation, the period TI is a period during which the photosensor 301 performs the storage operation, and the period TS is a period during which the photosensor 301 performs the selection operation.

When a captured image of an object to be detected is generated or a position of the object is detected, the luminance of the light-emitting elements 102 is uniform. On the other hand, when an image is displayed in the semiconductor device, the luminance of the light-emitting element 102 is adjusted in accordance with an image signal. A known driving method can be employed as a driving method for displaying an image in the display device 101, and thus description thereof is omitted.

(Driving Method 1)

Figure 10A:
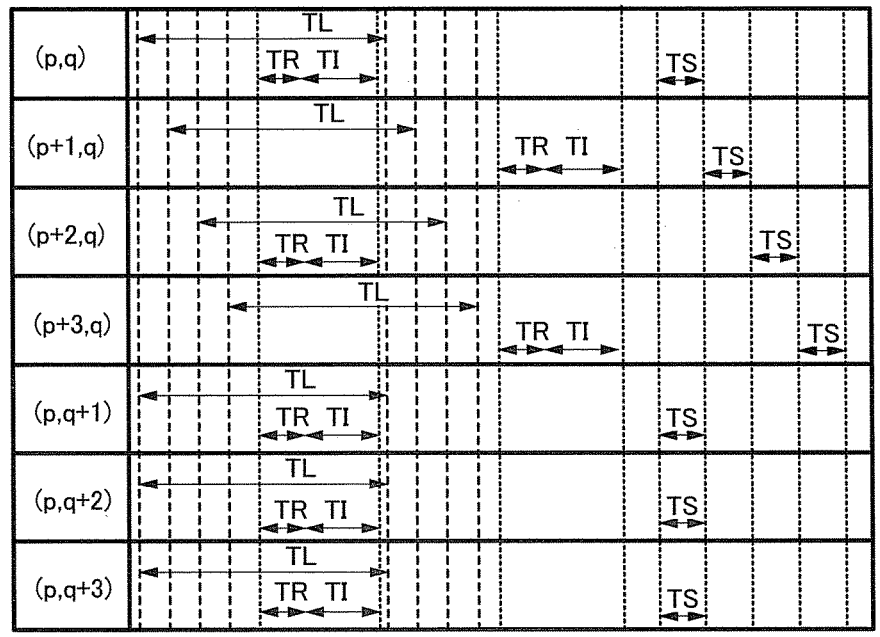
FIGS. 10A and 10B are timing charts each for describing an operation of a set including a photosensor and a display element including a light-emitting element.

A driving method illustrated in the timing chart of FIG. 10A is used. In that case, any of the driving method illustrated in FIGS. 14A, 14B, 15A, and 15B can be used as the driving method of the light-emitting element 102, and any of the driving method illustrated in FIGS. 9A and 9B can be used as the driving method of the photosensor 301.

The light-emitting elements 102 are made to emit light sequentially row-by-row. During the period in which the light-emitting elements 102 emit light, the reset operation and the storage operation are performed simultaneously in the photosensors in the p-th row and (p+2)-th row. After that, with the light-emitting elements 102 made not to emit light, the reset operation and the storage operation are performed simultaneously in the photosensors in the (p+1)-th row and (p+3)-th row. Then, the selection operation is performed by the photosensors 301 in all the rows sequentially row-by-row. Then, a difference between output signals obtained by the photosensors in adjacent rows is obtained. Using this difference, a captured image of an object to be detected is generated and a position of the object is detected.

The light-emitting elements 102 in the (p+1)-th row and (p+3)-th row are not necessarily made to emit light in the period during which the reset operation and the storage operation are performed simultaneously in the photosensors in the p-th row and (p+2)-th row in the driving method illustrated in FIG. 10A.

Although the light-emitting elements 102 are made to emit light sequentially row-by-row in the driving method illustrated in the timing chart of FIG. 10A, the light-emitting elements 102 in all the rows may be simultaneously made to emit light. For example, a driving method illustrated in the timing chart of FIG. 10B can be used. In that case, any of the driving method illustrated in FIGS. 14B and 15B can be used as the driving method of the light-emitting element 102, and any of the driving method illustrated in FIGS. 9A and 9B can be used as the driving method of the photosensor 301.

The light-emitting elements 102 in all the rows are made to emit light all at once. During the period in which the light-emitting elements 102 emit light, the reset operation and the storage operation are performed simultaneously in the photosensors in the p-th row and (p+2)-th row. After that, with the light-emitting elements 102 made not to emit light, the reset operation and the storage operation are performed simultaneously in the photosensors in the (p+1)-th row and (p+3)-th row. Then, the selection operation is performed by the photosensors 301 in all the rows sequentially row-by-row. Thus, a difference between output signals obtained by the photosensors in adjacent rows is obtained. Using this difference, a captured image of an object to be detected is generated and a position of the object is detected.

Figure 10B:
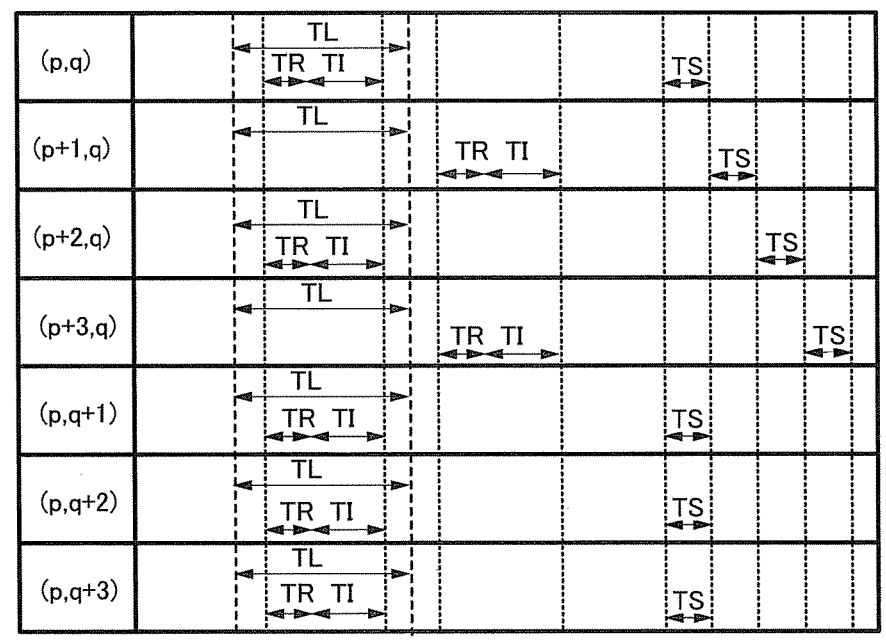

The light-emitting elements 102 in the (p+1)-th row and (p+3)-th row are not necessarily made to emit light in the period during which the reset operation and the storage operation are performed simultaneously in the photosensors in the p-th row and (p+2)-th row in the driving method illustrated in FIG. 10B.

Although the reset operation and the storage operation are performed simultaneously in the photosensors in the p-th row and (p+2)-th row and the reset operation and the storage operation are performed simultaneously in the photosensors in the (p+1)-th row and (p+3)-th row in each of the driving methods illustrated in the timing charts of FIGS. 10A and 10B, one embodiment of the present invention is not limited thereto. The reset operation and the storage operation may be performed sequentially in order of row in the photosensors in the p-th row and (p+2)-th row, and the reset operation and the storage operation may be performed sequentially in order of row in the photosensors in the (p+1)-th row and (p+3)-th row. For example, a driving method illustrated in the timing chart of FIG. 11A can be used. In that case, any of the driving method illustrated in FIGS. 14A and 14B, and 15A and 15B can be used as the driving method of the light-emitting element 102, and any of the driving method illustrated in FIGS. 9A and 9B can be used as the driving method of the photosensor 301.

The light-emitting elements 102 are made to emit light sequentially row-by-row. During the period in which the light-emitting elements 102 emit light, the reset operation and the storage operation are performed sequentially in order of row in the photosensors in the p-th row and (p+2)-th row. After that, with the light-emitting elements 102 made not to emit light, the reset operation and the storage operation are performed sequentially in order of row in the photosensors in the (p+1)-th row and (p+3)-th row. Then, the selection operation is performed by the photosensors 301 in all the rows sequentially row-by-row. Thus, a difference between output signals obtained by the photosensors in adjacent rows is obtained. Using this difference, a captured image of an object to be detected is generated and a position of the object is detected.

Figure 11A:
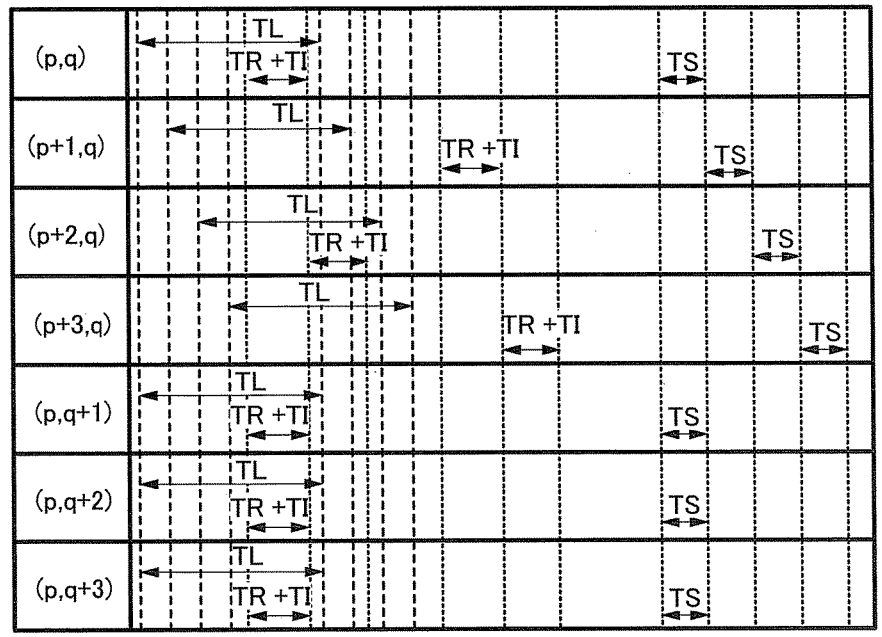
FIGS. 11A and 11B are timing charts each for describing an operation of a set including a photosensor and a display element including a light-emitting element.

The light-emitting elements 102 in the (p+1)-th row and (p+3)-th row are not necessarily made to emit light in the period during which the reset operation and the storage operation are performed sequentially in order of row in the photosensors in the p-th row and (p+2)-th row in the driving method illustrated in FIG. 11A.

In the driving method illustrated in FIG. 11A, the light-emitting elements 102 in all the rows may be simultaneously made to emit light as is in the driving method illustrated in FIG. 10B. A timing chart of such a driving method is FIG. 11B. In that case, any of the driving method illustrated in FIGS. 14B and 15B can be used as the driving method of the light-emitting element 102, and any of the driving method illustrated in FIGS. 9A and 9B can be used as the driving method of the photosensor 301.

The light-emitting elements 102 in all the rows are made to emit light all at once. During the period in which the light-emitting elements 102 emit light, the reset operation and the storage operation are performed sequentially in order of row in the photosensors in the p-th row and (p+2)-th row. After that, with the light-emitting elements 102 made not to emit light, the reset operation and the storage operation are performed sequentially in order of row in the photosensors in the (p+1)-throw and (p+3)-th row. Then, the selection operation is performed by the photosensors 301 in all the rows sequentially row-by-row. Thus, a difference between output signals obtained by the photosensors in adjacent rows is obtained. Using this difference, a captured image of an object to be detected is generated and a position of the object is detected.

Figure 11B:
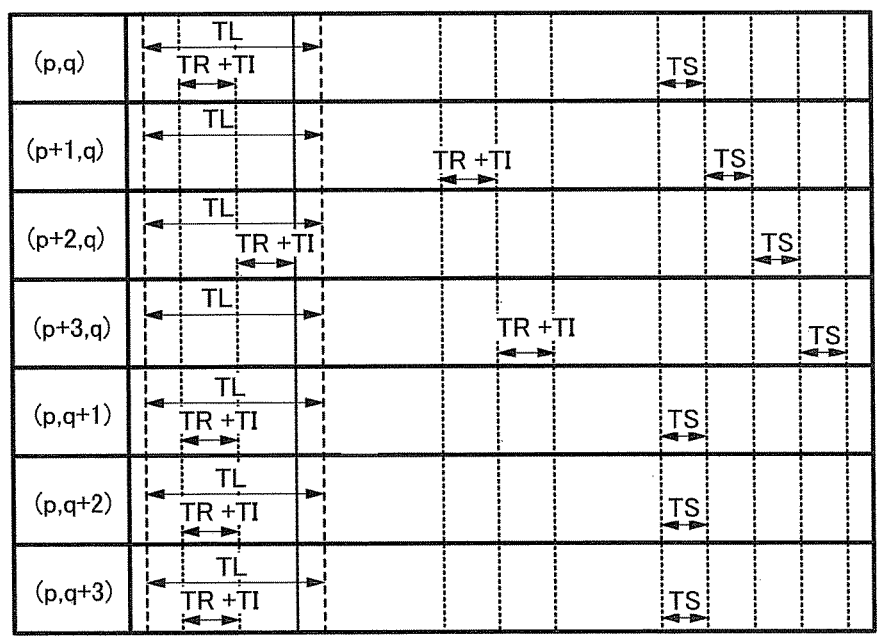

The light-emitting elements 102 in the (p+1)-th row and (p+3)-th row are not necessarily made to emit light in the period during which the reset operation and the storage operation are performed sequentially in order of row in the photosensors in the p-th row and (p+2)-th row in the driving method illustrated in FIG. 11B.

In the driving methods illustrated in FIGS. 10A and 10B and 11A and 11B, the order of the timing of making the light-emitting elements to emit light and the timing of making the light-emitting elements not to emit light may be reversed.

(Driving Method 2)

According to Driving Method 1 described above, the light-emitting elements are made to emit light to irradiate an object, during which the reset operation and the storage operation are performed in the photosensors in the p-th row, and then, the light-emitting elements are made not to emit light, during which the reset operation and the storage operation are performed in the photosensors in the (p+1)-th row. Alternatively, Driving Method 2 described below may be employed: an object is irradiated with light while the light-emitting elements are made to emit light, during which the reset operation and the storage operation are performed in the photosensors in the q-th column (q is a natural number less than or equal to n), and then, the light-emitting elements are made not to emit light, during which the reset operation and the storage operation are performed in the photosensors in the (q+1)-th column.

Figure 12A:
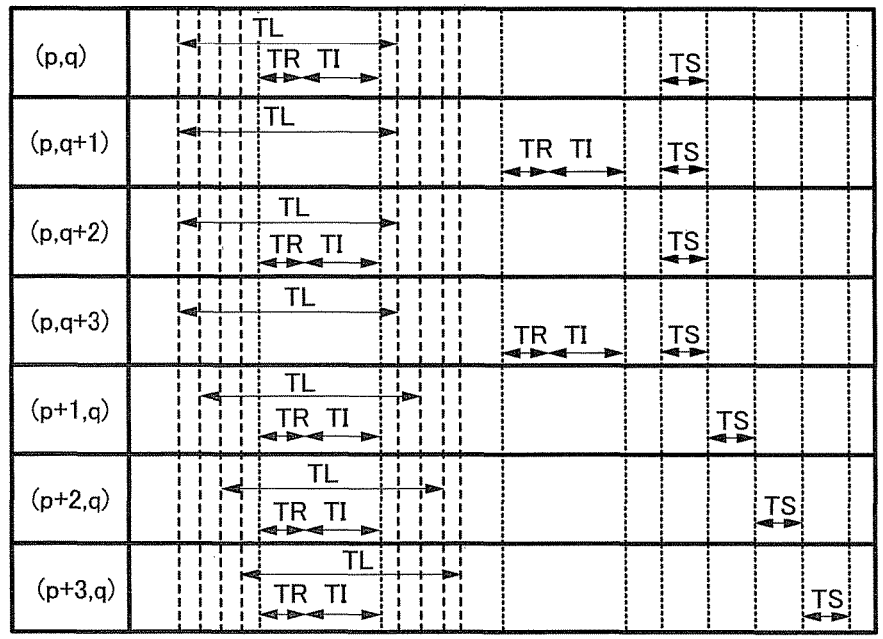
FIGS. 12A and 12B are timing charts each for describing an operation of a set including a photosensor and a display element including a light-emitting element.

A driving method illustrated in the timing chart of FIG. 12A is used. In that case, any of the driving method illustrated in FIGS. 14A and 14B and 15A and 15B can be used as the driving method of the light-emitting element 102, and any of the driving method illustrated in FIGS. 9A and 9B can be used as the driving method of the photosensor 301.

The light-emitting elements 102 are made to emit light sequentially row-by-row. During the period in which the light-emitting elements 102 emit light, the reset operation and the storage operation are performed simultaneously in the photosensors in the q-th column and (q+2)-th column. After that, with the light-emitting elements 102 made not to emit light, the reset operation and the storage operation are performed simultaneously in the photosensors in the (q+1)-th column and (q+3)-th column. Then, the selection operation is performed by the photosensors 301 in all the rows sequentially row-by-row. Thus, a difference between output signals obtained by the photosensors in adjacent columns is obtained. Using this difference, a captured image of an object to be detected is generated and a position of the object is detected.

Although the light-emitting elements 102 are made to emit light sequentially row-by-row in the driving method illustrated in the timing chart of FIG. 12A, the light-emitting elements 102 in all the rows may be simultaneously made to emit light. For example, a driving method illustrated in the timing chart of FIG. 12B can be used. In that case, any of the driving method illustrated in FIGS. 14B and 15B can be used as the driving method of the light-emitting element 102, and any of the driving method illustrated in FIGS. 9A and 9B can be used as the driving method of the photosensor 301.

The light-emitting elements 102 in all the rows are made to emit light all at once. During the period in which the light-emitting elements 102 emit light, the reset operation and the storage operation are performed simultaneously in the photosensors in the q-th column and (q+2)-th column. After that, with the light-emitting elements 102 made not to emit light, the reset operation and the storage operation are performed simultaneously in the photosensors in the (q+1)-th column and (q+3)-th column. Then, the selection operation is performed by the photosensors 301 in all the rows sequentially row-by-row. Thus, a difference between output signals obtained by the photosensors in adjacent columns is obtained. Using this difference, a captured image of an object to be detected is generated and a position of the object is detected.

Figure 12B:
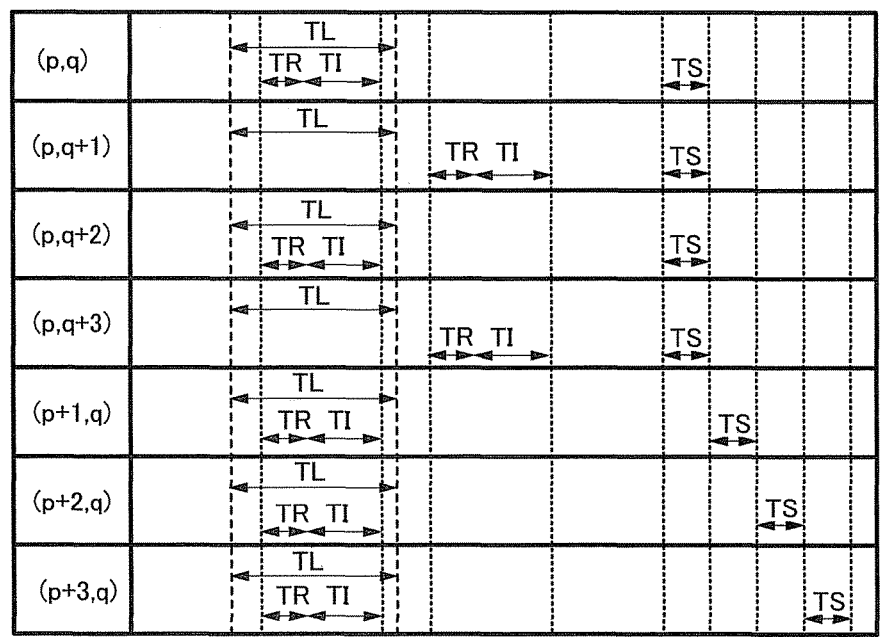

Although the reset operation and the storage operation are performed simultaneously in the photosensors in the q-th column and (q+2)-th column and the reset operation and the storage operation are performed simultaneously in the photosensors in the (q+1)-th column and (q+3)-th column in each of the driving methods illustrated in the timing charts of FIGS. 12A and 12B, one embodiment of the present invention is not limited thereto. The reset operation and the storage operation may be performed sequentially in order of column in the photosensors in the q-th column and (q+2)-th column, and the reset operation and the storage operation may be performed sequentially in order of column in the photosensors in the (q+1)-th column and (q+3)-th column. For example, a driving method illustrated in the timing chart of FIG. 13A can be used. In that case, any of the driving method illustrated in FIGS. 14A and 14B and 15A and 15B can be used as the driving method of the light-emitting element 102, and any of the driving method illustrated in FIGS. 9A and 9B can be used as the driving method of the photosensor 301.

The light-emitting elements 102 are made to emit light sequentially row-by-row. During the period in which the light-emitting elements 102 emit light, the reset operation and the storage operation are performed sequentially in order of column in the photosensors in the q-th column and (q+2)-th column. After that, with the light-emitting elements 102 made not to emit light, the reset operation and the storage operation are performed sequentially in order of column in the photosensors in the (q+1)-th column and (q+3)-th column. Then, the selection operation is performed by the photosensors 301 in all the rows sequentially row-by-row. Thus, a difference between output signals obtained by the photosensors in adjacent columns is obtained. Using this difference, a captured image of an object to be detected is generated and a position of the object is detected.

In the driving method illustrated in FIG. 13A, the light-emitting elements 102 in all the rows may be simultaneously made to emit light as is in the driving method illustrated in FIG. 12B. A timing chart of such a driving method is FIG. 13B. In that case, any of the driving method illustrated in FIGS. 14B and 15B can be used as the driving method of the light-emitting element 102, and any of the driving method illustrated in FIGS. 9A and 9B can be used as the driving method of the photosensor 301.

The light-emitting elements 102 in all the rows are made to emit light all at once. During the period in which the light-emitting elements 102 emit light, the reset operation and the storage operation are performed sequentially in order of column in the photosensors in the q-th column and (q+2)-th column. After that, with the light-emitting elements 102 made not to emit light, the reset operation and the storage operation are performed sequentially in order of column in the photosensors in the (q+1)-th column and (q+3)-th column. Then, the selection operation is performed by the photosensors 301 in all the rows sequentially row-by-row. Thus, a difference between output signals obtained by the photosensors in adjacent columns is obtained. Using this difference, a captured image of an object to be detected is generated and a position of the object is detected.

In the driving methods illustrated in FIGS. 12A and 12B and 13A and 13B, the order of the timing of making the light-emitting elements to emit light and the timing of making the light-emitting elements not to emit light may be reversed.

According to Driving Method 1 and Driving Method 2, the length of the interval from the reset and storage operations to the selection operation of the photosensor 301 differs depending on the row and/or column. However, a transistor in which a channel is formed in an oxide semiconductor layer can be used as a transistor included in the amplifier 303, whereby noise caused by leakage due to off-state current of a transistor can be reduced. In this manner, a signal component whose S/N ratio is improved with noise cancelled can be obtained with accuracy.

This embodiment can be combined as appropriate with any other embodiment.

Example 1

In this example, the field-effect mobility of a transistor applicable to the semiconductor device described in the above-described embodiment is described.

The actually measured field-effect mobility of an insulated gate transistor is lower than its inherent mobility because of a variety of reasons, which occurs not only in the case of using an oxide semiconductor. One of causes for reduction in the mobility is a defect inside a semiconductor or a defect at an interface between the semiconductor and an insulating film. With a Levinson model, the field-effect mobility on the assumption that no defect exists inside the semiconductor can be calculated theoretically. In this example, the field-effect mobility of an ideal oxide semiconductor without a defect inside the semiconductor was calculated theoretically, and calculation results of characteristics of minute transistors that were manufactured using such an oxide semiconductor are shown.

Assuming a potential barrier (such as a grain boundary) exists in a semiconductor, the measured field-effect mobility of the semiconductor, denoted by $\mu$ can be expressed by the following formula where the inherent mobility of the semiconductor is $\mu_0$.

$$\mu = \mu_0 \exp\left(-\frac{E}{kT}\right) \quad \text{[Formula 2]}$$

In the formula, E denotes the height of the potential barrier, k denotes the Boltzmann constant, and T denotes the absolute temperature. Further, on the assumption that the potential barrier is attributed to a defect, the height of the potential barrier can be expressed by the following formula according to the Levinson model.

$$E = \frac{e^2 N^2}{8\varepsilon n} = \frac{e^3 N^2 t}{8\varepsilon} C_{ox} V_g \quad \text{[Formula 3]}$$

In the formula, e denotes the elementary charge, N denotes the average defect density per unit area in a channel, $\varepsilon$ denotes the permittivity of the semiconductor, n denotes the number of carriers per unit area in the channel, $C_{ox}$ denotes the capacitance per unit area, $V_g$ denotes the gate voltage, and t denotes the thickness of the channel. In the case where the thickness of the semiconductor layer is less than or equal to 30 nm, the thickness of the channel can be regarded as being the same as the thickness of the semiconductor layer. The drain current $I_d$ in a linear region of the semiconductor layer can be expressed by the following formula.

$$I_d = \frac{W \mu V_g V_d C_{ox}}{L} \exp\left(-\frac{E}{kT}\right) \quad \text{[Formula 4]}$$

In the formula, L denotes the channel length and W denotes the channel width, and L and W are each 10 μm in this example. In addition, $V_d$ denotes the drain voltage. Both sides of the above formula is divided by $V_g$ and then logarithms of both the sides are taken, resulting in the following formula.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \quad \text{[Formula 5]}$$

In Formula 5, a logarithm of $V_g$ is expressed in the right side. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is about $1 \times 10^{12}/\text{cm}^2$.

On the basis of the defect density obtained in this manner, or the like, $\mu_0$ results in 120 cm²/Vs from Formula 2 and Formula 3. The measured mobility of an In—Sn—Zn oxide including a defect is about 40 cm²/Vs. However, assuming that no defect exists inside an oxide semiconductor and at the interface between the oxide semiconductor and an insulating layer, the mobility $\mu_0$ of the oxide semiconductor is estimated to be 120 cm²/Vs.

However, even when no defect exists inside the semiconductor, scattering at an interface between a channel and a gate insulating layer affects the transport property of the transistor. In other words, the mobility $\mu_1$ at a position that is a distance x away from the interface between the channel and the gate insulating layer is expressed by the following formula.

$$\frac{1}{\mu_1} = \frac{1}{\mu_0} + \frac{D}{B}\exp\left(-\frac{x}{G}\right) \quad \text{[Formula 6]}$$

In the formula, D denotes the electric field in the gate direction, and B and G are constants. The values of B and G can be obtained from actual measurement results; according to the above measurement results, B is 4.75×10$^7$ cm/s and G is 10 nm (the depth to which the influence of interface scattering reaches). As D increases (i.e., when the gate voltage is increased), the second term of Formula 6 is increased and accordingly the mobility $\mu_1$ is decreased.

Figure 19:
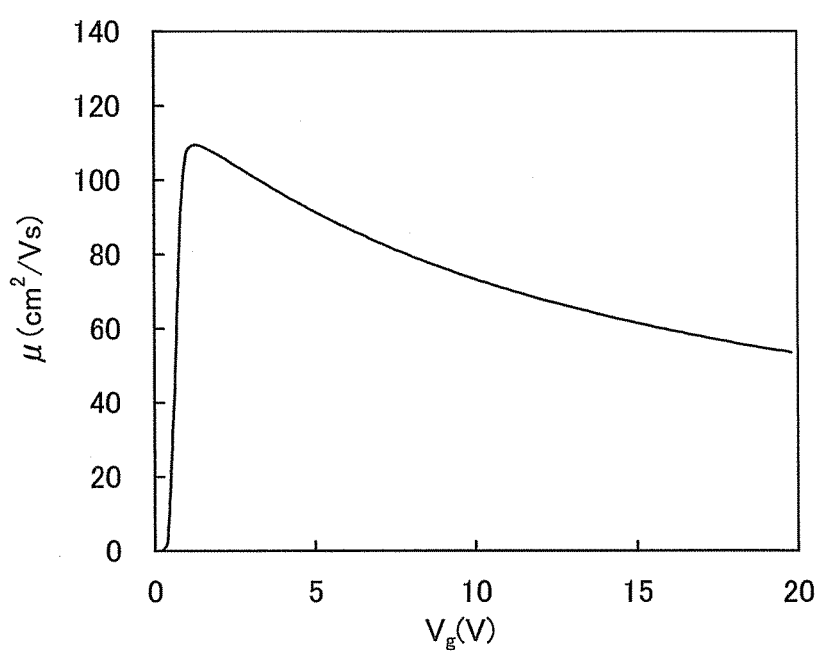
FIG. 19 is a graph showing the gate voltage dependency of mobility according to calculation results.

Calculation results of the mobility $\mu_2$ of a transistor whose channel is formed in an ideal oxide semiconductor without a defect inside the semiconductor are shown in FIG. 19. For the calculation, device simulation software Sentaurus Device manufactured by Synopsys, Inc. was used, and the bandgap, the electron affinity, the relative permittivity, and the thickness of the oxide semiconductor were set to 2.8 eV, 4.7 eV, 15, and 15 nm, respectively according to measurement of a thin film of an oxide semiconductor that was formed by a sputtering method.

Further, the work functions of a gate, a source, and a drain of the transistor were set to 5.5 eV, 4.6 eV, and 4.6 eV, respectively. The thickness of a gate insulating layer of the transistor was set to 100 nm, and the relative permittivity thereof was set to 4.1. The channel length and the channel width were each 10 μm, and the drain voltage $V_d$ was set to 0.1 V.

As shown in FIG. 19, the mobility has a peak of more than 100 cm$^2$/Vs at a gate voltage that is a little over 1 V, and decreases as the gate voltage becomes higher because the influence of interface scattering is increased. In order to reduce interface scattering, it is desirable that a top surface of the semiconductor layer be flat at the atomic level (atomic layer flatness).

Calculation results of characteristics of minute transistors which were manufactured using an oxide semiconductor having such a mobility are shown in FIGS. 22A to 22C, FIGS. 21A to 21C, and FIGS. 22A to 22C. FIGS. 23A and 23B illustrate cross-sectional structures of the transistors used for the calculation. The transistors illustrated in FIGS. 23A and 23B each include a semiconductor region 1103a and a semiconductor region 1103c which have n$^+$-type conductivity in an oxide semiconductor layer. The resistivities of the semiconductor region 1103a and the semiconductor region 1103c are 2×10$^{-3}$ Ωcm.

The transistor illustrated in FIG. 23A is formed over a base insulating film 1101 and an embedded insulator 1102 which is embedded in the base insulating film 1101 and formed of aluminum oxide. The transistor includes the semiconductor region 1103a, the semiconductor region 1103c, an intrinsic semiconductor region 1103b serving as a channel formation region therebetween, and a gate 1105. The width of the gate 1105 is 33 nm.

A gate insulating layer 1104 is provided between the gate 1105 and the semiconductor region 1103b. In addition, a sidewall insulator 1106a and a sidewall insulator 1106b are provided on both sides of the gate 1105, and an insulator 1107 is provided over the gate 1105 so as to prevent a short circuit between the gate 1105 and another wiring. The sidewall insulator has a width of 5 nm. Further, a source 1108a and a drain 1108b are provided in contact with the semiconductor region 1103a and the semiconductor region 1103c, respectively. The channel width of the transistor is 40 nm.

The transistor illustrated in FIG. 23B is the same as the transistor in FIG. 23A in that it is formed over the base insulating film 1101 and the embedded insulator 1102 formed of aluminum oxide and that it includes the semiconductor region 1103a, the semiconductor region 1103c, the intrinsic semiconductor region 1103b provided therebetween, the gate 1105 having a width of 33 nm, the gate insulating layer 1104, the sidewall insulator 1106a, the sidewall insulator 1106b, the insulator 1107, the source 1108a, and the drain 1108b.

The transistor illustrated in FIG. 23A is different from the transistor illustrated in FIG. 23B in the conductivity type of semiconductor regions under the sidewall insulator 1106a and the sidewall insulator 1106b. In the transistor illustrated in FIG. 23A, the semiconductor regions under the sidewall insulator 1106a and the sidewall insulator 1106b are part of the semiconductor region 1103a having n$^+$-type conductivity and part of the semiconductor region 1103c having n$^+$-type conductivity, whereas in the transistor illustrated in FIG. 23B, the semiconductor regions under the sidewall insulator 1106a and the sidewall insulator 1106b are part of the intrinsic semiconductor region 1103b. In other words, in the semiconductor layer of FIG. 23B, a region having a width of $L_{off}$ where the semiconductor region 1103a (the semiconductor region 1103c) does not overlap with the gate 1105 is provided. This region is called an offset region, and the width $L_{off}$ is called an offset length. As is clear from the drawing, the offset length is equal to the width of the sidewall insulator 1106a (the sidewall insulator 1106b).

Figure 20A:
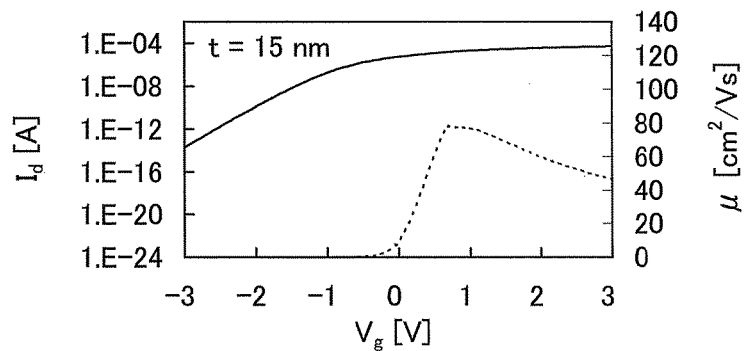
FIGS. 20A to 20C are graphs each showing the gate voltage dependency of drain current and mobility according to calculation results.
Figure 20B:
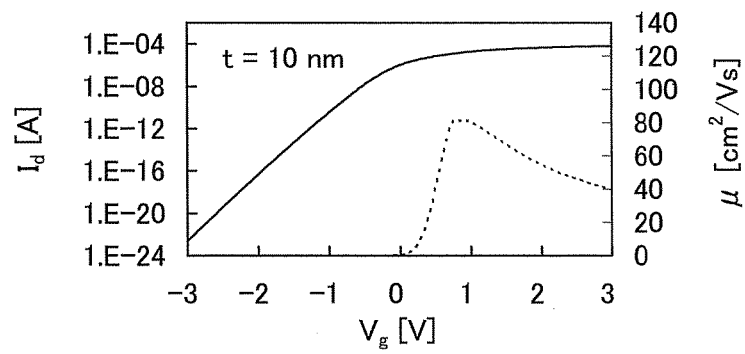
Figure 20C:
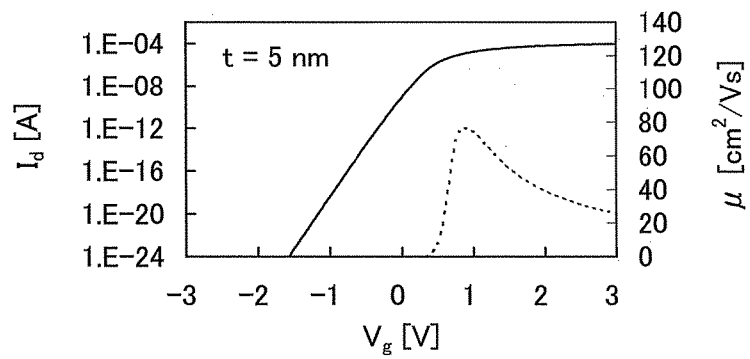

The other parameters used in calculation are as described above. For the calculation, device simulation software Sentaurus Device manufactured by Synopsys, Inc. was used. FIGS. 20A to 20C show the gate voltage ($V_g$: a potential difference between the gate and the source) dependence of the drain current ($I_d$, indicated by a solid line) and the mobility (μ, indicted by a dotted line) of the transistor having the structure illustrated in FIG. 23A. The drain current $I_d$ was calculated where the drain voltage (a potential difference between the drain and the source) was +1 V and the mobility μ was calculated where the drain voltage was +0.1 V.

The thickness of the gate insulating layer was 15 nm, 10 nm, and 5 nm in FIG. 20A, FIG. 20B, and FIG. 20C, respectively. As the gate insulating layer gets thinner, the drain current $I_d$ (off-state current) particularly in an off state is significantly decreased. In contrast, there is no noticeable change in the peak value of the mobility μ and the drain current $I_d$ (on-state current) in an on state. The graphs show that the drain current exceeds 10 μA at a gate voltage of around 1 V.

Figure 21A:
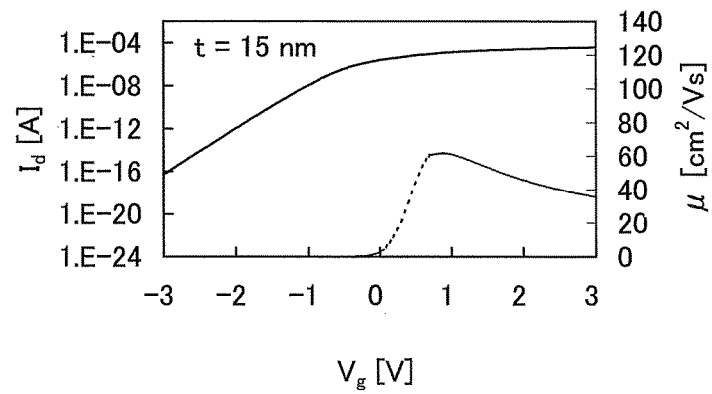
FIGS. 21A to 21C are graphs each showing the gate voltage dependency of drain current and mobility according to calculation results.
Figure 21B:
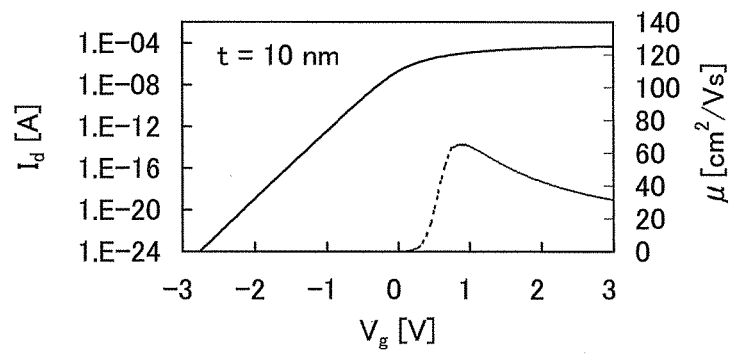
Figure 21C:
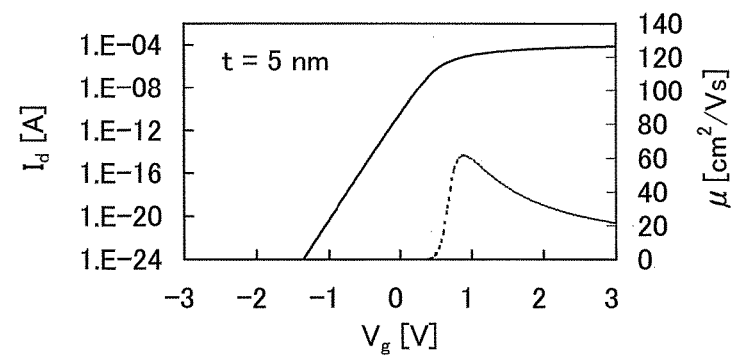

FIGS. 21A to 21C show the gate voltage $V_g$ dependence of the drain current $I_d$ (indicated by a solid line) and the mobility μ (indicated by a dotted line) of the transistor having the structure illustrated in FIG. 23B where the offset length $L_{off}$ was 5 nm. The drain current $I_d$ was calculated where the drain voltage was +1 V and the mobility μ was calculated where the drain voltage was +0.1 V. The thickness of the gate insulating layer was 15 nm, 10 nm, and 5 nm in FIG. 21A, FIG. 21B, and FIG. 21C, respectively.

Figure 22A:
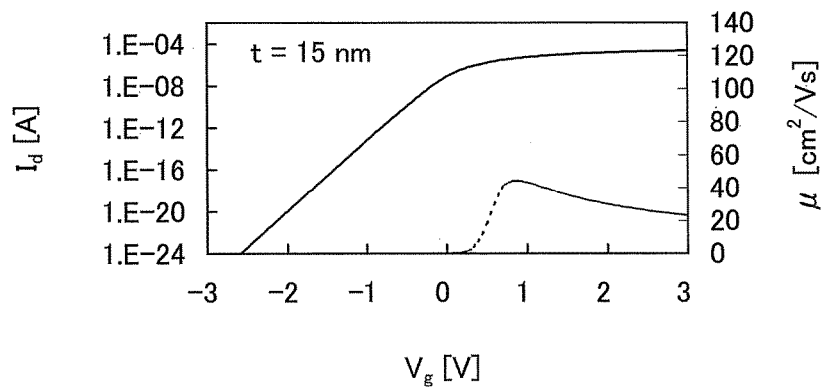
FIGS. 22A to 22C are graphs each showing the gate voltage dependency of drain current and mobility according to calculation results.
Figure 22B:
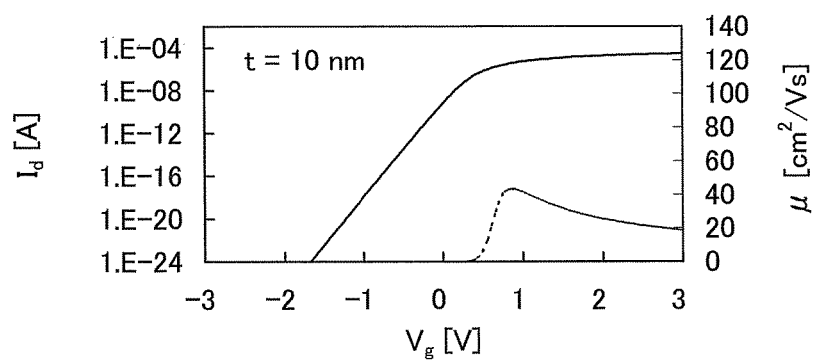
Figure 22C:
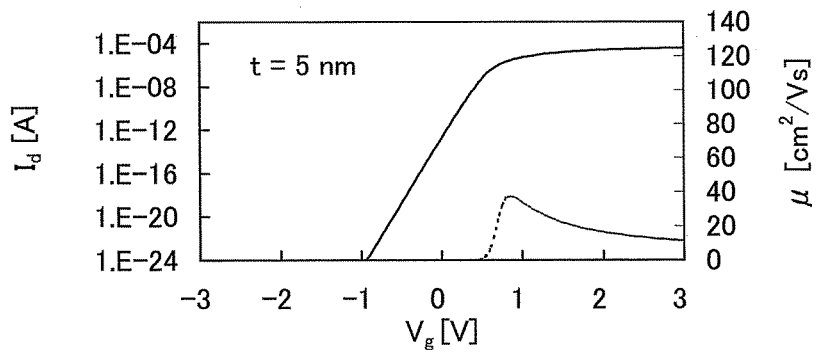
Figure 23A:
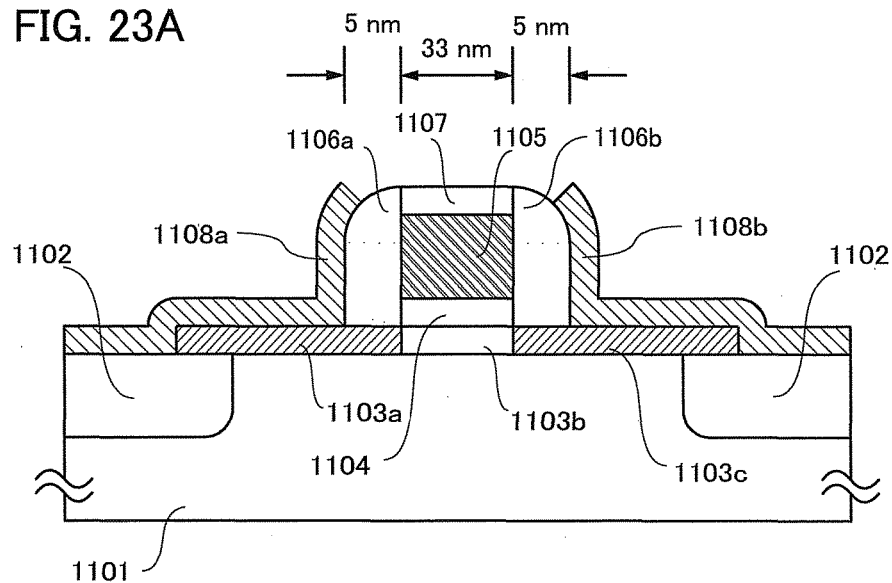
FIGS. 23A and 23B are diagrams each illustrating a cross-sectional structure of a transistor which was used in calculation.
Figure 23B:
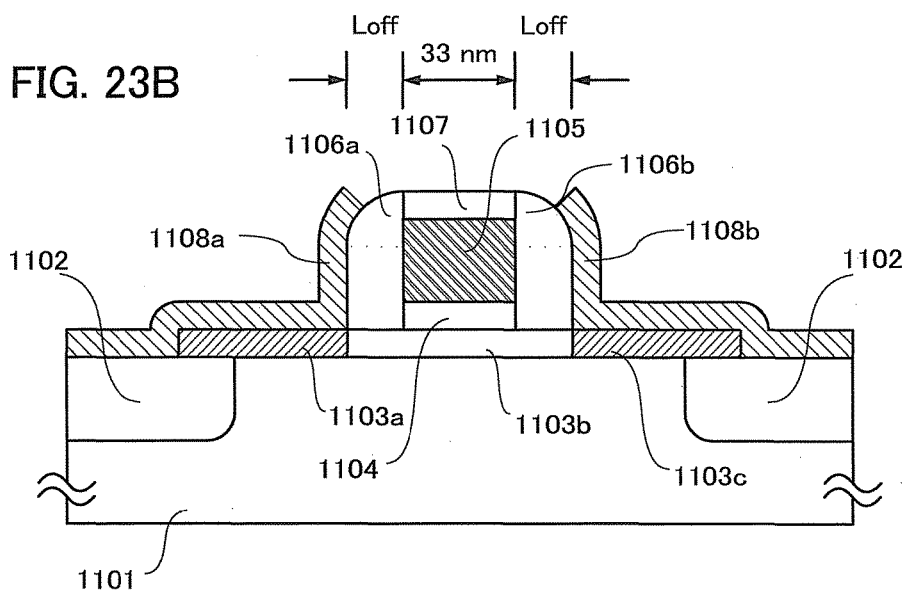

FIGS. 22A to 22C show the gate voltage $V_g$ dependence of the drain current $I_d$ (indicated by a solid line) and the mobility μ (indicated by a dotted line) of the transistor having the structure illustrated in FIG. 23B where the offset length $L_{off}$ was 15 nm. The drain current $I_d$ was calculated where the drain voltage was +1 V and the mobility μ was calculated where the drain voltage was +0.1 V. The thickness of the gate insulating layer was 15 nm, 10 nm, and 5 nm in FIG. 22A, FIG. 22B, and FIG. 22C, respectively.

In either of the structures, as the gate insulating layer gets thinner, the off-state current is significantly decreased, whereas no noticeable change occurs in the peak value of the mobility μ and the on-state current.

The peak of the mobility μ is about 80 cm$^2$/Vs in FIGS. 20A to 20C, about 60 cm$^2$/Vs in FIGS. 21A to 21C, and about 40 cm$^2$/Vs in FIGS. 22A to 22C; thus, the peak of the mobility μ decreases as the offset length $L_{off}$ is increased. The same applies to the off-state current. The on-state current also decreases as the offset length $L_{off}$ is increased; however, the decrease in the on-state current is much more gradual than the decrease in the off-state current. Further, either graph shows that the drain current exceeds 10 μA at a gate voltage of around 1 V.

A transistor in which an oxide semiconductor including In, Sn, and Zn as main components is used as a channel formation region can be provided with favorable characteristics by depositing the oxide semiconductor while heating a substrate or by performing heat treatment after an oxide semiconductor film is formed. The main component refers to an element included in composition at 5 atomic % or more.

By heating the substrate after formation of the oxide semiconductor film including In, Sn, and Zn as main components, the field-effect mobility of the transistor can be improved. Further, the threshold voltage of the transistor can be shifted in the positive direction to make the transistor a normally-off transistor.

Figure 24A:
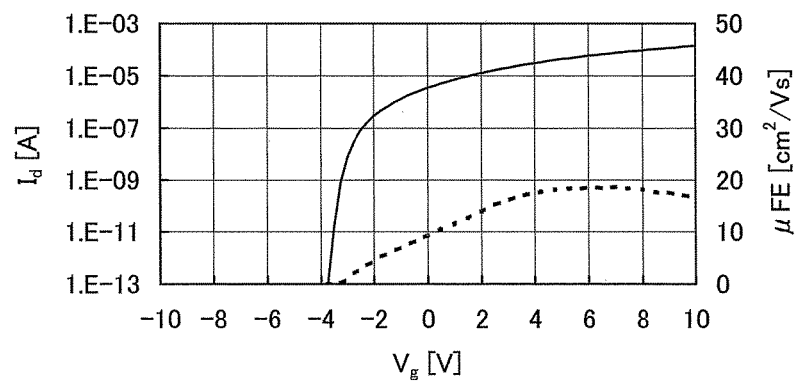
FIGS. 24A to 24C are graphs each showing characteristics of a transistor including an oxide semiconductor film.
Figure 24B:
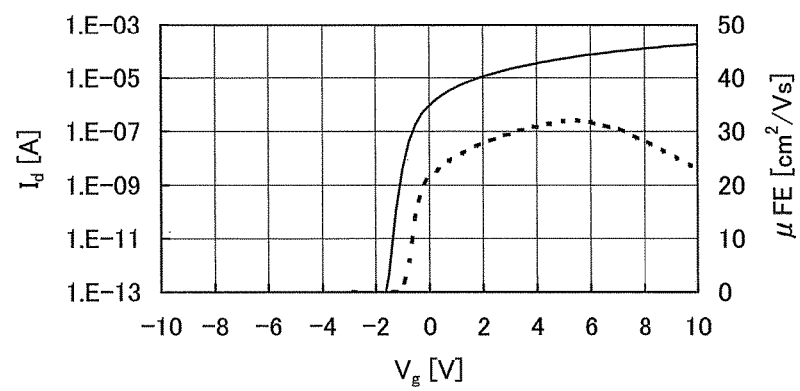
Figure 24C:
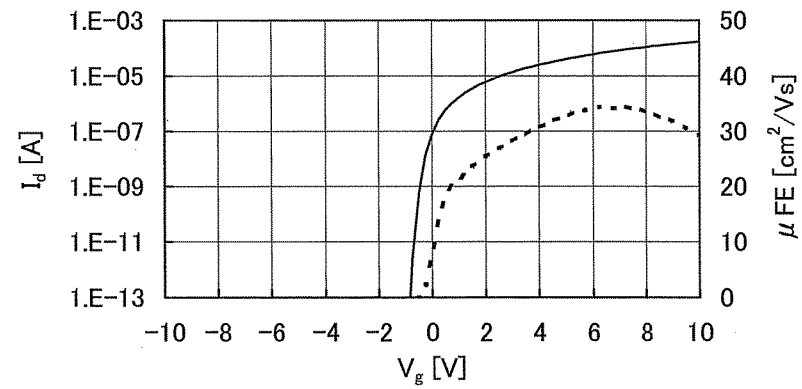

As an example, FIGS. 24A to 24C each show characteristics of a transistor that includes an oxide semiconductor film including In, Sn, and Zn as main components with a channel length L of 3 μm and a channel width W of 10 μm, and a gate insulating layer with a thickness of 100 nm. The drain voltage $V_d$ was set to 10 V.

FIG. 24A shows characteristics of a transistor whose oxide semiconductor film including In, Sn, and Zn as main components was formed by a sputtering method without heating a substrate. The field-effect mobility of the transistor was up to 18.8 cm²/Vsec. On the other hand, when the oxide semiconductor film including In, Sn, and Zn as main components is formed while heating the substrate, the field-effect mobility can be improved. FIG. 24B shows characteristics of a transistor whose oxide semiconductor film including In, Sn, and Zn as main components was formed while heating a substrate at 200° C.; the field-effect mobility of the transistor was up to 32.2 cm²/Vsec.

The field-effect mobility can be further improved by performing heat treatment after formation of the oxide semiconductor film including In, Sn, and Zn as main components. FIG. 24C shows characteristics of a transistor whose oxide semiconductor film including In, Sn, and Zn as main components was formed by sputtering at 200° C. and then subjected to heat treatment at 650° C. The field-effect mobility of the transistor was up to 34.5 cm²/Vsec.

The heating of the substrate can be expected to have an effect of reducing entrance of moisture into the oxide semiconductor film during the formation by sputtering. Further, the heat treatment after film formation enables hydrogen, a hydroxyl group, or moisture to be removed from the oxide semiconductor film, so that the field-effect mobility can be improved as described above. Such an improvement in the field-effect mobility is considered to be achieved not only by removal of impurities by dehydration or dehydrogenation but also by a reduction in the interatomic distance due to an increase in density. In addition, by removal of impurities from the oxide semiconductor, the oxide semiconductor can be crystallized with high purification. With such a highly purified non-single-crystal oxide semiconductor, ideally, a field-effect mobility over 100 cm²/Vsec can be expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be provided.

The heating of the substrate during film formation and/or the heat treatment after the film formation contribute(s) not only to improvement of the field-effect mobility but also to make the transistor a normally-off transistor. In a transistor in which an oxide semiconductor film including In, Sn, and Zn as main components and is formed without heating a substrate is used as a channel formation region, the threshold voltage tends to be shifted in the negative direction. However, when the oxide semiconductor film formed while heating the substrate is used, such a negative shift of the threshold voltage can be prevented. That is, the threshold voltage is shifted so that the transistor becomes a normally-off transistor; this tendency can be confirmed by comparison between FIGS. 24A and 24B.

The threshold voltage can also be controlled by changing the ratio of In, Sn, and Zn; a normally-off transistor is expected to be formed with a composition ratio of In:Sn:Zn of 2:1:3. In addition, the composition ratio of In:Sn:Zn=2:1:3 enables an oxide semiconductor film having high crystallinity to be formed.

The temperature of the heating of the substrate or the temperature of the heat treatment is higher than or equal to 150° C., preferably higher than or equal to 200° C., further preferably higher than or equal to 400° C. With film formation or heat treatment at a higher temperature, the transistor can be made to a normally-off transistor.

Further, by heating of the substrate during film formation and/or by heat treatment after the film formation, the stability against a gate-bias stress can be increased. For example, when a gate bias is applied with an intensity of 2 MV/cm at 150° C. for one hour, a drift of the threshold voltage can be suppressed to less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$–$I_d$ characteristics of the transistors were measured at a substrate temperature of 25° C. at $V_{ds}$ of 10 V where $V_{ds}$ is the drain voltage (the potential difference between the drain and the source) of each transistor. Next, the substrate temperature was changed to 150° C. and $V_{ds}$ was changed to 0.1 V. Then, $V_g$ of 20 V was applied so that the intensity of the electric field applied to each gate insulating layer was 2 MV/cm, and the condition was kept for one hour. Next, $V_g$ was changed to 0 V. Then, $V_g$–$I_d$ characteristics of the transistors were measured at a substrate temperature of 25° C. at $V_{ds}$ of 10 V. This process is called a positive BT test.

In a similar manner, first, $V_g$–$I_d$ characteristics of the transistors were measured at a substrate temperature of 25° C. at $V_{ds}$ of 10 V. Next, the substrate temperature was changed to 150° C. and $V_{ds}$ was changed to 0.1 V. Then, $V_g$ of −20 V was applied so that the intensity of the electric field applied to each gate insulating film was −2 MV/cm, and the condition was kept for one hour. Next, $V_g$ was changed to 0 V. Then, $V_g$–$I_d$ characteristics of the transistors were measured at a substrate temperature of 25° C. at $V_{ds}$ of 10 V. This process is called a negative BT test.

Figure 25A:
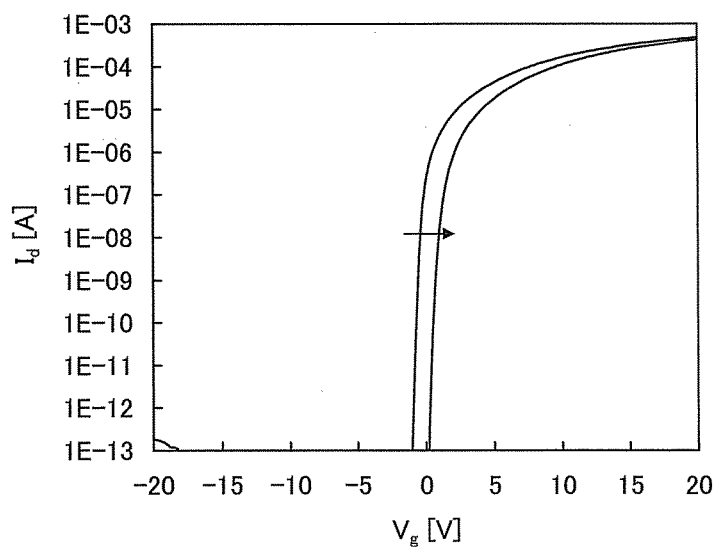
FIGS. 25A and 25B are graphs each showing $V_g$-$I_d$ characteristics of a transistor of Sample 1 before and after being subjected to a BT test.
Figure 25B:
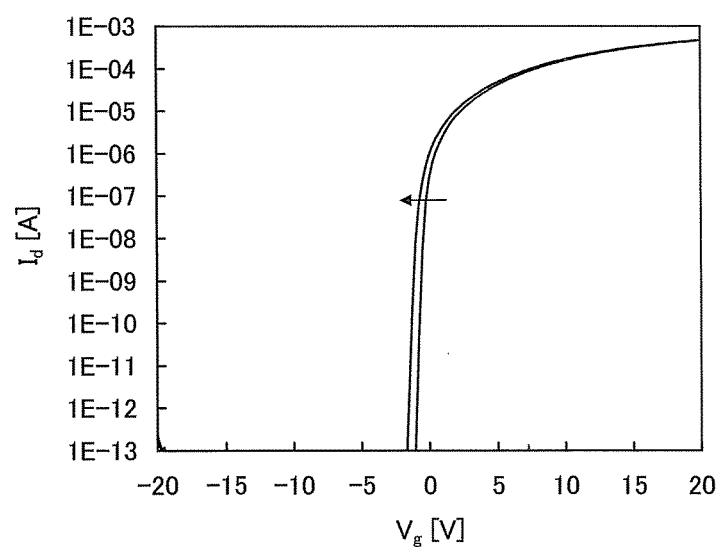
Figure 26A:
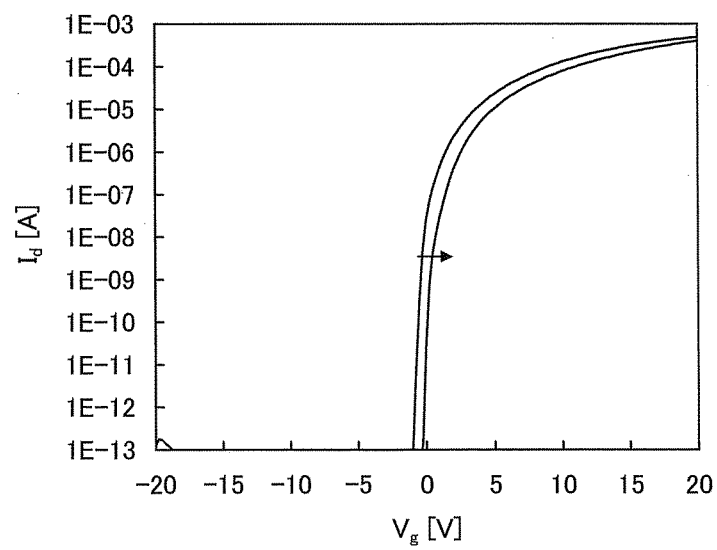
FIGS. 26A and 26B are graphs each showing $V_g$-$I_d$ characteristics of a transistor of Sample 2 before and after being subjected to a BT test.
Figure 26B:
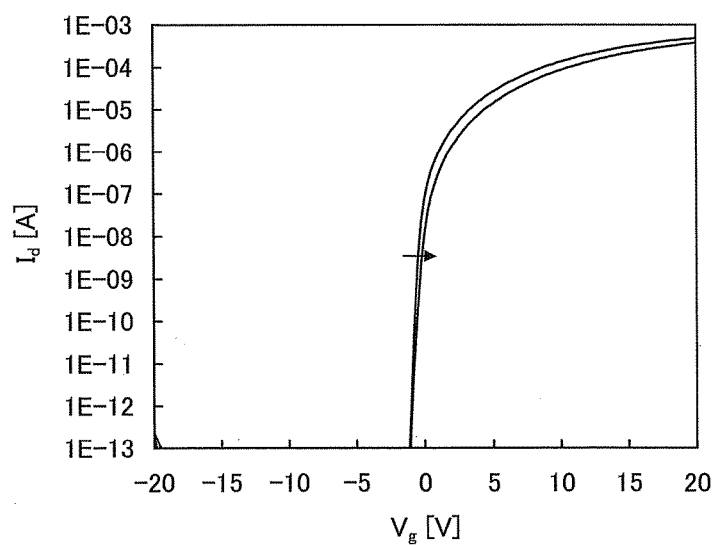

FIGS. 25A and 25B show a result of the positive BT test of Sample 1 and a result of the negative BT test of Sample 1, respectively. FIGS. 26A and 26B show a result of the positive BT test of Sample 2 and a result of the negative BT test of Sample 2, respectively.

The amount of shift in the threshold voltage of Sample 1 due to the positive BT test and that amount due to the negative BT test were 1.80 V and −0.42 V, respectively. The amount of shift in the threshold voltage of Sample 2 due to the positive BT test and that amount due to the negative BT test were 0.79 V and 0.76 V, respectively. It is found that, in each of Sample 1 and Sample 2, the amount of shift in the threshold voltage by the BT test is small and the reliability of each transistor is high.

The heat treatment can be performed in an oxygen atmosphere; the heat treatment may be performed first in an atmosphere of nitrogen or an inert gas or under reduced pressure, and then in an atmosphere including oxygen. Oxygen can be supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is likely to be caused in the oxide semiconductor or at an interface between the oxide semiconductor and a film in contact with the oxide semiconductor; however, by supplying excess oxygen into the oxide semiconductor through the heat treatment, oxygen deficiency caused later can be compensated with excess oxygen. The excess oxygen is oxygen existing mainly between lattices, which can be included in the oxide semiconductor without causing crystal distortion or the like as long as the concentration of excess oxygen is greater than or equal to $1 \times 10^{16}/cm^3$ and less than or equal to $2 \times 10^{20}/cm^3$.

Further, a more stable oxide semiconductor film can be obtained by performing heat treatment to form a crystal in at least part of the oxide semiconductor. For example, when an oxide semiconductor film which is formed by sputtering using a target having a composition ratio of In:Sn:Zn=1:1:1 without heating a substrate is analyzed by X-ray diffraction (XRD), a halo pattern is observed. That oxide semiconductor film can be crystallized by heat treatment. When heat treatment at 650° C. is performed thereon, for example, a clear diffraction peak can be observed by X-ray diffraction, though the temperature of the heat treatment can be set as appropriate.

An XRD analysis of an In—Sn—Zn—O film was conducted. The XRD analysis was conducted using an X-ray diffractometer D8 ADVANCE manufactured by Bruker AXS, in the out-of-plane direction.

Sample A and Sample B were prepared, on which the XRD analysis were performed. Methods for manufacturing Sample A and Sample B are described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. The substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed thereon for one hour and heat treatment in an oxygen atmosphere was further performed thereon for one hour without lowering the temperature. A sample manufactured in this manner was used as Sample B.

Figure 29:
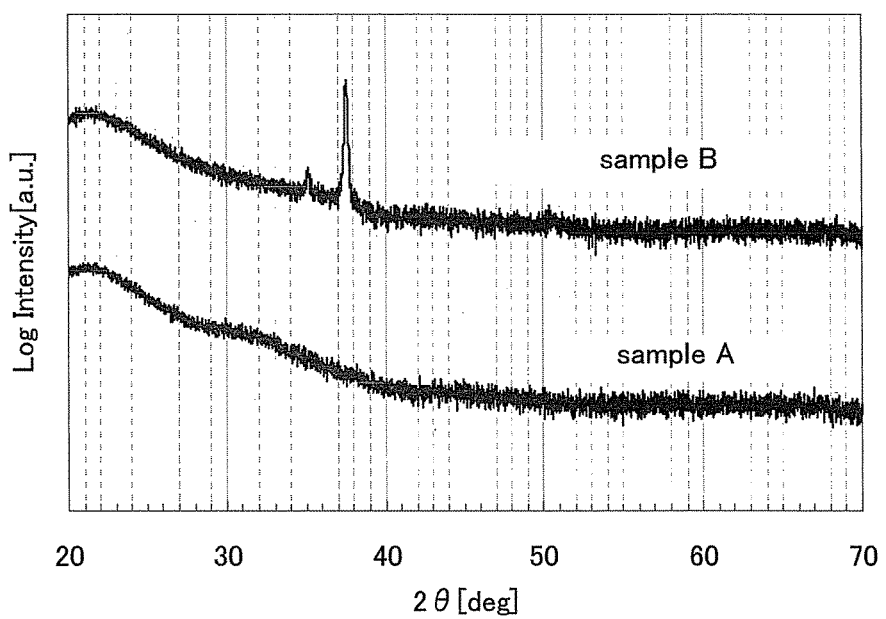
FIG. 29 is a graph showing XRD spectra of Sample A and Sample B.

FIG. 29 shows XRD spectra of Sample A and Sample B. No peak derived from a crystal was observed in Sample A, whereas peaks derived from a crystal were observed at 2θ of around 35 deg and 2θ in the range of from 37 deg to 38 deg in Sample B.

These substrate heating and heat treatment have an effect of preventing hydrogen and a hydroxyl group, which are adverse impurities for an oxide semiconductor, from being included in the film or an effect of removing them from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be reduced to 1 aA/μm or less, where the unit of the off-state current means the amount per micrometer of a channel width.

Figure 30:
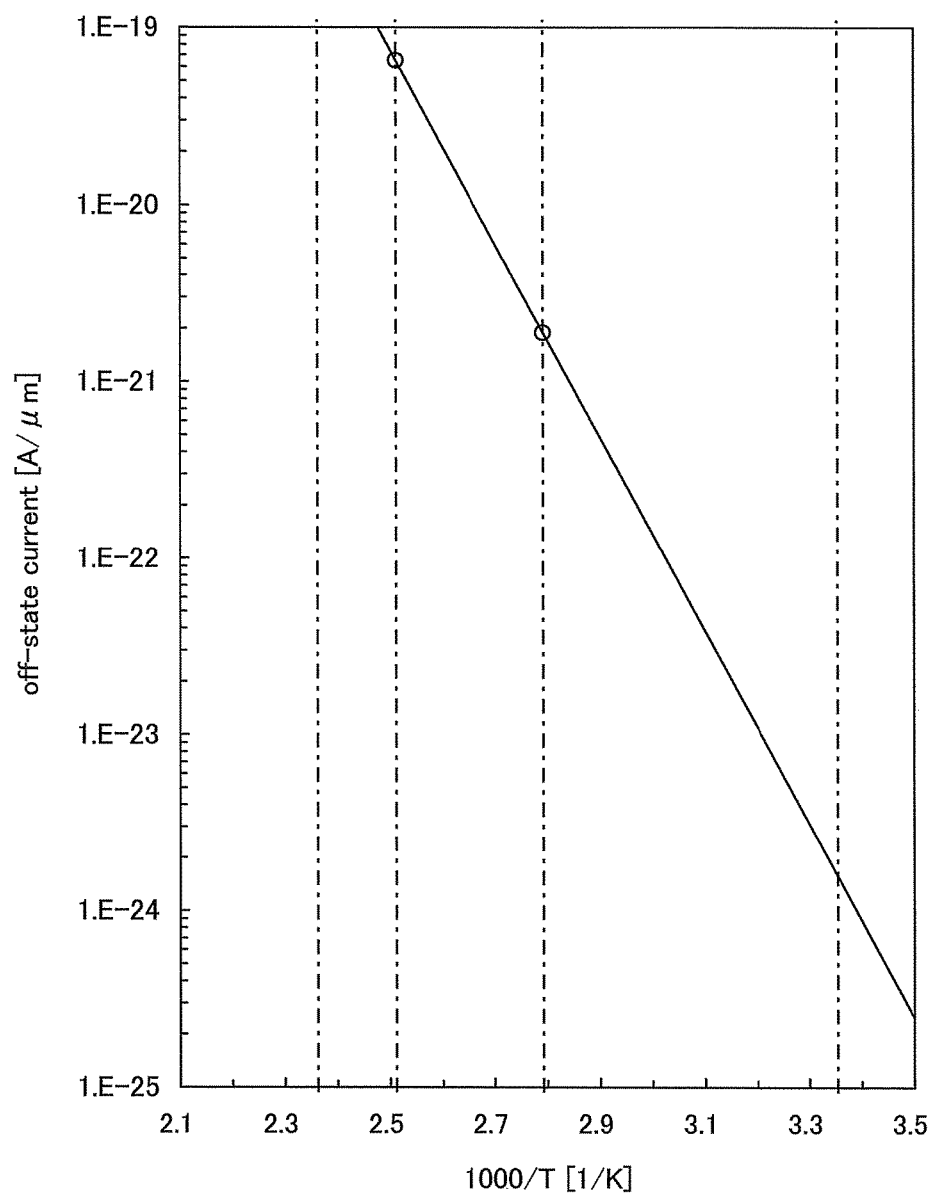
FIG. 30 is a graph of transistor off-state current vs. substrate temperature in measurement.

FIG. 30 shows a relation between the off-state current of a transistor and the inverse of substrate temperature (absolute temperature) T at measurement, where for simplicity, the horizontal axis indicates a value (1000/T) obtained by multiplying an inverse of the substrate temperature at measurement by 1000.

Specifically, as shown in FIG. 30, the off-state current can be reduced to 1 aA/μm ($1 \times 10^{-18}$ A/μm) or less, 100 zA/μm ($1 \times 10^{-19}$ A/μm) or less, and 1 zA/μm ($1 \times 10^{-21}$ A/μm) or less at substrate temperatures of 125° C., 85° C., and room temperature (27° C.), respectively. Preferably, the off-state current can be reduced to 0.1 aA/μm ($1 \times 10^{-19}$ A/μm) or less, 10 zA/μm ($1 \times 10^{-20}$ A/μm) or less, and 0.1 zA/μm ($1 \times 10^{-22}$ A/μm) or less at 125° C., 85° C., and room temperature, respectively.

Needless to say, in order to prevent hydrogen and moisture from entering the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from entering the film. In addition, it is preferable to use a target which is highly purified so as not to include impurities such as hydrogen and moisture. Although it is possible to remove moisture from a film of an oxide semiconductor including In, Sn, and Zn as main components by heat treatment, the temperature at which moisture is released from the oxide semiconductor including In, Sn, and Zn as main components is higher than the temperature at which moisture is released from an oxide semiconductor including In, Ga, and Zn as main components; therefore, a moisture-free film is preferably formed in an as-depo state.

In addition, the relation between the substrate temperature and electric characteristics of a transistor using Sample B which has been subjected to the heat treatment at 650° C. after formation of the oxide semiconductor film was evaluated.

The transistor used for the measurement has a channel length L of 3 μm, a channel width W of 10 μm, Lov of 0 μm, and dW of 0 μm. In addition, $V_{ds}$ was set to 10 V. The substrate temperature was set to −40° C., −25° C., 25° C., 75° C., 125° C., and 150° C. In the transistor, the width of a portion where a gate electrode overlaps with one of a pair of electrodes is denoted by Lov, and the width of a portion of the pair of electrodes, which does not overlap with the oxide semiconductor film, is denoted by dW.

Figure 27:
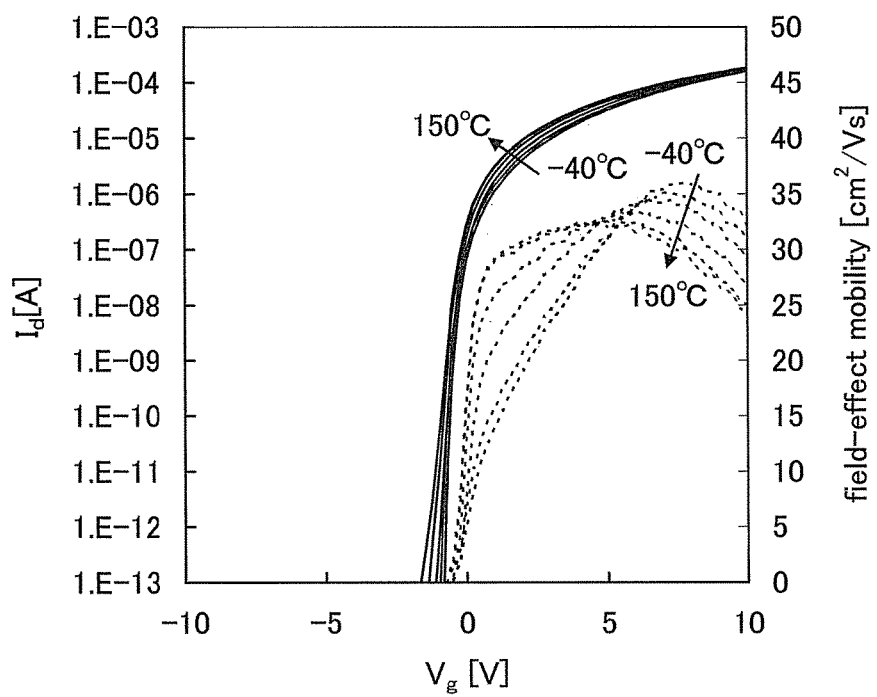
FIG. 27 is a graph showing the $V_g$ dependency of $I_d$ and field-effect mobility.

FIG. 27 shows the $V_g$ dependence of $I_d$ (indicated by a solid line) and of the field-effect mobility (indicated by a dotted line). Further, FIG. 28A shows a relation between the substrate temperature and the threshold voltage, and FIG. 28B shows a relation between the substrate temperature and the field-effect mobility.

Figure 28A:
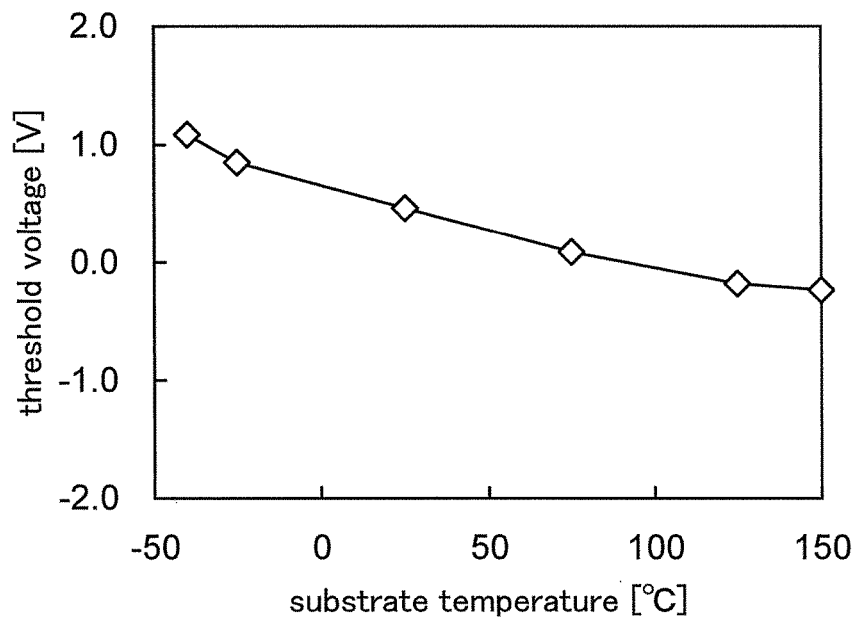
FIGS. 28A and 28B are a threshold voltage vs. substrate temperature graph and a field-effect mobility vs. substrate temperature graph, respectively.

It is seen from FIG. 28A that the threshold voltage gets lower as the substrate temperature increases. The threshold voltage is decreased from 1.09 V to −0.23 V in the range from −40° C. to 150° C.

Figure 28B:
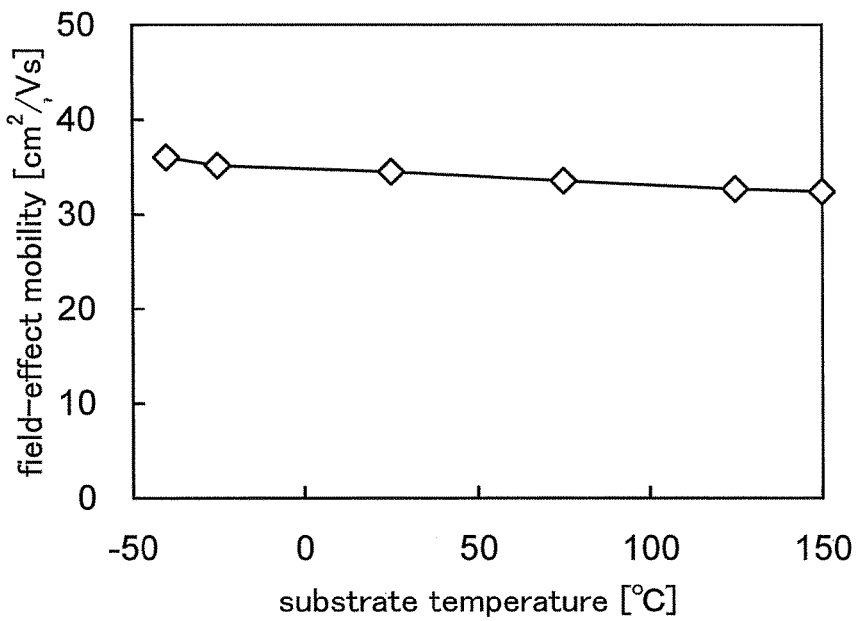

Further, it is seen from FIG. 28B that the field-effect mobility gets lower as the substrate temperature increases. The field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be exhibited with the off-state current suppressed to 1 aA/μm or less, which can provide an on-state current as high as is needed for an LSI. For example, in an FET where L/W is 33 nm/40 nm, an on-state current of 12 μA or more can flow at a gate voltage of 2.7 V at a drain voltage of 1.0 V. In addition, sufficient electric characteristics can be ensured in a temperature range needed for operation of the transistor. With such characteristics, an integrated circuit can be equipped with a novel function without decreasing the operation speed by providing a transistor including an oxide semiconductor in the integrated circuit formed using a Si semiconductor.

As described above, heating of a substrate during deposition of an oxide semiconductor including In, Sn, and Zn as main components and/or heat treatment after deposition of the oxide semiconductor leads to an improvement in characteristics of a transistor.

This example can be implemented in combination with any of the embodiments and the other examples as appropriate.

Example 2

In this example, examples of a transistor in which an In—Sn—Zn—O film is used as an oxide semiconductor film are described using FIGS. 31A and 31B and FIGS. 32A and 32B.

Figure 31A:
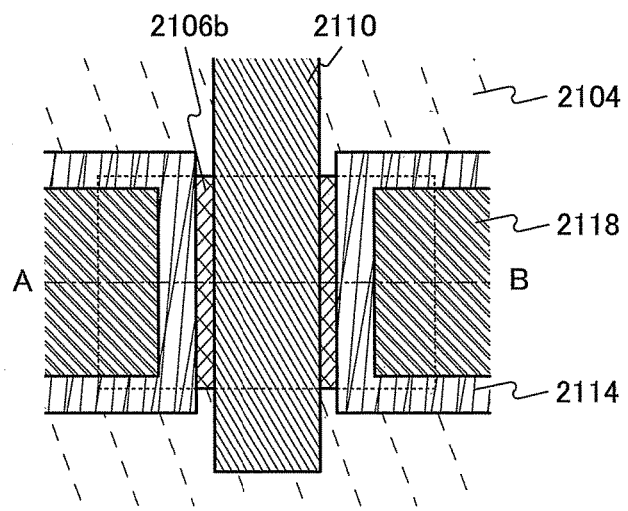
FIGS. 31A and 31B are diagrams illustrating a structure of a transistor.
Figure 31B:
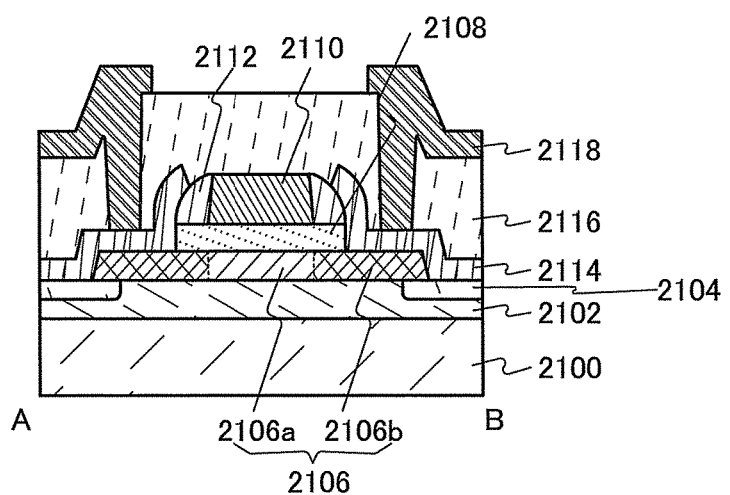

FIGS. 31A and 31B are a top view and a cross-sectional view of a coplanar transistor having a top-gate top-contact structure. FIG. 31A is the top view of the transistor. FIG. 31B shows the cross section A-B along dashed-dotted line A-B in FIG. 31A.

The transistor illustrated in FIG. 31B includes a substrate 2100; a base insulating film 2102 provided over the substrate 2100; a protective insulating film 2104 provided in the periphery of the base insulating film 2102; an oxide semiconductor film 2106 which is provided over the base insulating film 2102 and the protective insulating film 2104 and includes a high-resistance region 2106a and a low-resistance region 2106b; a gate insulating layer 2108 provided over the oxide semiconductor film 2106; a gate electrode 2110 provided to overlap with the oxide semiconductor film 2106 with the gate insulating layer 2108 provided therebetween; a sidewall insulating film 2112 provided in contact with a side surface of the gate electrode 2110; a pair of electrodes 2114 provided in contact with at least the low-resistance region 2106b; an interlayer insulating film 2116 provided to cover at least the oxide semiconductor film 2106, the gate electrode 2110, and the pair of electrodes 2114; and a wiring 2118 provided to be connected to at least one of the pair of electrodes 2114 through an opening formed in the interlayer insulating film 2116.

Further, a protective film may be provided to cover the interlayer insulating film 2116 and the wiring 2118, though not shown. With the protective film, a minute amount of leakage current generated by surface conduction of the interlayer insulating film 2116 can be reduced and thus the off-state current of the transistor can be reduced.

Another example of the transistor in which an In—Sn—Zn—O film is used as an oxide semiconductor film is described below.

Figure 32A:
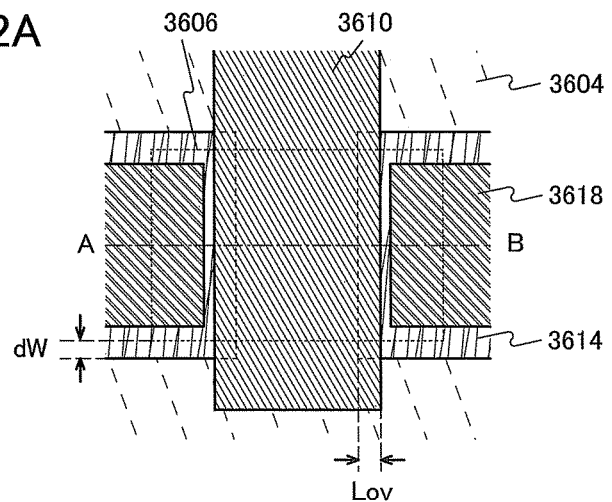
FIGS. 32A and 32B are diagrams illustrating, a structure of a transistor.
Figure 32B:
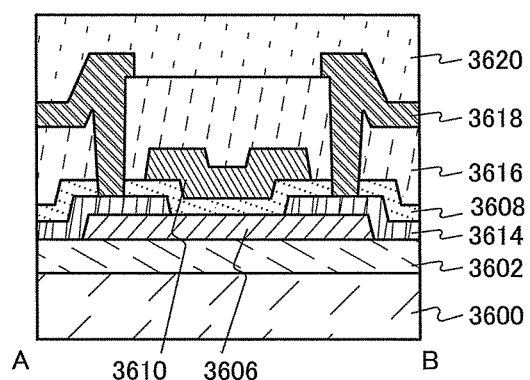

FIGS. 32A and 32B are a top view and a cross-sectional view which illustrate a structure of a transistor which was manufactured in this example. FIG. 32A is the top view of the transistor. FIG. 32B is a cross-sectional view along dashed-dotted line A-B in FIG. 32A.

The transistor illustrated in FIG. 32B includes a substrate 3600; a base insulating film 3602 provided over the substrate 3600; an oxide semiconductor film 3606 provided over the base insulating film 3602; a pair of electrodes 3614 in contact with the oxide semiconductor film 3606; a gate insulating layer 3608 provided over the oxide semiconductor film 3606 and the pair of electrodes 3614; a gate electrode 3610 provided to overlap with the oxide semiconductor film 3606 with the gate insulating layer 3608 provided therebetween; an interlayer insulating film 3616 provided to cover the gate insulating layer 3608 and the gate electrode 3610; wirings 3618 connected to the pair of electrodes 3614 through openings formed in the gate insulating layer 3608 and the interlayer insulating film 3616; and a protective film 3620 provided to cover the interlayer insulating film 3616 and the wirings 3618.

A glass substrate was used as the substrate 3600. A silicon oxide film was used as the base insulating film 3602. An In—Sn—Zn—O film was used as the oxide semiconductor film 3606. A tungsten film was used as the pair of electrodes 3614. A silicon oxide film was used as the gate insulating layer 3608. A stacked-layer structure of a tantalum nitride film and a tungsten film was used as the gate electrode 3610. A stacked-layer structure of a silicon oxynitride film and a polyimide film was used as the interlayer insulating film 3616. A stacked-layer structure in which a titanium film, an aluminum film, and a titanium film are stacked in this order was used as the wirings 3618. A polyimide film was used as the protective film 3620.

Note that in the transistor having the structure illustrated in FIG. 32A, the width of a portion where the gate electrode 3610 overlaps with the pair of electrodes 3614 is denoted by Lov. In addition, the width of a portion of the pair of electrodes 3614, which does not overlap with the oxide semiconductor film 3606, is denoted by dW.

This example can be implemented in combination with any of the embodiments and the other examples as appropriate.

Example 3

One feature of a semiconductor device of one embodiment of the present invention is high definition.

Such a semiconductor device of one embodiment of the present invention can be used for display devices, laptop computers, or image reproducing devices provided with recording media (typically, devices which reproduce the content of recording media such as digital versatile discs (DVDs) and have displays for displaying the reproduced images). Other than the above, as electronic devices which can be equipped with the semiconductor device according to one embodiment of the present invention, mobile phones, portable game machines, portable information terminals, e-book readers, video cameras such as digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

This example can be implemented in combination with any of the embodiments and the other examples as appropriate.

This application is based on Japanese Patent Application serial no. 2010278905 and 2011108276 filed with Japan Patent Office on Dec. 15, 2010 and May 13, 2011, the entire contents of which are hereby incorporated by reference.

What is claimed is:

1. A semiconductor device comprising:
   a plurality of sets, each of the plurality of sets including:
      a first photosensor including a first photoelectric converter, a first transistor, a second transistor and a third transistor;
      a display element including a light-emitting element, a fourth transistor and a fifth transistor; and
      a first wiring, a second wiring, a third wiring, a fourth wiring, a fifth wiring, a sixth wiring, a seventh wiring and an eighth wiring,
   wherein one of a source and a drain of the second transistor is electrically connected to one of a source and a drain of the third transistor,
   wherein the other of the source and the drain of the second transistor is electrically connected to the second wiring,
   wherein the other of the source and the drain of the third transistor is electrically connected to the first wiring,
   wherein a gate of the second transistor is electrically connected to one of a source and a drain of the first transistor,
   wherein the other of the source and the drain of the first transistor is electrically connected to one of a pair of electrodes of the first photoelectric converter,
   wherein the other of the pair of electrodes of the first photoelectric converter is electrically connected to the fourth wiring,
   wherein a gate of the first transistor is electrically connected to the third wiring,
   wherein a gate of the third transistor is electrically connected to the fifth wiring,
   wherein a gate of the fourth transistor is electrically connected to the sixth wiring,
   wherein one of a source and a drain of the fourth transistor is electrically connected to the eighth wiring,
   wherein the other of the source and the drain of the fourth transistor is electrically connected to a gate of the fifth transistor,
   wherein one of a source and a drain of the fifth transistor is electrically connected to one of a pair of electrodes of the light-emitting element,
   wherein the other of the pair of electrodes of the light-emitting element is electrically connected to the seventh wiring,
   wherein the second wiring which is electrically connected to the other of the source and the drain of the second transistor is electrically connected to the other of the source and the drain of the fifth transistor in one of the plurality of sets,
   wherein a channel is formed in an oxide semiconductor layer comprising In, Ga, and Zn in each of the first to third transistors,
   wherein an off-state current density of the each of the first to third transistors is less than or equal to 100 yA/μm,
   wherein the first photosensor is configured to perform a reset operation and a storage operation in a p-th row during all the light-emitting elements emit light,
   wherein the first photosensor is configured to perform the reset operation and the storage operation in a (p+1)-th row during all the light-emitting elements does not emit light,
   wherein p is a natural number, and
   wherein the semiconductor device is configured to obtain a difference between output signals in the p-th row and the (p+1)-th row.

2. The semiconductor device according to claim 1, wherein the plurality of sets are arranged in a matrix of m (m is a natural number greater than or equal to 2) rows by n (n is a natural number greater than or equal to 2) columns.

3. The semiconductor device according to claim 1, wherein the first photosensor is configured to perform a selection operation during all the light-emitting elements do not emit light.

4. A semiconductor device comprising:
   a plurality of sets, each of the plurality of sets including:
      a first photosensor including a first photoelectric converter and a first transistor, a second transistor and a third transistor;
      a display element including a light-emitting element, a fourth transistor and a fifth transistor;
      a first wiring, a second wiring, a third wiring, a fourth wiring, a fifth wiring, a sixth wiring and a seventh wiring; and
      a power supply line,
   wherein one of a source and a drain of the second transistor is electrically connected to one of a source and a drain of the third transistor,
   wherein the other of the source and the drain of the third transistor is electrically connected to the second wiring,
   wherein a gate of the second transistor is electrically connected to one of a source and a drain of the first transistor,
   wherein the other of the source and the drain of the first transistor is electrically connected to one of a pair of electrodes of the first photoelectric converter,
   wherein the other of the pair of electrodes of the first photoelectric converter is electrically connected to the fourth wiring,
   wherein a gate of the first transistor is electrically connected to the third wiring,
   wherein a gate of the third transistor is electrically connected to the fifth wiring,
   wherein a gate of the fourth transistor is electrically connected to the sixth wiring,
   wherein one of a source and a drain of the fourth transistor is electrically connected to the first wiring,
   wherein the other of the source and the drain of the fourth transistor is electrically connected to a gate of the fifth transistor,
   wherein one of a source and a drain of the fifth transistor is electrically connected to one of a pair of electrodes of the light-emitting element,
   wherein the other of the pair of electrodes of the light-emitting element is electrically connected to the seventh wiring, wherein the other of the source and the drain of the fifth transistor and the other of the source and the drain of the second transistor are electrically connected to the power supply line in one of the plurality of sets, wherein a channel is formed in an oxide semiconductor layer comprising In, Ga, and Zn in each of the first to third transistors, wherein an off-state current density of the each of the first to third transistors is less than or equal to 100 yA/μm, wherein the first photosensor is configured to perform a reset operation and a storage operation in a q-th column during all the light-emitting elements emit light, wherein the first photosensor is configured to perform the reset operation and the storage operation in a (q+1)-th column during all the light-emitting elements does not emit light, wherein q is a natural number, and wherein the semiconductor device is configured to obtain a difference between output signals in the q-th column and the (q+1)-th column.

5. The semiconductor device according to claim 4, wherein the plurality of pixels are arranged in a matrix of m (m is a natural number greater than or equal to 2) rows by n (n is a natural number greater than or equal to 2) columns.

6. A semiconductor device comprising:

a plurality of sets, each of the plurality of sets including:
  a first photosensor and a display element including a light-emitting element, a first wiring, a second wiring, a third wiring, a fourth wiring, a fifth wiring, a sixth wiring, a seventh wiring, and an eighth wiring, wherein the first photosensor includes a first photoelectric converter which is electrically connected to an amplifier, wherein the display element includes a controller which is electrically connected to the light-emitting element, wherein the amplifier includes a first transistor, a second transistor and a third transistor, wherein one of a source and a drain of the second transistor is electrically connected to one of a source and a drain of the third transistor, wherein the other of the source and the drain of the second transistor is electrically connected to the first wiring, wherein the other of the source and the drain of the third transistor is electrically connected to the second wiring, wherein a gate of the second transistor is electrically connected to one of a source and a drain of the first transistor, wherein the other of the source and the drain of the first transistor is electrically connected to one of a pair of electrodes of the first photoelectric converter, wherein the other of the pair of electrodes of the first photoelectric converter is electrically connected to the fourth wiring, wherein a gate of the first transistor is electrically connected to the third wiring, wherein a gate of the third transistor is electrically connected to the fifth wiring, wherein the controller includes a fourth transistor and a fifth transistor, wherein a gate of the fourth transistor is electrically connected to the sixth wiring, wherein one of a source and a drain of the fourth transistor is electrically connected to the eighth wiring, wherein the other of the source and the drain of the fourth transistor is electrically connected to a gate of the fifth transistor, wherein one of a source and a drain of the fifth transistor is electrically connected to the first wiring, wherein the other of the source and the drain of the fifth transistor is electrically connected to one of a pair of electrodes of the light-emitting element, wherein the other of the pair of electrodes of the light-emitting element is electrically connected to the seventh wiring, wherein a channel is formed in an oxide semiconductor layer comprising In, Ga, and Zn in each of the first to third transistors, wherein an off-state current density of the each of the first to third transistors is less than or equal to 100 yA/μm, wherein the first photosensor is configured to perform a reset operation and a storage operation in a p-th row during all the light-emitting elements emit light, wherein the first photosensor is configured to perform the reset operation and the storage operation in a (p+1)-th row during all the light-emitting elements does not emit light, wherein p is a natural number, and wherein the semiconductor device is configured to obtain a difference between output signals in the p-th row and the (p+1)-th row.

7. The semiconductor device according to claim 6, wherein the plurality of sets are arranged in a matrix of m (m is a natural number greater than or equal to 2) rows by n (n is a natural number greater than or equal to 2) columns.

8. The semiconductor device according to claim 6, wherein the first photoelectric converter is a photodiode or a phototransistor.

9. The semiconductor device according to claim 6, wherein the light-emitting element is a light-emitting diode or an organic light-emitting element.

10. The semiconductor device according to claim 6, wherein a channel is found in an oxide semiconductor layer in at least one of the fourth to sixth transistors.

11. The semiconductor device according to claim 6, wherein the controller includes a capacitor, wherein one of a pair of electrodes of the capacitor is electrically connected to the gate of the fifth transistor, and wherein the other of the pair of electrodes of the capacitor is electrically connected to one of the source and the drain of the fifth transistor.

12. The semiconductor device according to claim 6, wherein the controller includes a capacitor, wherein one of a pair of electrodes of the capacitor is electrically connected to the gate of the fifth transistor and the other of the source and the drain of the fourth transistor, and wherein the other of the pair of electrodes of the capacitor is electrically connected to the first wiring.

13. The semiconductor device according to claim 6, further comprising a tenth wiring, wherein the controller includes a capacitor, wherein one of a pair of electrodes of the capacitor is electrically connected to the gate of the fifth transistor and the other of the source and the drain of the fourth transistor, and wherein the other of the pair of electrodes of the capacitor is electrically connected to the tenth wiring.

14. The semiconductor device according to claim 6, further comprising a ninth wiring,
- wherein the controller includes a seventh transistor,
- wherein one of a source and a drain of the seventh transistor is electrically connected to one of the pair of electrodes of the light-emitting element,
- wherein the other of the source and the drain of the seventh transistor is electrically connected to the one of the source and the drain of the fifth transistor, and
- wherein a gate of the seventh transistor is electrically connected to the ninth wiring.

15. The semiconductor device according to claim 14, wherein a channel is formed in an oxide semiconductor layer in at least one of the fourth to seventh transistors.

16. The semiconductor device according to claim 6, further comprising a tenth wiring,
- wherein the controller includes a seventh transistor,
- wherein the seventh transistor is electrically connected between the first wiring and the one of the source and the drain of the fifth transistor, and
- wherein a gate of the seventh transistor is electrically connected to the tenth wiring.

17. The semiconductor device according to claim 16, wherein a channel is formed in an oxide semiconductor layer in at least one of the fourth to seventh transistors.

* * * * *

UNITED STATES PATENT AND TRADEMARK OFFICE
CERTIFICATE OF CORRECTION

PATENT NO. : 9,841,843 B2
APPLICATION NO. : 13/325497
DATED : December 12, 2017
INVENTOR(S) : Yoshiyuki Kurokawa et al.

It is certified that error appears in the above-identified patent and that said Letters Patent is hereby corrected as shown below:

In the Claims

Column 52, Line 38, Claim 10; Change "is found in" to --is formed in--.

Signed and Sealed this
Thirteenth Day of March, 2018

Andrei Iancu
*Director of the United States Patent and Trademark Office*